United States Patent
Dobner et al.

(10) Patent No.: US 12,298,528 B2
(45) Date of Patent: May 13, 2025

(54) OPTOELECTRONIC DEVICE

(71) Applicant: OSRAM Opto Semiconductors GmbH, Regensburg (DE)

(72) Inventors: Andreas Dobner, Wenzenbach (DE); Uli Hiller, Bad Abbach (DE); Peter Brick, Regensburg (DE); Hubert Halbritter, Dietfurt-Toeging (DE); Thomas Schwarz, Regensburg (DE); Michael Wittmann, Alteglofsheim (DE); Stefan Groetsch, Bad Abbach (DE); Simon Schwalenberg, Brennberg (DE); Sebastian Wittmann, Regenstauf (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 550 days.

(21) Appl. No.: 17/615,722

(22) PCT Filed: Oct. 29, 2020

(86) PCT No.: PCT/EP2020/080471
§ 371 (c)(1),
(2) Date: Dec. 1, 2021

(87) PCT Pub. No.: WO2021/084049
PCT Pub. Date: May 6, 2021

(65) Prior Publication Data
US 2022/0244555 A1    Aug. 4, 2022

(30) Foreign Application Priority Data

Oct. 29, 2019 (DE) .................... 10 2019 129 220.4
Dec. 6, 2019 (DE) .................... 10 2019 133 447.0
(Continued)

(51) Int. Cl.
*G02B 27/12* (2006.01)
*F21S 8/00* (2006.01)
(Continued)

(52) U.S. Cl.
CPC .............. *G02B 27/126* (2013.01); *F21S 8/00* (2013.01); *G02B 1/04* (2013.01); *G02B 5/265* (2013.01);
(Continued)

(58) Field of Classification Search
CPC ........ G02B 27/126; G02B 1/04; G02B 5/265; F21S 8/00
See application file for complete search history.

(56) References Cited

U.S. PATENT DOCUMENTS 8,474,860 B2    7/2013  Ohoka
8,924,076 B2 *  12/2014 Boote .............. B32B 17/10174
                                                701/36
(Continued)

FOREIGN PATENT DOCUMENTS

CN     1675446 A    9/2005
CN   108877521 A   11/2018
(Continued)

OTHER PUBLICATIONS

International Search Report and Written Opinion issued in corresponding International Application No. PCT/EP2020/080471 dated Mar. 26, 2021.
(Continued)

*Primary Examiner* — Anne M Hines
(74) *Attorney, Agent, or Firm* — ArentFox Schiff LLP

(57) ABSTRACT

An optoelectronic device, in particular a display device, comprises: at least one optoelectronic light source, an at least partially transparent front layer, an at least partially transparent support layer, wherein the light source is
(Continued)

arranged between the front layer and the support layer, wherein a front side of the light source faces the front layer and a rear side of the light source faces the support layer, and wherein a limiting device is provided in a circumferential direction around the light source, wherein the limiting device limits a spatial region, in which the light source emits light such that total internal reflection of the emitted light, in particular at an interface between the front layer and the outside, is avoided or at least reduced.

19 Claims, 51 Drawing Sheets

(30) Foreign Application Priority Data

| Feb. 21, 2020 | (DK) | ................................. 202070101 |
|---|---|---|
| May 15, 2020 | (DE) | .................. 10 2020 113 246.8 |
| May 29, 2020 | (DE) | .................. 10 2020 114 530.6 |
| Oct. 9, 2020 | (DE) | .................. 10 2020 126 558.1 |

(51) Int. Cl.
*G02B 1/04* (2006.01)
*G02B 5/26* (2006.01)
*B60K 35/00* (2006.01)
*B60K 35/22* (2024.01)
*B60K 35/60* (2024.01)

(52) U.S. Cl.
CPC ............. *B60K 35/00* (2013.01); *B60K 35/22* (2024.01); *B60K 35/60* (2024.01); *B60K 2360/1523* (2024.01); *B60K 2360/23* (2024.01); *B60K 2360/27* (2024.01); *B60K 2360/785* (2024.01); *B60Y 2200/11* (2013.01)

(56) References Cited

U.S. PATENT DOCUMENTS

| 9,806,281 | B2 | 10/2017 | Domercq et al. |
|---|---|---|---|
| 10,395,589 | B1 | 8/2019 | Vahid Far et al. |
| 11,479,023 | B2 | 10/2022 | Berard et al. |
| 11,538,852 | B2 | 12/2022 | Varghese et al. |
| 11,569,411 | B2 | 1/2023 | Volpert |
| 11,682,607 | B2 | 6/2023 | We |
| 12,040,317 | B2 | 7/2024 | Brandl et al. |
| 2002/0118321 | A1 | 8/2002 | Ge |
| 2002/0140629 | A1 | 10/2002 | Sundahl |
| 2002/0149312 | A1 | 10/2002 | Roberts et al. |
| 2004/0185195 | A1 | 9/2004 | Anderson et al. |
| 2005/0238857 | A1 | 10/2005 | Day |
| 2005/0253244 | A1 | 11/2005 | Chang |
| 2006/0116046 | A1 | 6/2006 | Morley et al. |
| 2006/0275599 | A1 | 12/2006 | Lefevre |
| 2007/0014469 | A1 | 1/2007 | Paillet et al. |
| 2009/0016095 | A1 | 1/2009 | Thomas et al. |
| 2009/0103298 | A1 | 4/2009 | Boonekamp et al. |
| 2009/0114928 | A1 | 5/2009 | Messere et al. |
| 2009/0021181 | A1 | 6/2009 | Brune et al. |
| 2009/0231882 | A1 | 9/2009 | Lin et al. |
| 2009/0279295 | A1 | 11/2009 | Van Der Poel |
| 2010/0060821 | A1 | 3/2010 | Wang et al. |
| 2010/0140655 | A1 | 6/2010 | Shi |
| 2010/0176705 | A1 | 7/2010 | Van Herpen et al. |
| 2011/0006316 | A1 | 1/2011 | Ing et al. |
| 2011/0127552 | A1 | 6/2011 | Van Herpen et al. |
| 2011/0317417 | A1 | 12/2011 | Gourlay |
| 2013/0016494 | A1 | 1/2013 | Speier et al. |
| 2013/0154498 | A1 | 6/2013 | Missbach |
| 2013/0256708 | A1 | 10/2013 | Jin et al. |
| 2014/0091326 | A1 | 4/2014 | Tran et al. |
| 2014/0096893 | A1 | 4/2014 | Veerasamy |
| 2014/0234578 | A1 | 8/2014 | Decraye et al. |
| 2015/0239399 | A1 | 8/2015 | Tonar et al. |
| 2015/0253486 | A1 | 9/2015 | Verger et al. |
| 2015/0301175 | A1 | 10/2015 | Rao et al. |
| 2015/0308639 | A1 | 10/2015 | Keranen et al. |
| 2016/0154170 | A1 | 6/2016 | Thompson et al. |
| 2016/0313587 | A1 | 10/2016 | Linthout et al. |
| 2017/0005077 | A1 | 1/2017 | Kim et al. |
| 2017/0179097 | A1 | 6/2017 | Zhang et al. |
| 2017/0179192 | A1 | 6/2017 | Zhang et al. |
| 2017/0212633 | A1 | 7/2017 | You |
| 2017/0301282 | A1 | 10/2017 | Rotzoll et al. |
| 2017/0309698 | A1 | 10/2017 | Bower et al. |
| 2017/0373268 | A1 | 12/2017 | Takahashi et al. |
| 2018/0084614 | A1 | 3/2018 | Bower et al. |
| 2018/0114878 | A1 | 4/2018 | Danesh et al. |
| 2018/0141487 | A1 | 5/2018 | Osumi et al. |
| 2018/0211945 | A1 | 7/2018 | Cok et al. |
| 2018/0226386 | A1 | 8/2018 | Cok |
| 2018/0301594 | A1 | 10/2018 | Bouvier |
| 2018/0311935 | A1 | 11/2018 | Sahyoun et al. |
| 2018/0323180 | A1 | 11/2018 | Cok |
| 2018/0343741 | A1 | 11/2018 | Williams et al. |
| 2018/0345631 | A1 | 12/2018 | Klein et al. |
| 2018/0358339 | A1 | 12/2018 | Iguchi |
| 2018/0370195 | A1 | 12/2018 | Laluet et al. |
| 2018/0374834 | A1 | 12/2018 | Tada et al. |
| 2019/0001629 | A1 | 1/2019 | Laluet |
| 2019/0012957 | A1 | 1/2019 | Liu et al. |
| 2019/0016095 | A1 | 1/2019 | Labrot et al. |
| 2019/0019968 | A1 | 1/2019 | He |
| 2019/0096864 | A1 | 3/2019 | Huitema et al. |
| 2019/0134952 | A1 | 5/2019 | Varanasi et al. |
| 2019/0140154 | A1 | 5/2019 | Ohmae et al. |
| 2019/0160792 | A1 | 5/2019 | Weber |
| 2019/0172970 | A1 | 6/2019 | Dupont et al. |
| 2019/0179458 | A1 | 6/2019 | Weber et al. |
| 2019/0193376 | A1 | 6/2019 | Bauerle |
| 2019/0195466 | A1 | 6/2019 | Shimizu et al. |
| 2019/0229097 | A1 | 7/2019 | Takeya et al. |
| 2019/0235677 | A1 | 8/2019 | Liu et al. |
| 2019/0248122 | A1 | 8/2019 | Gillessen et al. |
| 2019/0255813 | A1 | 8/2019 | Bauerle et al. |
| 2019/0279558 | A1 | 9/2019 | Monestier et al. |
| 2019/0299852 | A1 | 10/2019 | Bauerle et al. |
| 2019/0302917 | A1 | 10/2019 | Pan |
| 2019/0305036 | A1 | 10/2019 | Ahn et al. |
| 2019/0335553 | A1 | 10/2019 | Ahmed et al. |
| 2019/0377125 | A1 | 12/2019 | Liu et al. |
| 2019/0393198 | A1 | 12/2019 | Takeya |
| 2020/0006456 | A1 | 1/2020 | Zhang et al. |
| 2020/0012848 | A1 | 1/2020 | Goto |
| 2020/0052033 | A1 | 2/2020 | Iguchi |
| 2020/0144228 | A1* | 5/2020 | Brick ...................... H01L 33/60 |
| 2020/0203580 | A1 | 6/2020 | Marutani |
| 2020/0251638 | A1 | 8/2020 | Morris et al. |
| 2020/0269815 | A1 | 8/2020 | Bauerle et al. |
| 2020/0342194 | A1 | 10/2020 | Bhat et al. |
| 2020/0343230 | A1 | 10/2020 | Sizov et al. |
| 2020/0350361 | A1 | 11/2020 | Tao |
| 2021/0043617 | A1 | 2/2021 | Onuma et al. |
| 2021/0375833 | A1 | 12/2021 | Lee et al. |
| 2022/0123046 | A1 | 4/2022 | Behringer et al. |
| 2022/0231193 | A1 | 7/2022 | Boss et al. |
| 2022/0238497 | A1 | 7/2022 | Brandl et al. |
| 2022/0262850 | A1 | 8/2022 | Behringer et al. |
| 2022/0262851 | A1 | 8/2022 | Behringer et al. |
| 2022/0262852 | A1 | 8/2022 | Behringer et al. |
| 2022/0271084 | A1 | 8/2022 | Behringer et al. |
| 2022/0271085 | A1 | 8/2022 | Behringer et al. |
| 2022/0285430 | A1 | 9/2022 | Behringer et al. |
| 2022/0375991 | A1 | 11/2022 | Behringer et al. |

FOREIGN PATENT DOCUMENTS

| CN | 109801568 A | 5/2019 |
|---|---|---|
| DE | 102007039416 A1 | 2/2009 |
| DE | 102012213343 A1 | 1/2014 |
| DE | 102013102003 A1 | 8/2014 |
| DE | 202015009229 U1 | 1/2017 |

(56) References Cited

FOREIGN PATENT DOCUMENTS

| | | | |
|---|---|---|---|
| DE | 102017122852 A | 4/2019 |
| DE | 102018119376 A1 | 2/2020 |
| DE | 112018003398 T5 | 3/2020 |
| EP | 1760784 A2 | 3/2007 |
| EP | 1886804 A1 | 2/2008 |
| EP | 2412521 A1 | 2/2012 |
| EP | 2760108 A1 | 7/2014 |
| EP | 3264241 A1 | 1/2018 |
| EP | 3264242 A1 | 1/2018 |
| FR | 3044972 A1 | 6/2017 |
| JP | S642386 A | 6/1987 |
| JP | 08-130330 A | 5/1996 |
| JP | 10-240172 A | 9/1998 |
| JP | H11145519 A | 5/1999 |
| JP | 2001-022300 A | 1/2001 |
| JP | 2002246647 A | 8/2002 |
| JP | 2003-337556 A | 11/2003 |
| JP | 2004-327955 A | 11/2004 |
| JP | 2005-310751 A | 11/2005 |
| JP | 2005-534612 A | 11/2005 |
| JP | 2006263932 A | 10/2006 |
| JP | 2007-073734 A | 3/2007 |
| JP | 2009-512977 A | 3/2009 |
| JP | 2009-535798 A | 10/2009 |
| JP | 2010-520627 A | 6/2010 |
| JP | 2010521353 A | 6/2010 |
| JP | 2010-170969 A | 8/2010 |
| JP | 2012510716 A | 5/2012 |
| JP | 2012-195404 A | 10/2012 |
| JP | 2014-060320 A | 4/2014 |
| JP | 2014110333 A | 6/2014 |
| JP | 2015-084374 A | 4/2015 |
| JP | 2016-167451 A | 9/2016 |
| JP | 2016174179 A | 9/2016 |
| JP | 2017-212384 A | 11/2017 |
| JP | 2018050082 A | 3/2018 |
| JP | 2019-009192 A | 1/2019 |
| JP | 2019-134025 A | 8/2019 |
| JP | 2020-017730 A | 1/2020 |
| KR | 10-2014-0071796 A | 6/2014 |
| NO | 2011158185 A1 | 12/2011 |
| WO | 2007093823 A1 | 8/2007 |
| WO | 2008058881 A1 | 5/2008 |
| WO | 2009087584 A1 | 7/2009 |
| WO | 2009125918 A2 | 10/2009 |
| WO | 2012/036081 A1 | 3/2012 |
| WO | 2014141019 A1 | 9/2014 |
| WO | 201478942 A1 | 11/2014 |
| WO | 2016095117 A1 | 6/2016 |
| WO | 2018025051 A1 | 2/2018 |
| WO | 2019008493 A1 | 1/2019 |
| WO | 2019/026858 A1 | 2/2019 |
| WO | 2019048893 A1 | 3/2019 |
| WO | 2019079383 A1 | 4/2019 |
| WO | 2019091728 A1 | 5/2019 |
| WO | 2019146634 A1 | 8/2019 |
| WO | 2019160199 A1 | 8/2019 |
| WO | 2019186513 A1 | 10/2019 |
| WO | 2020050062 A1 | 3/2020 |
| WO | 2020071815 A1 | 4/2020 |

OTHER PUBLICATIONS

Ron Mertens, "More details emerge on Samsung's QD-OLED TV Plans", available online at <https://www.oled-info.com/more-details-emerge-samsungs-qd-oled-tv-plans>, Dec. 8, 2018, 4 pages.

* cited by examiner

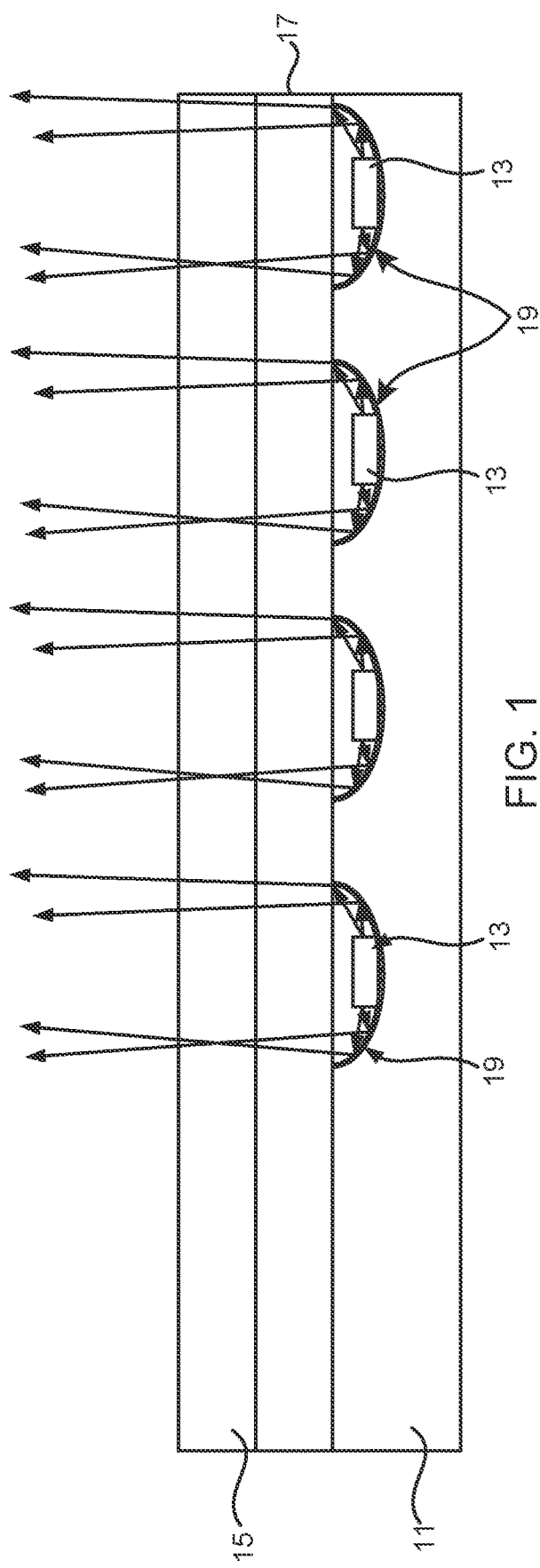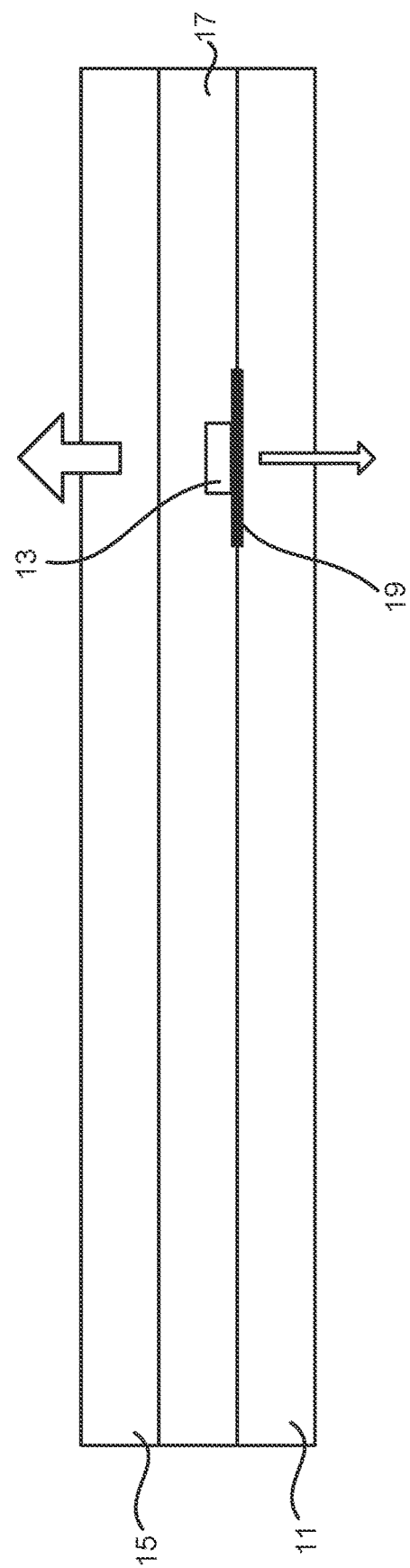

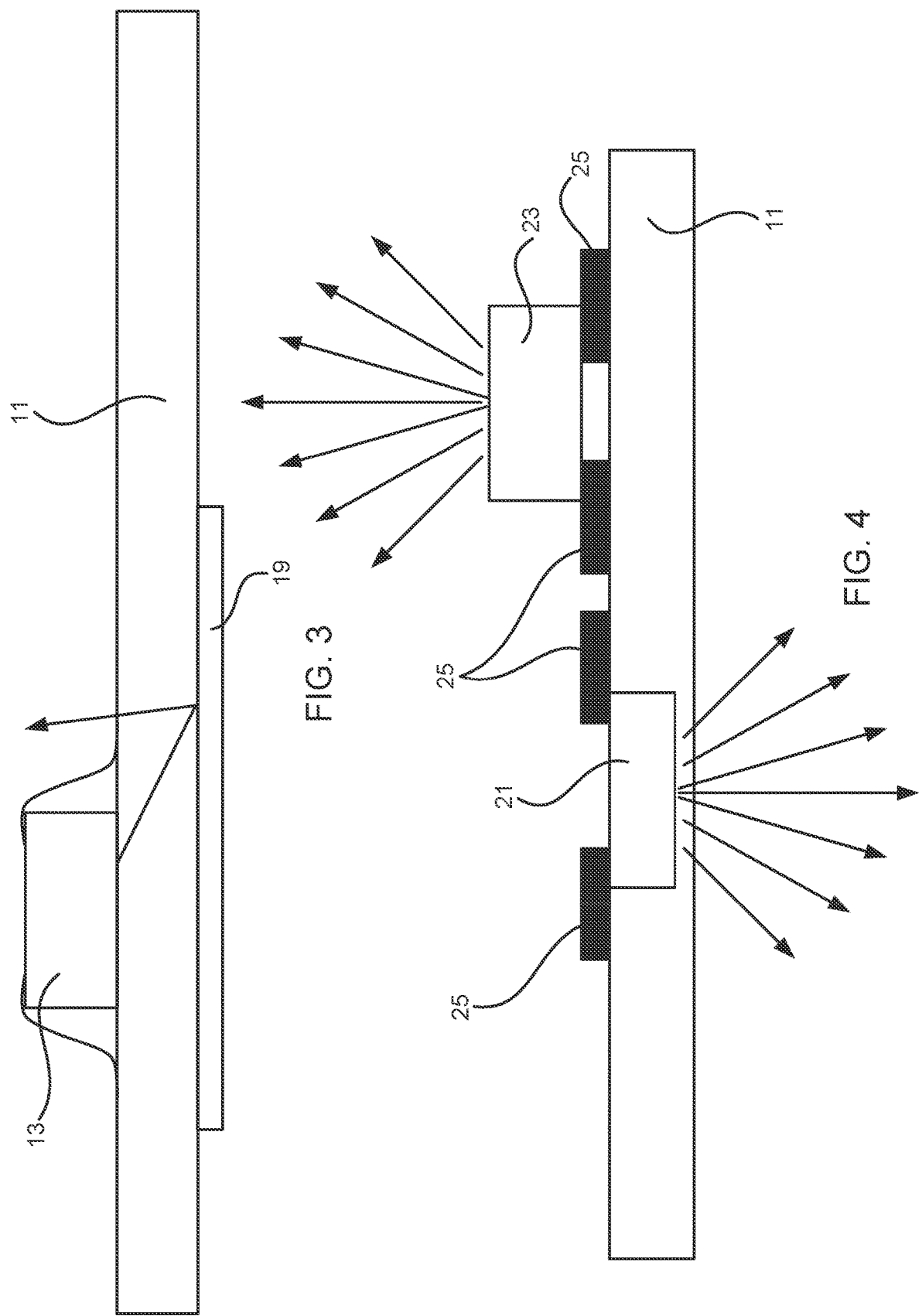

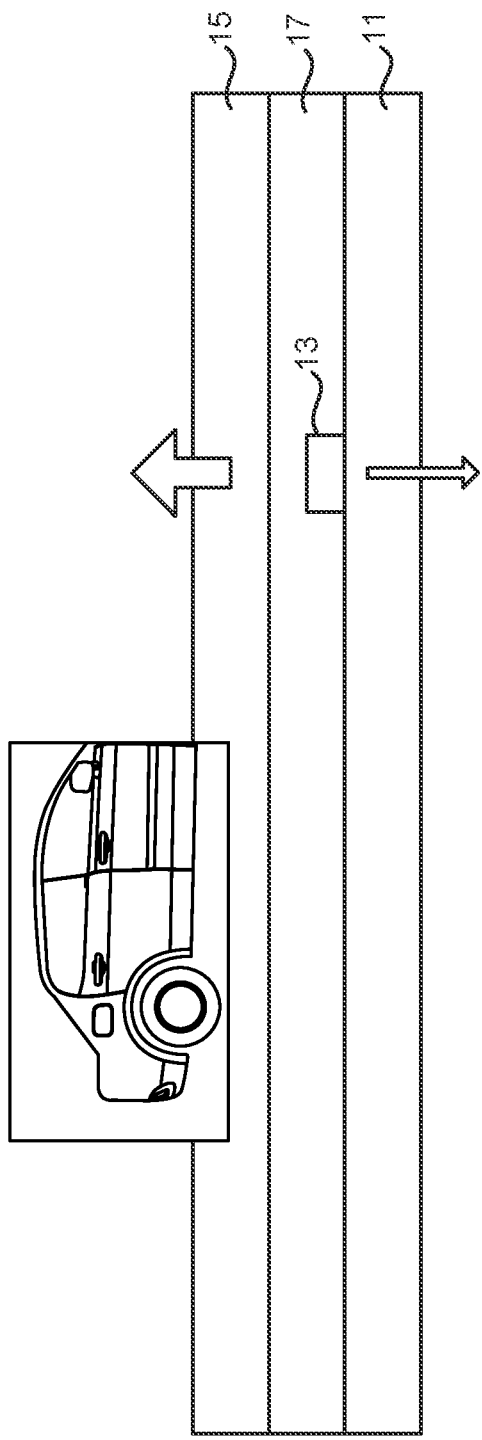
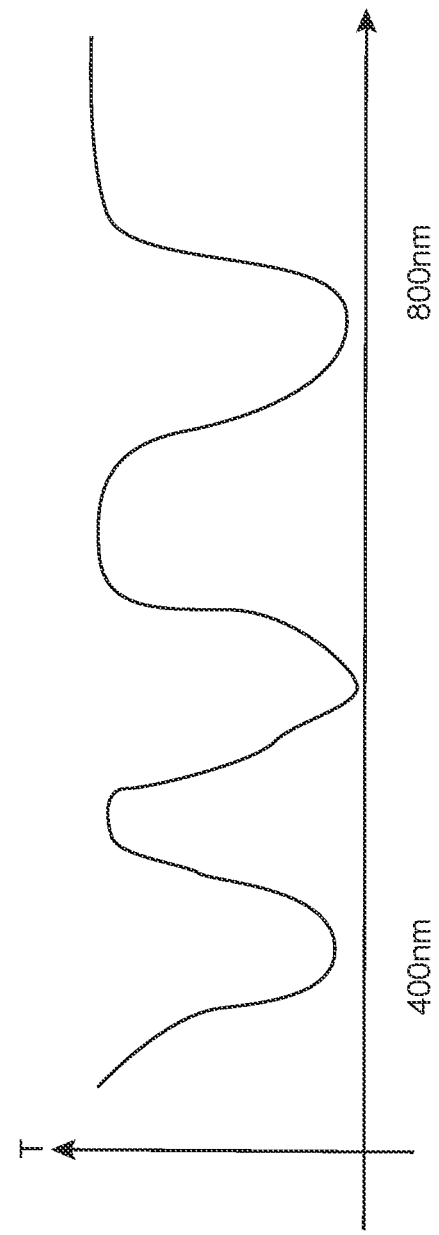
FIG. 10
FIG. 11

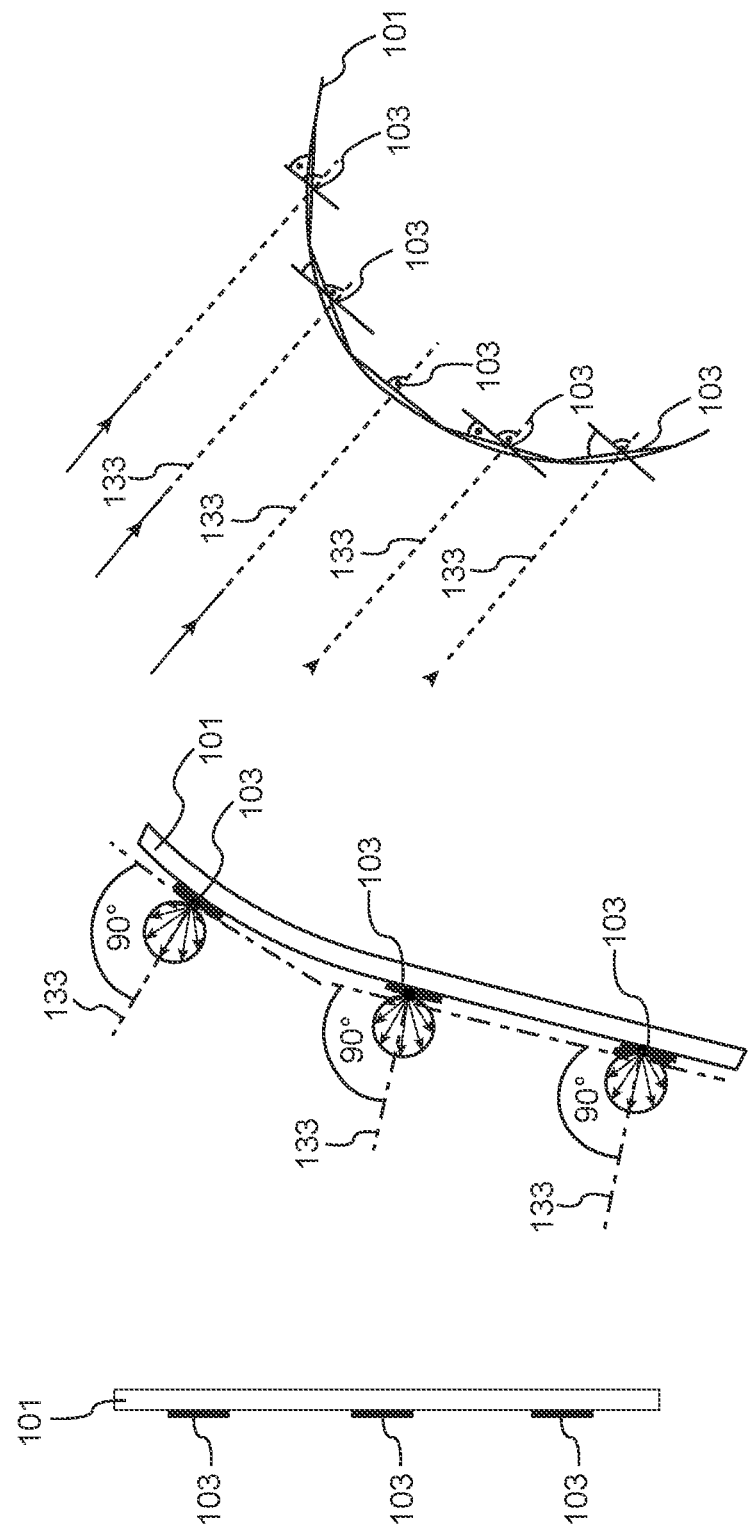

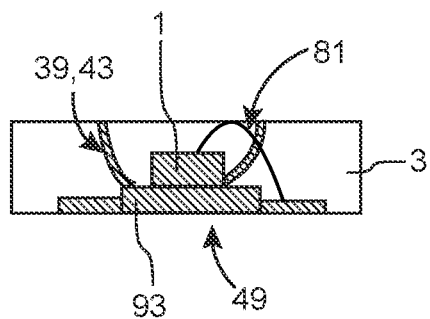
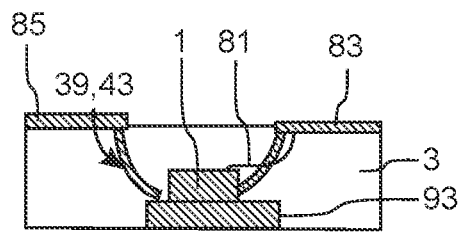
FIG. 54  FIG. 55
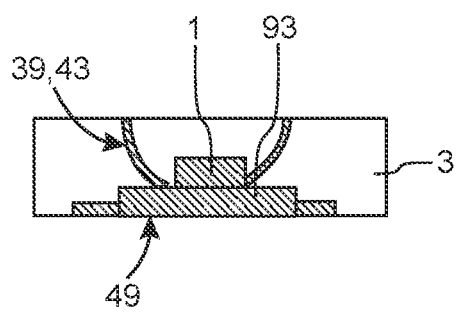
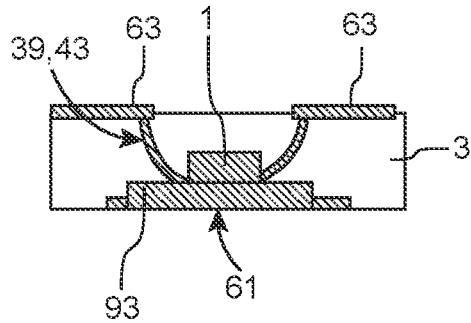
FIG. 56  FIG. 57

OPTOELECTRONIC DEVICE

BACKGROUND OF THE INVENTION

The present application is a U.S.C. 371 National Stage entry of PCT Application No. PCT/EP2020/080471 filed Oct. 29, 2020, which claims priority from DE application No. 10 2019 129 220.4 dated Oct. 29, 2019, DE application No. 10 2019 133 447.0 dated Dec. 6, 2019, DK application No. PA202070101 dated Feb. 21, 2020, DE application No. 10 2020 113 246.8 dated May 15, 2020, DE application No. 10 2020 114 530.6 dated May 29, 2020, and DE application No. 10 2020 126 558.1 dated Oct. 9, 2020, the disclosures of which are incorporated herein in their entirety.

The present invention relates to an optoelectronic device, to a method of producing an optoelectronic device, and to a vehicle.

DE 10 2017 122 852 A1 discloses a cover for a motor vehicle roof, comprising a layer stack. The layer stack comprises a pane, which extends in a planar manner, a film, which extends in a planar manner, and an adhesive layer arranged between the pane and the film for fastening the film to the pane. A plurality of micro light emitting diodes is arranged in the adhesive layer. DE 10 2017 122 852 A1 also discloses a motor vehicle, comprising a motor vehicle roof having such a cover.

US 2019/0248122 A1 discloses a method for producing a composite pane for a motor vehicle. The method comprises providing a first pane and a second pane. The method further includes arranging a plastic film between the first pane and the second pane, and arranging a light emitting diode (LED) on a surface of the plastic film. Moreover, the method comprises locally heating the plastic film at least in a region of the LED into a fluid state by means of a heating source positioned on an outer surface of the first pane or the second pane or arranged at a distance from the outer surface of the first pane or the second pane. Additionally, the method comprises introducing the LED into the plastic film heated into the fluid state with displacement of a predefined volume of the plastic film, and the method includes after introducing the LED into the plastic film, laminating the first pane and the second pane with the interposed plastic film.

WO 2019/186513 A1 discloses a laminated automotive glazing, which comprises an outer glass layer, an inner glass layer, at least one plastic interlayer between the outer and inner glass layers, and at least one camera system, wherein the camera system is laminated between the glass layers as an integral permanent part of the laminate.

WO 2019/008493 A1 discloses a vehicle laminate comprising an exterior glass layer, at least an inner glass layer, at least one plastic bonding layer located between the exterior glass layer and the inner glass layer, at least one LED embedded into the plastic bonding layer. A wire is substantially embedded in the plastic bonding layer forming a circuit to power the LED.

It is an underlying objective of the present invention to provide an improved optoelectronic device. In particular, it is an objective of the present invention to provide an optoelectronic device which is at least partially transparent and/or which can provide directed light.

SUMMARY

The objective is satisfied by an optoelectronic device in accordance with the features of claim 1. Preferred embodiments of the present invention are described in the dependent claims.

In some embodiments, an optoelectronic device comprises: an at least partially transparent carrier layer configured to carry at least one optoelectronic light source and/or at least one optoelectronic detector and an at least partially transparent cover layer, and the at least one optoelectronic light source and/or the at least one optoelectronic detector being arranged on the carrier layer or being at least partially embedded in the carrier layer.

Thus, the at least one optoelectronic light source and/or the at least one optoelectronic detector can be arranged in between the carrier layer and the cover layer, while the at least one optoelectronic light source and/or the at least one optoelectronic detector is arranged on the carrier layer or embedded in the carrier layer. The light emitted by the at least one optoelectronic light source can pass through the carrier layer and/or the cover layer and leave the optoelectronic device at an outer surface of the cover layer and/or carrier layer.

Preferably, the at least one optoelectronic light source is arranged on the carrier layer or at least partially embedded in the carrier layer such that at least most of the generated light leaves the optoelectronic device either through an outer surface of the cover layer or an outer surface of the carrier layer. Thus, the at least one optoelectronic light source can be arranged such that a
    directed emission
      of light is occurring and that most of the light leaves the
        device through either the carrier layer or the cover
        layer.

The optoelectronic device can comprise an at least partially transparent intermediate layer, which is arranged between the carrier layer and the cover layer. The at least one optoelectronic light source and/or the at least one optoelectronic detector can be at least partially embedded in the intermediate layer while the at least one optoelectronic light source and/or the at least one optoelectronic detector is arranged on or at least partially embedded in the carrier layer.

The intermediate layer can comprise or consist of an adhesive for gluing the carrier layer to the cover layer. The intermediate layer can therefore serve to hold the carrier layer and the cover layer together.

At least one optical element, in particular a reflecting or absorbing optical element, can be arranged on the carrier layer or can be embedded in the carrier layer. The optical element can be configured to direct light emitted by an optoelectronic light source such that the light exits either through the carrier layer or the cover layer. A directed emission of light is therefore possible. Alternatively, the optical element can be configured to absorb light that is incident on the optical element.

The at least one optical element and the at least one optoelectronic light source can be a plurality of optical elements and a plurality of optoelectronic light sources. The optical elements and the optoelectronic light sources can be arranged in pairs. Thus, each optical element can be assigned to a particular light source. The optical element can serve to direct light emitted by the associated light source through either the carrier layer or the cover layer. Alternatively, the optical element can absorb light emitted by the associated light source. The directionality of the light which leaves the optoelectronic device can be improved by using pairs of optical elements and optoelectronic light sources.

A reflective optical element, in particular a mirror or a curved mirror, can be embedded in the carrier layer, and the reflective optical element can be configured to reflect light from the associated optoelectronic light source towards the cover layer. The optoelectronic light source can be arranged on the carrier layer or can be embedded in the carrier layer, in particular in front of the reflective optical element.

An optical element can consist of or comprise an absorber. The absorber can for example have the form of a flat absorbing plate. The absorber can be configured to absorb light from the at least one optoelectronic light source.

Preferably, an absorber can be arranged on the carrier layer and/or an optoelectronic light source can be arranged on the absorber.

At least one absorber and at least one optoelectronic light source can be a plurality of absorbers and a plurality of optoelectronic light sources. The absorbers and the optoelectronic light sources can be arranged in pairs. Thus, each absorber can be assigned to a particular light source, so that the absorber serves to at least partly absorb light emitted by the particular light source which is incident on the absorber.

The at least one optoelectronic light source can be arranged on the surface of the carrier layer that is facing the cover layer. Thus, the at least one optoelectronic light source can be sandwiched between the carrier layer and the cover layer, and it can optionally be embedded in an intermediate layer.

At least one optical element, in particular a reflecting or absorbing optical element, can be arranged on the surface of the carrier layer, preferably on the surface which is facing away from the cover layer. The optical element can be located on the same surface on which the associated light source is arranged, or the optical element can be located on the opposite surface. The optical element and the associated light source can be aligned one above the other.

Preferably, the optical element is formed by a coating layer or a structure printed on the surface of the carrier layer. The optical element can therefore be formed in a compact and cost-efficient way.

Preferably, the optical element can comprise a matrix material, such as $TiO_2$ or $ZrO_2$. The matrix material can provide scattering centers and effectively absorb the light that is incident on the matrix material. Light absorption through multiple scattering in the matrix material is therefore possible.

The at least one optoelectronic light source can comprise a first set of optoelectronic light sources and a second set of optoelectronic light sources. The first set of light sources can be arranged, optionally in conjunction with optical elements, such as to emit light towards the surface of the carrier layer which is facing away from the cover layer. The second set of light sources can be arranged, optionally in conjunction with optical elements, such as to emit light towards the surface of the carrier layer, which is facing towards the cover layer. The first set of light sources and the second set of light sources can be configured to be operated independently from each other.

The optoelectronic light sources of at least one of the first set of light sources and the second set of light sources can be embedded in the carrier layer. Preferably, electrical conductors for providing electricity to the light sources are arranged on a surface of the carrier layer, in particular on the surface facing the cover layer. The conductors can be printed on the surface of the carrier layer.

In some embodiments, the optoelectronic device can include at least one light shaping element, which is preferably arranged in a separate layer and aligned with at least one optoelectronic light source. The light shaping element can be configured to generate a collimated beam from the light provided by the at least one optoelectronic light source. This can improve the directionality of the emitted light.

The carrier layer might be a flexible layer. The carrier layer can be made of a foil or of a glass material.

The cover layer can be a flexible layer. The cover layer can be made of glass or of a plastics material, like PMMA or PC or PVB or PVA or PET. PMMA means polymethylmethacrylat and PC means polycarbonate. PVB means polyvinyl butyral. PVA means polyvinyl acetate. PET means polyethylene terephthalate.

The usage of a flexible carrier layer and/or a flexible cover layer extends the possible range of applications for the optoelectronic device. For example, due to the flexibility, the optoelectronic component can be arranged on a curved surface, for example on the surface of a vehicle roof facing the interior.

The optoelectronic light source can be a LED or µLED (LED light emitting device, µLED for micro-LED) or LED-chip or µLED-chip.

A µLED is a small LED, for example, with edge lengths of less than 70 µm, in particular down to less than 20 µm, in particular in the range from 1 µm to 10 µm. Another range is between 10-30 µm. This can result in a surface area from a few hundred µm² to a few tens of µm². For example, a µ-LED can have a surface area of approximately 60 µm² with an edge length of approximately 8 µm. In some cases, a µ-LED has an edge length of 5 µm or less, which results in a surface area size of less than 30 µm². Typical heights of such µ-LEDs are, for example, in the range of 1.5 µm to 10 µm.

An LED can for example have an edge length in the order of 150-200 µm or an edge length smaller than 300 µm, in particular smaller than 150 µm.

The LED or µLED can include an LED-chip or µLED-chip and/or an over-molding and/or a housing. The optoelectronic light source can also be a LED-chip or a µLED-chip and cannot include an over-molding and a housing. The LED-chip or µLED-chip can include electric contacts for providing electricity to the chip.

The invention also relates to a method of producing an optoelectronic device, in particular an optoelectronic device in accordance with the present invention, the method comprises: providing an at least partially transparent carrier layer, arranging at least one optoelectronic light source and/or at least one optoelectronic detector on the carrier layer or at least partially embedding the at least one optoelectronic light source and/or the at least one optoelectronic detector in the carrier layer, and attaching the carrier layer to an at least partially transparent cover layer.

In some embodiments, an at least partially transparent intermediate layer comprises or consists of an adhesive, and the intermediate layer is arranged between the carrier layer and the cover layer. The at least one optoelectronic light source and/or at least one optoelectronic detector can be embedded at least partially in the intermediate layer before the carrier layer is attached to the cover layer.

The invention also relates to a vehicle comprising a window, an interior equipment element, or an exterior equipment element, which includes an optical device in accordance with the present invention.

In some embodiments, an optoelectronic device comprises: an at least partially transparent intermediate layer, in particular a transparent foil, and
  a plurality of optoelectronic light sources arranged on or embedded in the intermediate layer, and
  the optoelectronic device further comprising at least one of the following:
  a preferably
  non-transparent top layer,
  in particular a coloured foil, arranged on an upper surface of the intermediate layer, the top layer comprises a plurality of apertures which are aligned with the light sources, so that light from a light source can be radiated to the front through the aperture which is aligned with the light source, a filtering layer, in particular configured to operate as a neutral density filter, arranged on an upper surface of the top layer or the upper surface of the intermediate layer, and a non-transparent or at least partially transparent background layer, in particular a coloured foil, arranged on a bottom surface of the intermediate layer.

The optoelectronic device can be built up in a modular way, in particular by adding one or more of the above-mentioned layers. The optoelectronic device can for example be employed in a vehicle, for example in the interior or in the exterior of a vehicle. The optoelectronic device may for example be employed in an automotive interior or exterior display. The optoelectronic device can also be used in a video wall or another display system.

The non-transparent top layer with apertures, which are aligned with the light sources, can cover the underlying structure and provide an improved overall design impression. The apertures can be produced by use of a punching process.

The filtering layer, which can be configured to be a neutral density filter, can help to smoothen the emission characteristics of the light sources and improve the homogeneity of the emitted light.

In some embodiments, the optoelectronic device comprises a non-transparent or at least partially transparent carrier layer arranged on a bottom surface of the intermediate layer or on a bottom surface of the background layer, if the background layer is arranged on the bottom surface of the intermediate layer. The carrier layer can be transparent or partially transparent, for example, if the device is employed in a window of the vehicle. It can, for example, be a non-transparent carrier layer if the device is arranged on a non-transparent surface of a vehicle.

In some embodiments, the layers of the optoelectronic device are configured for an arrangement on a freeform surface, for example a freeform surface of a vehicle. The freeform surface can for example be a curved surface.

In some embodiments, the layers of the optoelectronic device are bendable and/or flexible. The layers can therefore easily arranged on a curved surface, for example of a vehicle.

The top layer can be designed in one or more colours. For example, the colour of the top layer can be adjusted to a colour of the environment in accordance with an interior design of a vehicle.

The top layer can be made of leather, plastic material, fabric or textile. The top layer can have a thickness of less than 100 μm or less than 50 μm. If the top layer is made of a fabric or textile, the top layer has preferably a layer thickness in the range between 100 μm to 1000 μm.

The filtering layer and/or the background layer can be coloured. The underlying structure can be covered and an improved overall design impression can be obtained.

The background layer might comprise a plurality of apertures which are aligned with the light sources. Light from a light source can be radiated to the back through the aperture which is aligned with the light source. This can in particular be advantageous in conjunction with an at least partially transparent carrier layer.

In some embodiments, an optoelectronic device comprises:
an at least partially transparent intermediate layer, in particular a transparent foil,
a plurality of optoelectronic light sources arranged on or embedded in the intermediate layer, and
a plurality of optical elements, wherein each optical element is aligned with one of the light sources of the plurality of light sources, wherein the optical elements are formed integrally with the intermediate layer.

In some embodiments, at least one and preferably each optical element is one of the following: a lens, a micro-lens, an optical micro-structure for beam shaping.

In some embodiments, a method of producing an optoelectronic device comprises:
providing an at least partially transparent intermediate layer, in particular a transparent foil,
providing a plurality of optoelectronic light sources on or in the intermediate layer, and
generating, in particular by use of a deep-drawing process, a plurality of optical elements in the intermediate layer.

The step of providing the plurality of optoelectronic light sources can be carried out before or after the generation of the optical elements. In the optoelectronic device, each optical element is aligned with one of the light sources of the plurality of light sources.

The formation of the optical element, which can be regarded as a 3D deformation process on the intermediate layer, which results in the creation of micro-structures for beam shaping can help to maintain or create desired emission characteristics after deformation of the intermediate layer.

In some embodiments, an optoelectronic device comprises: an at least partially transparent intermediate layer, in particular a transparent foil, and
a plurality of optoelectronic light sources arranged on or embedded in the intermediate layer, each light source having a surface normal which is perpendicular to a top surface of the respective light source. The optoelectronic device can be intended to be used as a support surface that has a curved shape, such that the intermediate layer takes on the curved shape of the support surface. The light sources can be arranged on or embedded in the intermediate layer such that their surface normals are parallel to each other when the intermediate layer is in the curved shape. Additionally or alternatively, the light sources can be arranged on or embedded in the intermediate layer such that their surface normals are parallel to each other when the intermediate layer has the curved shape.

A constant luminance on a 3D support surface, for example a surface in the interior or exterior of a vehicle, can thereby be achieved. Preferably, the light sources are at least approximately Lambert emitters.

In some embodiments, the optoelectronic device comprises at least one layer of electric lines. Preferably, the electric lines can have an array-like structure. Preferably, the array-like structure can comprise array-like segments which are mechanically and/or electrically separated from each other. The array-like structure can be provided in a ready-to-use state, so that, during the manufacture of an optoelectronic device, they can be directly incorporated into the layers of the optoelectronic device.

In some embodiments, at least a section of each electric line and preferably all of the electric lines have a trace width of less than 20 μm, 15 μm, or 10 μm and neighbouring electric lines have a pitch of less than 150 µm, 125 µm, or 100 µm. The overall transparency of the optoelectronic device can thereby be improved. In particular, the electric lines can remain visually imperceptible at reading distance for the human eye.

In some embodiments, the optoelectronic device comprises:
a plurality of optoelectronic light sources arranged on a surface of a non-transparent carrier layer, and
a reflecting and electrically conducting material layer, in particular a metal layer, arranged on the surface of the carrier layer in between the optoelectronic light sources and the carrier layer, and
wherein each optoelectronic light source has one electric contact which is located at a bottom side of the light source, wherein the bottom side faces the reflecting and electrically conducting material layer, and wherein the one electric contact at the bottom of each optoelectronic light source contacts the reflecting and electrically conducting material layer.

The material layer can act as a reflector and thus improve the radiation characteristic in the forward direction, which is the direction that is facing away from the top surface of the material layer and, correspondingly, from the top side of the light sources.

In some embodiments, each optoelectronic light source has another electric contact, which is located at a top side of the light source. The top side can face away from the reflecting and electrically conducting material layer, and the electric contact at the top of each optoelectronic light source can be connected with a contact pad that is arranged on the surface of the carrier layer and separated from the reflecting and electrically conducting material layer. Preferably, each electric contact at the top of each optoelectronic light source is connected with an individual contact pad that is not connected with another optoelectronic light source.

The surface of the carrier layer can comprise a plurality of cavities. In each cavity one or more light sources of the plurality of optoelectronic light sources can be arranged. In some embodiments, the reflecting and electrically conducting material layer covers, in particular completely, bottom surfaces of the cavities, and/or sidewalls of the cavities, and/or top surfaces of bridging sections between neighbouring cavities. The mirrored cavities can help to improve the radiation characteristic in the forward direction.

In some embodiments, the optoelectronic device comprises:
a plurality of optoelectronic light sources arranged on a surface of an at least partially transparent carrier layer, and a plurality of reflecting and electrically conducting material layer elements, in particular metal layer elements, wherein each material layer element is arranged on the surface of the carrier layer and in between one of the optoelectronic light sources and the carrier layer,
wherein the area of the top surface of the material layer element is larger than the area of a bottom surface of the associated light source, and
wherein each optoelectronic light source has one electric contact which is located at the bottom side of the light source, wherein the bottom side faces the top surface of the material layer element which is arranged below the respective light source, and wherein the one electric contact at the bottom of each optoelectronic light source contacts the material layer element.

The area of the top surface of the material layer element can be slightly larger than the area of a bottom surface of the associated light source. For example, it can be 5-10%, 10-20%, or 20%-30% larger than the area of a bottom surface of the associated light source. Each optical element can be centered on the associated material layer element.

In some embodiments, each optoelectronic light source has another electric contact which is located at a top side of the light source, wherein the top side faces away from the reflecting and electrically conducting material layer elements, and wherein the electric contact at the top of each optoelectronic light source is connected with a contact pad that is arranged on the surface of the carrier layer and separated from the reflecting and electrically conducting material layer elements.

The electric contact, which is located at the top of an optoelectronic light source, can be connected with an individual contact pad that is not connected with another optoelectronic light source. The operation of the respective optoelectronic light source can be controlled via the associated contact pad. An individual operation of the light sources is therefore possible.

In some embodiments, a non-transparent layer, in particular a black or dark layer, is arranged above the plurality of optoelectronic light sources. The non-transparent layer comprises apertures which are aligned with the top surfaces of the light sources, so that light emitted from the top surface of a light source can be radiated through the aperture which is aligned with the top surface of the light source. The use of the non-transparent layer with its apertures can improve the emission characteristics with regard to forward radiation and suppress lateral radiation.

In some embodiments, a light barrier can be arranged in the circumferential direction around one or more light sources of the plurality of light sources. The light barrier can for example be a metallized dig arranged in a transparent layer in which the light sources are embedded. The light barrier is preferably arranged around a number of light sources, for example three light sources, that form a pixel. Each of the light sources of a pixel emits light at a different wavelength. For example, one light source emits red light, one light source emits green light, and one light source emits blue light. Thereby, an RGB-pixel can be realized.

The light barrier can provide passage for electric lines to provide electricity to the light sources that are surrounded by the light barrier.

In some embodiments, the optoelectronic light sources can be LEDs or µLEDs.

It can also be an object of the present invention to provide at least a partially transparent optoelectronic device, in which interfering effects caused by back reflections do not occur or occur only to a small extent.

In some embodiments, an optoelectronic device according to the invention comprises: at least one optoelectronic light source,
at least one partially transparent front layer,
at least one partially transparent rear layer,
wherein the light source is arranged between the front layer and the rear layer,
wherein a front side of the light source faces the front layer and a rear side of the light source faces the rear layer, and
wherein a
limiting device
is provided, wherein the limiting device limits a spatial region, in which the light source emits light to a defined spatial region.

The front layer and the rear layer can be, for example, a respective layer of glass or at least another partially transparent material. In each case, the front and rear layers can also be multilayered. At least one optoelectronic light source is arranged in a layer, also referred to herein as an intermediate layer, between the front and rear layers, wherein the intermediate layer is also at least partially formed from transparent or partially transparent material.

The term layer can be understood in a general sense herein and is not related to the layer structure of semiconductor materials. The front and rear layers can be, for example, a single layer or multilayer glass pane. A layer also does not have to be homogeneously formed from one material. For example, the intermediate layer, in which least one light source is arranged, may contain further components, filler material and/or adhesive material or the like.

Although only one light source is normally referred to herein, a plurality of light sources may also be arranged in the intermediate layer. An array-like arrangement is particularly suitable. The light sources can therefore form a display. Each light source can emit light of a certain colour from a number of predetermined colours, for example red, green and blue, in order to realize an RGB display. Light sources of different colours can form a pixel, wherein a light source of a respective colour forms a subpixel.

With respect to a top view of the device on the front side of the front layer, the light sources and any other components, such as a limiting device associated with the respective light source, occupy only a small part of the total cross-sectional area of the front side due to their smallness. The device thus remains at least partially transparent, although the components mentioned are opaque.

The optoelectronic light source is preferably an LED or a µLED.

The optoelectronic light source may have a wide light emission cone. For example, the light source can be a Lambert radiator, so that the luminance is approximately the same on all sides. An exception here may be the rear side of the light source, where no light emission occurs.

In the optoelectronic device according to the invention, the light source is assigned a limiting device, which limits or narrows the spatial region, in which the light source emits light, to a defined spatial region. In particular, the defined spatial region can be limited in such a way that improved radiation forwards, that is to say in the direction of the front side of the front layer, is achieved.

It is particularly advantageous, if the limiting device is designed in such a way that it prevents the propagation of light beams, which would otherwise strike the interface between the front side of the front layer and the surroundings, typically air, at an angle equal to or greater than the critical angle for total reflection. The effect of total reflection of light at the interface between the front side and the surroundings can thus be reduced or avoided. The light circulating in the device due to total reflections can be reflected or scattered at further interfaces. Interfering light beams can therefore emerge anywhere at the front side or back side of the device. The use of the limiting device makes it possible to reduce or avoid such disruptive effects based on total reflection.

The limiting device is arranged in particular outside the light source. The limiting device thus has no influence on the light generation within the light source, but rather serves to narrow the spatial region of the light emission after the light source has initially emitted the light into a wider spatial region. The limiting device is preferably arranged between the front and rear layers. The limiting device is located in particular in the same layer, in which the light source is arranged. The spatial region of the emission of the light can thus be limited to the limited spatial region even before the light emitted by the light source has passed through an interface, for example between the intermediate layer and the front layer. Back reflections or scatter at interfaces can thereby be avoided or reduced.

The spatial region of the light emission may correspond at least approximately to an emission cone having an opening angle with respect to a normal to the front side, and the limiting device may be designed to reduce the opening angle of the emission cone. Directional emission with a main emission direction parallel to the normal of the front side of the light source can thereby be achieved.

Advantageously, total reflections at the interface between the front layer and the surroundings can be avoided if the limiting device limits the opening angle of the emission cone to an angle equal to or less than a critical angle of total reflection at the interface between the front layer and the surroundings that is in front of the front layer. The optical medium of the surroundings is normally air. The opening angle and the critical angle are calculated with respect to a normal to the interface.

The limiting device can have a reflector or absorber device, which runs completely circumferentially around the light source and/or the emission region around a normal to the front side in a circumferential direction. By means of the reflector or absorber device, the light emitted by the light source and lying outside the defined spatial region can be prevented from further propagation. The light can be absorbed or reflected, in particular in such a way that the further propagation direction of the light lies in the defined spatial region.

The reflector or absorber device can be arranged completely circumferentially around the light source and/or its emission region, but without blocking a light emission into the defined spatial region. The dimensioning and arrangement of the reflector or absorber device defines the defined spatial region, into which the light emitted by the light source propagates.

The reflector or absorber device can have a reflecting or absorbing band, in particular at least approximately parabolically shaped, which runs circumferentially around the light source and/or its emission region in circumferential direction. The reflector or absorber device can thus be formed in a compact and simple manner.

An absorbent design of a surface, for example of the circumferential band, can be achieved by the surface being formed from an absorbent material, for example a black lacquer or filler. A reflective design of a surface can be achieved by forming the surface from a reflective material, for example gold, aluminum or silver.

In design variants, the reflector or absorber device can occupy a volume region above the front side and/or next to the lateral outer sides of the light source, wherein a low-refractive material, for example air, is arranged in the volume region. The low-refractive material is in particular a material whose optical refractive index is lower than the optical refractive index of the surrounding material of the interspace. The material of the interspace preferably has an optical refractive index that is at least approximately equal to the optical refractive index of the front and rear layers. For example, the refractive index may be approximately 1.5.

The low-refractive material preferably has an optical refractive index of less than 1.4, less than 1.3, less than 1.2 or less than 1.1.

Light beams passing from the low refractive material of the volume region into the adjacent material with a higher refractive index are refracted toward the normal onto the interface between the two media. This results in a narrowing of the spatial region of the emission of the light from the light source. In particular, clever dimensioning of the volume region can prevent light beams from striking the outer interface between the front side of the front layer and the surroundings at an angle equal to or greater than the critical angle for total reflection. Undesired effects caused by such total reflections can thus be avoided.

The volume region can be cuboid or disk-shaped, in particular with a circular cross-section.

During the transition from light at interfaces, back reflections occur even at angles below the critical angle for total reflection and also at the transition from the optically thinner to optically denser material, which reflections can be calculated quantitatively by means of the so-called Fresnel formulae. Such back reflections are also referred to herein as Fresnel reflections.

Such back reflections can be handled particularly advantageously if outside the defined spatial region for light emission there is provided a diaphragm, in particular a disk-shaped diaphragm, which is designed to reflect or absorb at least part of the light which is reflected back at an interface, in particular the interface between the front side of the front layer and the surroundings.

In addition, the diaphragm may prevent back-reflected light from passing from the intermediate layer into the rear layer and exiting at the back of the device, that is, through the interface between the rear layer and the surroundings. An undesired light emission from the rear side of the device can thus be avoided or reduced.

The diaphragm can have a disk, in particular a circular and/or one-part or multi-part disk, which is arranged on the surface of the rear layer facing the intermediate layer, wherein the rear side of the light source is preferably arranged centered on the disk. The diaphragm can be compact and cost-effective.

In a plan view of the front side of the light source, the light source and the limiting device can cover a first part of the disk and cannot cover a second part of the disk, which is located on the outside in the radial direction, wherein the second part has a width, seen in the radial direction, which is equal to or greater than 2*D*0.84 or 2*D, wherein D is the thickness of the front layer.

Back reflections, in particular Fresnel reflections at small angles, can thus be absorbed or reflected via the diaphragm. Therefore, the forward emission can be improved. Light radiation from the rear side can be reduced or avoided.

The diaphragm can have a perforated disk, in particular a circular and/or one-piece or multi-piece, perforated disk, which is arranged centered above the light source and between the front layer and the rear layer. Light emitted in the defined spatial region can be radiated forward through a central recess of the perforated disk, while back-reflected light is absorbed by the perforated disk or reflected forward again.

The perforated disk can be arranged at the level of a circumferential end of a reflector or absorber device remote from the light source. An internal edge of the perforated disk can surround and/or contact the remote end of the reflector or absorber device. As seen in the radial direction, the perforated disk may have a width which is equal to or more than 2*D*0.84 or 2*D, wherein D is the thickness of the front layer. Back reflections, in particular Fresnel reflections, can be absorbed or reflected by means of the diaphragm.

The diaphragm can serve as at least one electrical contact point for at least one electrical contact of the light source. A power supply from a contact of the light source can thus take place via the diaphragm. The diaphragm can also be divided into two electrically separated regions, so that both contacts of the light source can be electrically contacted independently of one another. Alternatively, a partial region of the diaphragm can be provided only as a reflector or as an absorber, while another partial region fulfills a dual function in that it is provided both as an electrical contact and as a reflector or absorber.

An electrical and/or electronic driver device can be arranged laterally next to or below the light source between the front layer and the rear layer.

Alternatively, the driver device may be arranged in the rear layer.

The housing of the driver device can be designed to be reflective or absorptive.

An optical device can be arranged on the front side of the light source and is designed to restrict the spatial region of the light emission from the light source. The optical device can be provided as primary optics on the front side of the light source in order to improve the forward directionality of the light emission. The optical device may comprise a photonic crystal structure or a Bragg mirror. For example, the photonic crystal structure or Bragg mirror may block or reduce light propagation in a direction perpendicular to the normal of the front side.

An electrical wiring layer may be formed on a surface of the rear layer facing the intermediate layer or in the rear layer. A plurality of wiring layers may also be provided in the rear layer.

The front layer, the rear layer, and the intermediate layer may be laminated together. For planarization, the intermediate layer can have laminate and/or filler material, into which the light source and further components, such as the limiting device, are embedded. The laminate may comprise or be formed by an adhesive. The material of the intermediate layer may have an optical refractive index corresponding to the optical refractive index of the front and rear layers.

In some embodiments, an optoelectronic device, in particular a display device, comprises at least one optoelectronic light source, an at least partially transparent front layer, and an at least partially transparent support layer. The light source is arranged between the front layer and the support layer, and a front side of the light source faces the front layer and a rear side of the light source faces the support layer, and wherein a limiting device is arranged in a circumferential direction around the light source. The limiting device is configured to limit a spatial region, in which the light source emits light such that total internal reflection of the emitted light, in particular at an interface between the front layer and the outside, is avoided or at least reduced. This is advantageous, as for example an improved contrast can be obtained between illuminated and non-illuminated regions of the interface.

The interface might in particular correspond to the upper surface of the optoelectronic device. In case the device is a display, the interface might correspond to a display front side. Due to an improved contrast, a user experience of a user that looks at the display can be enhanced.

Preferably, the limiting device is configured to absorb light. The limiting device can for example have a black surface. The limiting device can be designed and arranged with regard to the light source such that light from the light source that would cause total internal reflection is incident on the limiting device. Such light is therefore absorbed.

In some embodiments, the limiting device is a ring-shaped element inside of which the optoelectronic light source is located, wherein the
ring-shaped limiting device
has an internal diameter and a height such that light emitted from the light source that would otherwise be totally reflected in the optoelectronic device, in particular at the interface between the front layer and the outside, is absorbed by the ring-shaped element. The ring-shaped element can be easily fabricated and it can serve to reduce an angle range of the light emitted by the light source. Thereby, light that would be incident on the interface in an angle of incidence which is equal to or larger than the critical angle of total internal reflection can be avoided.

The light source is preferably arranged within the ring-shaped element such that the center axis of the ring-shaped element and a center of the light source coincide.

In some embodiments, the optoelectronic light source and the ring-shaped element is located in an intermediate layer. The optoelectronic light source and the ring-shaped element can be arranged on a surface of the support layer, which is adjacent to the intermediate layer.

The support layer can for example be a PET (Polyethylene Terephthalate) layer. The intermediate layer can in particular be an EVA (Ethylen-Vinylacetat-Copolymer) or PVB (Polyvinyl Butyral) layer. The front layer can be a glass layer.

Preferably, the ring-shaped element is formed in a ring-shaped form, which is made in the intermediate layer, in particular by laser drilling, and the ring-shaped form is filled with an absorbing material, such as a black material. Such a ring-shaped element can be fabricated easily and cost-efficiently.

The optoelectronic light source can be arranged on a backside of the support layer, and the limiting device can be arranged on the topside of the support layer. The limiting device and the light source can thus be arranged on opposite sides of the support layer. The limiting device can help to reduce crosstalk between neighbouring light sources.

The limiting device can be formed by at least a structured area which includes an absorbing and/or a partially or semi-transparent material and which is arranged on the topside of the support layer.

The optoelectronic light source can be formed by a ring-shaped element, in particular made of an absorbing and/or a partially or semi-transparent material layer section, on the topside of the support layer. A central axis of the ring-shaped element can coincide at least approximately with a central axis of the optoelectronic light source.

Such a ring shaped element can for example be fabricated by providing a circular element of an absorbing and/or partially or semi-transparent material on the topside of the support layer. A central circular region can be removed from the circular element, for example by etching, laser ablation, or a mechanical process, to obtain the ring shaped element.

The invention also relates to an optoelectronic device, in particular a display device, comprising at least one optoelectronic light source, an at least partially transparent front layer, and an at least partially transparent support layer. The light source is arranged on or at least partially embedded in the support layer. A front side of the light source faces the front layer and a rear side of the light source faces the support layer. A partially or semi-transparent intermediate layer, for example with a transmittance in the range between 15% to 25% percent or of around 18%, is arranged between the front layer and the support layer. The intermediate layer can effectively dampen light that propagates within the optoelectronic device, in particular due to undesired reflections on interfaces between layers of the optoelectronic device or on an interface of the front side of the optoelectronic device and the outside. The intermediate layer can for example be a tinted PVB layer.

In some embodiments, a structured layer with light scattering elements is arranged on the front layer. The structured layer could be a layer segment which is centred above the light source. In some embodiments, an intermediate layer can be arranged between the front layer and the support layer and a structured layer with light scattering elements can be arranged between the front layer and the intermediate layer. The structured scattering layer can scatter the light provided by the light source and therefore provide a more homogeneous illumination of the interface between the front layer and the outside. Further, light that travels at a large angle of incidence towards the interface and that would be reflected internally could be scattered by the structured scattering layer. The scattered light can then be incident on the interface at a lower angle of incidence. Thus, total internal reflection at the interface can be avoided or reduced.

In some embodiments, a partially or semi-transparent back layer (also called rear layer), for example with a transmittance in the range between 15% to 25% percent or of around 18%, is arranged below the support layer. The back layer can dampen undesired light that propagates through the layers, for example due to total internal reflection at the interface between the top layer and the outside. Alternatively, the partially or semi-transparent rear or back layer can have a transmittance in the range between 10% to 90% percent or of around 20%. The rear layer and an intermediate layer between the front layer and the support layer can have different transmittance values. For example, the layers can be tinted differently.

An intermediate layer can be arranged between the front layer and the support layer and the optoelectronic light source can be arranged on the support layer, wherein the intermediate layer comprises a cavity surrounding the optoelectronic light source or above the optoelectronic light source, wherein the cavity is filled with a material having a low index of refraction, in particular air.

An intermediate layer can be arranged between the front layer and the support layer and the optoelectronic light source can be arranged on the support layer, wherein the intermediate layer can comprise a plurality of columns arranged above the optoelectronic light source, wherein the columns can include a material with a low index of refraction, in particular air.

The optoelectronic light source can be a LED or µLED (LED for light emitting device, µLED for micro-LED) or mini-LED or LED-chip or µLED-chip or mini-LED-chip.

An LED can for example have an edge length in the order of 150-200 µm or an edge length smaller than 300 µm, in particular smaller than 150 µm.

The LED or µLED or mini LED can include an LED-chip or µLED-chip or mini-LED-chip and/or an over-molding and/or a housing. The optoelectronic light source can also be a LED-chip or a µLED-chip or mini-LED-chip and cannot include an over-molding and a housing. The LED or µLED or mini-LED can thus be unhoused. The LED-chip or µLED-chip or mini-LED can include electric contacts for providing a driving current to the chip.

A LED can in particular be referred to as a mini LED, which is a small LED, for example with edge lengths of less than 200 µm, in particular down to less than 40 µm, in particular in the range from 200 µm to 10 µm. Another range is between 150-40 µm. However, the LED can also be referred to as a micro LED, also called μLED, or a μLED-chip, in particular for the case of the edge lengths being in a range of 100 μm to 10 μm.

A mini LED or a μLED-chip, can be used as optoelectronic light source. The mini LED or μLED-chip can form a pixel or a subpixel and emit light of a selected colour. The mini LED or μLED-chip can in some embodiments be an unpackaged semiconductor chip. In some embodiments, each optoelectronic light source can comprise a mini LED or a μLED-chip configured to emit light of a selected colour. In some embodiments, each optoelectronic light source can comprises one or more mini LEDs, or μLED-chips, such as for example a RGB-Pixel, which comprises three mini LEDs or μLED-chips. A RGB-Pixel can for example emit light of the colours red, green and blue as well as any mixed colour.

In some embodiments, an RGB-Pixel can further comprise one or more integrated circuits (IC), in particular small integrated circuits as for example micro integrated circuits (μIC).

In some embodiments, the optoelectronic device comprises a carrier or carrier layer, also referred to as intermediate layer, first layer, first layer segment, or support layer, as well as a front layer and a rear layer, also referred to as cover layer an/or back layer. The carrier layer can be arranged between the front layer and the rear layer. The carrier layer can carry the at least one optoelectronic light source or optoelectronic detector or the at least one optoelectronic light source or optoelectronic detector can be partially or completely embedded in the carrier layer.

In some embodiments, the carrier layer can at least be partially transparent and comprise or consist of a material, such as high or low grade polyethylene terephthalate (PET), polyethylene naphthalate (PEN), polycarbonates (PC), (colourless) polyimide (PI), polyurethane (PU), poly(methyl methacrylate) (PMMA), polycyclic aromatic hydrocarbons (PAK), or any other suitable material. Particularly, the carrier layer can comprise or consist of an at least partially transparent plastic, in particular an at least partially transparent foil, in particular a flexible foil.

Each of the front and rear layer may be made of a glass material, a plastic material and/or any other suitable material. Each of the front and rear layer may contain only one layer or several layers of the same or different materials.

In some embodiments, the optoelectronic device further comprises at least one auxiliary layer, which also is referred to as further layer, intermediate layer, or spin on glass (SOG) layer. A first auxiliary layer can be arranged between the carrier layer and the front layer and optionally a second auxiliary layer can be arranged between the carrier layer and the rear layer.

The at least one auxiliary layer can be formed by one of the following:
a molten material layer or
an adhesive layer, in particular a hot-melt adhesive layer, a resin, such as Ethylene Vinyl Acetate (EVA), Polyvinyl Butyral (PVB), or
a ionomer based system.

In some embodiments, the at least one auxiliary layer can enclose the carrier layer in the same layer. The at least one auxiliary layer can have the same height as the carrier layer, however the at least one auxiliary layer can also have a height which is different, in particular larger, than the height of the carrier layer. The at least one auxiliary layer can enclose the carrier layer not only in a circumferential direction, since the carrier layer can be completely embedded in the at least one auxiliary layer.

In some embodiments, the at least one auxiliary layer can at least be partially transparent. In some embodiments, the at least one auxiliary layer can be blackened, resulting in an at least partially transparent auxiliary layer. If the optoelectronic apparatus comprises more than one auxiliary layer, none, one, a selection of the auxiliary layers, or all auxiliary layers can be blackened.

In some embodiments, the at least one optoelectronic light source, in particular LED, can be smaller than 300 μm, in particular smaller than 150 μm. With these spatial extensions, at least one optoelectronic optoelectronic light source is almost invisible for the human eye.

In some embodiments, the at least one optoelectronic light source is a LED. A LED can in particular be referred to as a mini LED, which is a small LED, for example, with edge lengths of less than 200 μm, in particular down to less than 40 μm, in particular in the range from 200 μm to 10 μm. Another range is between 150 μm to 40 μm.

The LED also can be referred to as a micro LED, also called μLED, or a μLED-chip, in particular for the case of the edge lengths being in a range of 100 μm to 10 μm. In some embodiments, the LED can have spatial dimensions of 90×150 μm or the LED can have spatial dimensions of 75×125 μm.

The mini LED or μLED-chip can in some embodiments be an unpackaged semiconductor chip. Unpackaged can mean that the chip is without a housing around its semiconductor layers such as for example an unpacked semiconductor die. In some embodiments, unpackaged can mean that the chip is free of any organic material. Thus, the unpackaged device does not contain organic compounds, which contain carbon in covalent bonding.

In some embodiments, each optoelectronic light source can comprise a mini LED or a μLED-chip configured to emit light of a selected colour. In some embodiments, each optoelectronic light source can comprises one or more mini LEDs, or μLED-chips, such as for example a RGB-Pixel, which comprises three mini LEDs or μLED-chips. A RGB-Pixel can for example emit light of the colours red, green and blue as well as any mixed colour.

In some embodiments, an RGB-Pixel can further comprise one or more integrated circuits (IC), in particular small integrated circuits as for example micro integrated circuits (μIC).

In some embodiments, the optoelectronic device comprises at least one conductor line, also referred to as electrically conducting material layer element, or bonding wire, and preferably two conductor lines, particularly to supply electric energy and/or a data signal to the at least one optoelectronic light source.

In some embodiments, the carrier layer carries the at least one conductor line. However in some embodiments, at least one auxiliary layer can carry the at least one conductor line.

In some embodiments, the at least one conductor line can be of a conductive material, such as for example copper. The at least one conductor line can be coated and/or blackened to reduce the reflectance of the outer surface area of the at least one conductor line. The coating can for example be a palladium or molybdenum coating. In some embodiments, the at least one conductor line can have a width in the range between 5 μm to 50 μm.

In some embodiments, the at least one conductor line can be formed as a conductive mesh, particularly a metallic mesh. The mesh can be coated and/or blackened, in particular to reduce the reflectance of the outer surface area of the conductive mesh. The coating can for example be a palladium or molybdenum coating.

In some embodiments, an optoelectronic device comprises a layer stack, which includes a carrier layer as well as a front layer and a rear layer. The carrier layer is in particular an intermediate layer, which is arranged between the front layer and the rear layer. At least one electronic or optoelectronic element, in particular an optoelectronic light source, is arranged on the carrier layer and at least one layer of the layer stack and preferably all layers of the layer stack are at least partially transparent. The layer stack comprises at least one electrically conductive layer, which is arranged between two adjacent layers of the layer stack or embedded in a layer.

In some embodiments, the at least one electrically conductive layer comprises at least one conductive line which is electrically connected to a contact pad of the optoelectronic light source. The at least one electrically conductive layer can be of a good electrically and thermally conductive material such as for example copper, silver, gold and aluminum. The at least one electrically conductive layer and particularly the at least one conductive line can be coated and/or blackened to reduce the reflectance of the outer surface area of the at least one conductive line. The coating can for example be a palladium or molybdenum coating. In some embodiments, the at least one electric line can have a width in the range between 5 µm to 50 µm.

The at least one electrically conductive layer can comprise an electrically conductive mesh, for example a metallic mesh, in particular a copper mesh. The mesh can have nodes and interconnects between the knots, wherein, preferably, at least the majority of the interconnects are not interrupted. The at least one electrically conductive layer can thus be structured and comprise a plurality of conductive lines being connected with each other.

The mesh can have a regular or an irregular pattern, wherein an irregular pattern can be preferred, as an irregular pattern can increase the transparency of the electrically conductive layer. The reason for this can be that an irregular pattern can be more difficult to perceive by the human eye.

In some embodiments, the conductive mesh is coated and/or blackened, in particular to reduce the reflectance of the outer surface area of the conductive mesh. The coating can for example be a palladium or molybdenum coating.

At least some embodiments of the optoelectronic device as described herein can be arranged on non-flat or curved surfaces, for example on the outside or in the interior of a vehicle or a building. This is in particular possible as at least some embodiments of the optoelectronic device as described herein can be built on the basis of a layer structure which is flexible.

The invention therefore also relates to a larger entity, such as a vehicle or building, which comprises on its exterior or interior, in particular on an exterior or interior surface, at least one optoelectronic device.

The description with the aid of the exemplary embodiments does not limit the invention thereto. Rather, the invention comprises any new feature and any combination of features, which in particular includes any combination of features in the patent claims, even if this feature or this combination is not itself explicitly stated in the patent claims or exemplary embodiments.

BRIEF DESCRIPTION OF THE DRAWINGS

The following description of figures may further illustrate and explain exemplary embodiments. Components that are functionally identical or have an identical effect are denoted by identical references. Identical or effectively identical components might be described only with respect to the figures where they occur first. Their description is not necessarily repeated in successive figures. There are shown in the drawings:

FIGS. 1 to 10 schematic cross-sectional views of different embodiments of an optoelectronic device in accordance with the present invention, FIG. 11 a transmission profile of an exemplary tint used in a carrier of an optoelectronic device in accordance with the present invention.

DETAILED DESCRIPTION

Figure 5:
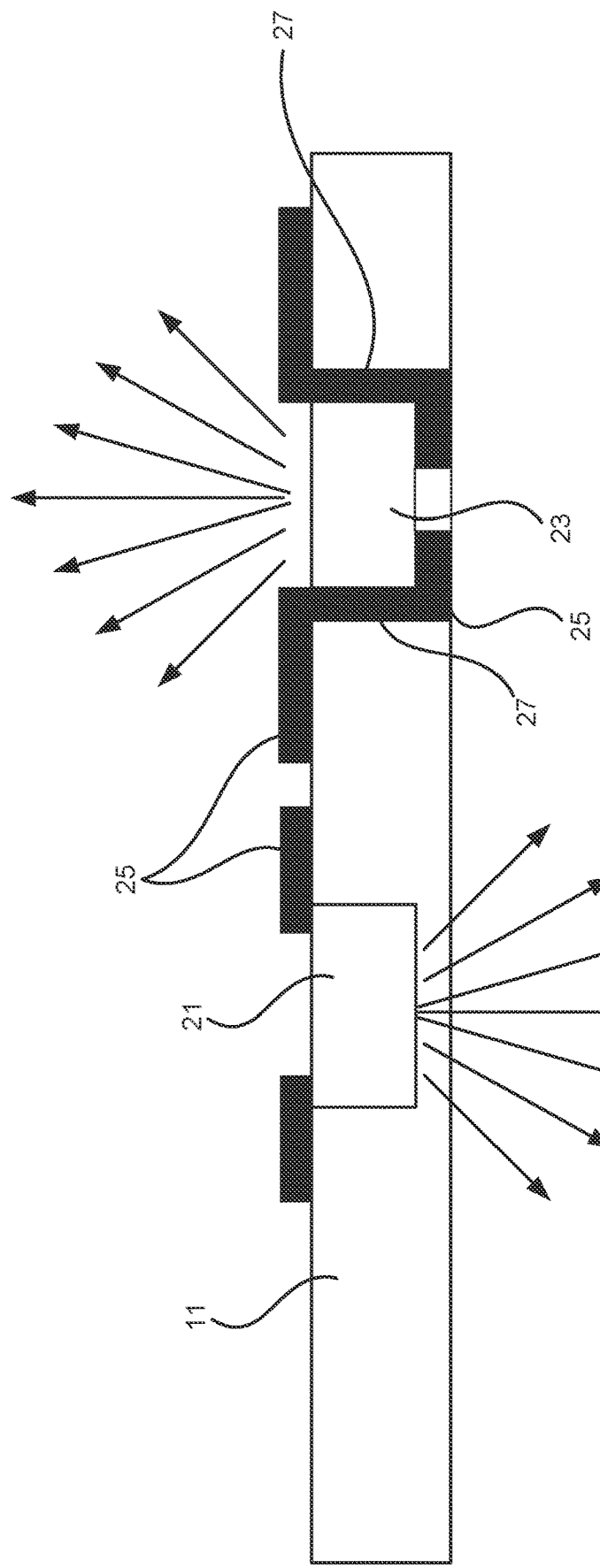

The optoelectronic device shown in a cross-sectional view in FIG. 1 comprises an at least partially transparent carrier layer 11 configured to carry a plurality of optoelectronic light sources 13. The device also includes an at least partially transparent cover layer 15. The light sources 13 are arranged on the carrier layer 11. Alternatively, they can at least partially be embedded in the carrier layer 11 (see for example FIG. 4).

Each light source 13 can for example be a LED, such as a volume emitting LED or a surface emitting LED. A volume emitting LED can emit light through its top and side surfaces, while a surface emitting LED can emit light through its top surface. Preferably, in the embodiment as shown in FIG. 1, the light source 13 is a volume emitting LED.

The device as shown in FIG. 1 comprises an at least partially transparent intermediate layer 17, which is arranged between the carrier layer 11 and the cover layer 15. The intermediate layer 17 comprises or consists of an adhesive for gluing the carrier layer 11 to the cover layer 15.

It can be desired that light generated by the light sources 13 only exits through one of the carrier layer 11 and the cover layer 15, while it can be unwanted that light exits through the other layer. For this reason, the optoelectronic light sources 13 can be arranged such that light generated by the light sources 13 is exiting the device either through the carrier layer 11 or the cover layer 15. An exit through the "wrong" layer is intended to be at a low level or at zero level. The emission of light can thus be a directed emission.

As shown in FIG. 1, each light source 13 can be associated with a reflecting optical element 19, here in form of a curved mirror. The optical elements 19 are embedded in the carrier layer 11. An optical element 19 is configured to reflect light emitted by the associated optoelectronic light source 13 towards the carrier layer 11 such that the light exits the device through the carrier layer 15 (see arrows in FIG. 1).

The curved optical elements 19 can have a mirror coating forming a reflective surface. The coating can provide broadband reflectivity including reflectivity in the wavelength region of the light emitted by the light sources 13. Alternatively, the reflectivity of the coating can be selective for a wavelength or a wavelength region of the emitted light.

In some embodiments, the light sources 13 can be configured or arranged such that no light is emitted through the upper surface, i.e. the surface of the light sources 13 which is facing the cover layer 15.

As shown in FIG. 2, the optical element 19 can be a light absorbing or reflective element, in particular in form of a flat plate, which can absorb light from the optoelectronic light source 13 traveling towards the carrier layer 11 or reflect such light back so that it exits through the cover layer 15.

The optical element 15 as shown in FIG. 2 is arranged on the carrier layer 11, and the associated optoelectronic light source 13 is arranged on top of the optical element 19 in the intermediate layer 17. The optoelectronic light source 13 can be centered on the optical element 19 as shown in FIG. 2.

The optical element 19 as shown in FIG. 2 can comprise a metal or can be made of a multilayer mirror. The mirror can be reflective within a wide range of wavelengths, for example in the range of from 400 nm to 800 nm, or within a small range of wavelengths, for example only for blue light in the range of from 420 nm to 480 nm.

As shown in FIG. 3, the optoelectronic light sources 13 can be arranged on the surface of the carrier layer 11 that is facing the cover layer 15 (not shown in FIG. 3; the cover layer 15 is above the light sources of FIG. 3). An optical element 19, in particular a reflecting or absorbing optical element, is arranged on the opposite surface of the carrier layer 11 which is facing away from the cover layer 15. For example, the optical element 19 is formed by a coating layer or a structure printed on the surface of the carrier layer 11. The optical element 19 can comprise a matrix material, such as $TiO_2$ or $ZrO_2$. The optical element 19 can act as a reflector, and the optical element 19 can at least partially prevent that light from the light source 13 can exit through the outer surface of the optical element 19.

The optical element 19 can have a width or a diameter below 150 µm (measured in a plane parallel to the bottom surface of the carrier layer 11).

As shown in FIG. 4, an exemplary embodiment of an optoelectronic device can include an optoelectronic light source 21 of a first set of optoelectronic light sources. The light source 21 can be arranged such as to emit light towards the surface of the carrier layer 11 which is facing away from the cover layer 15 (not shown in FIG. 4). The cover layer 15 is in the device of FIG. 4 arranged above the carrier layer 11, see FIG. 1. Furthermore, a light source 23 of a second set of light sources is arranged such as to emit light towards the surface of the carrier layer 11 which is facing the cover layer 15.

The first set of light sources and the second set of light sources can be operated independently from each other. The first set of light sources and the second set of light sources can for example be arranged such that only one plane of electrical conductor lines is required to provide electricity to and to control operation of the light sources 21, 23.

The optoelectronic light source 21 of the first set of light sources is embedded in the carrier layer 11. The optoelectronic light source 23 of the second set of light sources is arranged on the carrier layer 11. The light sources 21, 23 are for example flip chips, which have both electric contact pads 25 on the bottom surface. The light sources 21, 23 are preferably surface emitters that emit light through their top surface, i.e. the surface which is opposite to the bottom surface.

As shown in FIG. 5, both, the optoelectronic light source 21 of the first set of light sources and the optoelectronic light source 23 of the second set of light sources can be embedded in the carrier layer 11. Electrical conductor lines 27 for providing electricity to the contact pads 25 of the light source 23 are arranged on the outside of the light source 23 to reach from the surface of the carrier layer 11 downward around the light source 23 to contact the contact pads 25. Thus, also in the embodiment of FIG. 5, a single plane of electrical conductor lines can be sufficient to provide electricity to and to control operation of the light sources 21, 23.

Figure 6:
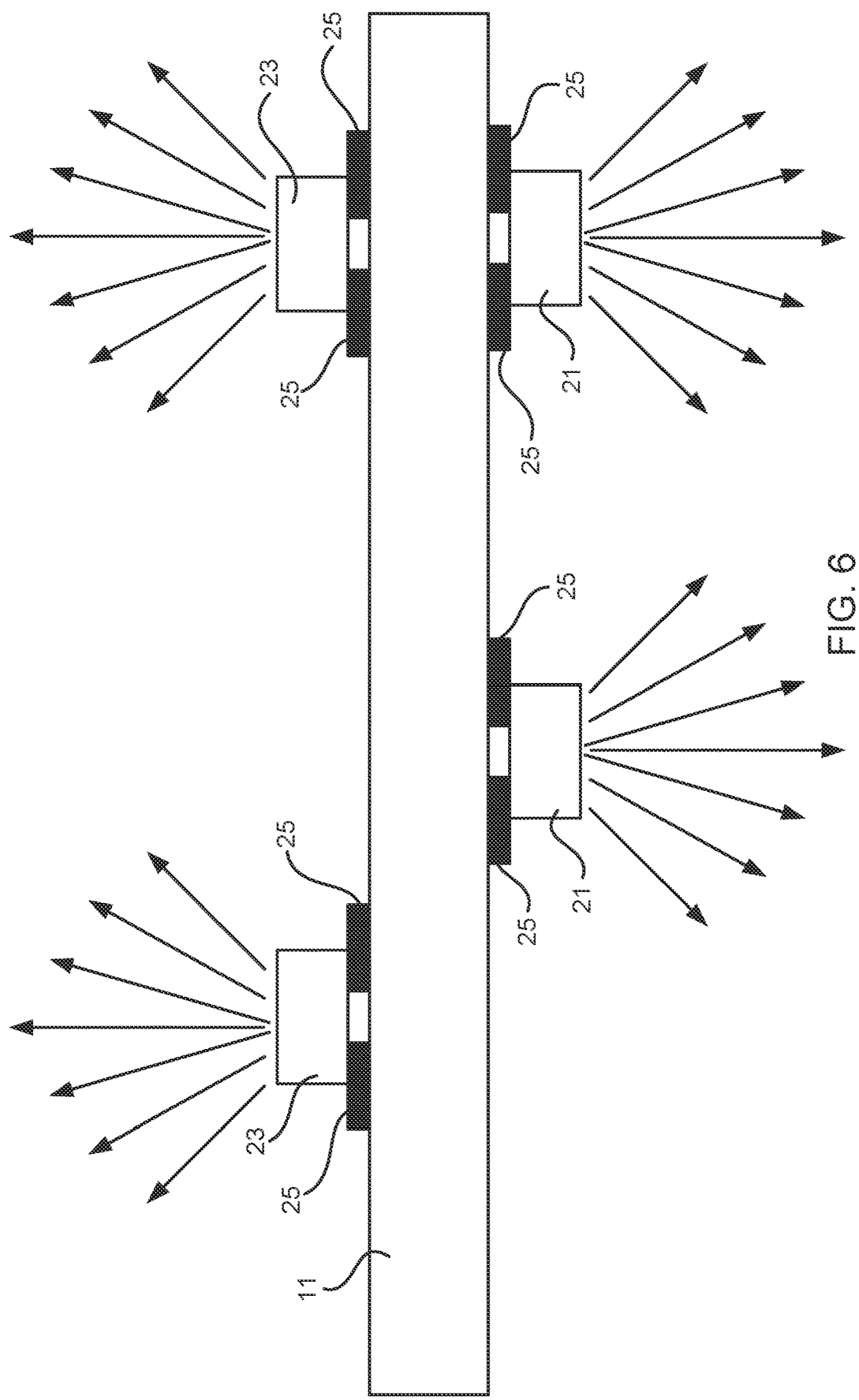

As shown in FIG. 6, the optoelectronic light sources 21 of a first set of light sources and the optoelectronic light sources 23 of a second set of light sources can be arranged on the opposite surfaces of the carrier layer 11. Electricity can be provided to the contact pads 25 of the light sources 21, 23 by at least a plane of electrical conductor lines arranged on the respective surface of the carrier layer 11.

With reference to FIGS. 4 to 6, the light sources 21, 23 of the first set of light sources and the light sources of the second set of light sources can be operated independently from each other. They therefore allow for an electrically adjustable radiation distribution on both sides of the carrier layer 11.

Figure 7:
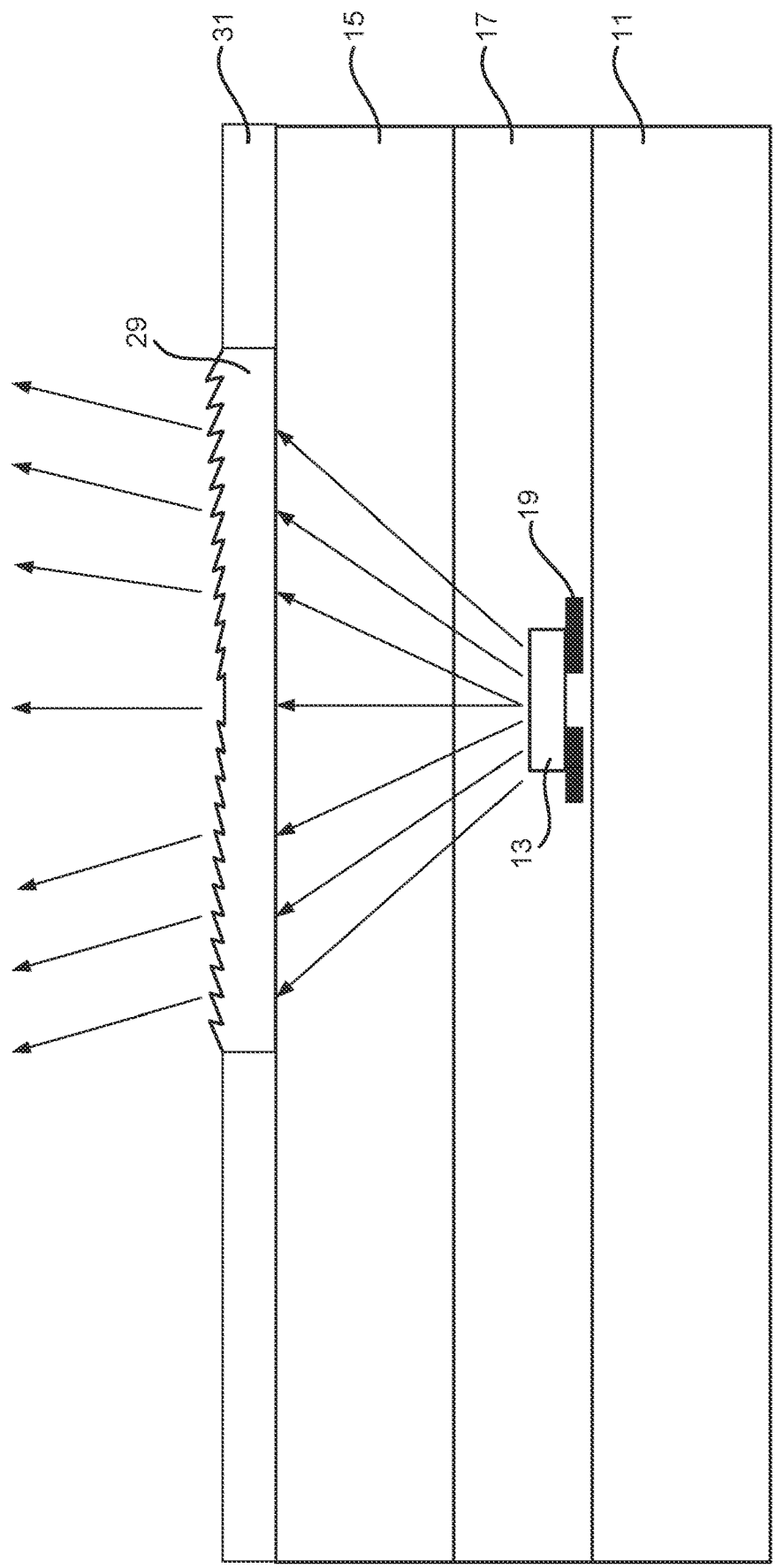

As shown in FIG. 7, an exemplary optoelectronic device can include at least one light shaping element 29, here a Fresnel optics or a Fresnel lens, which is arranged in a separate layer 31 and aligned with an optoelectronic light source 13 arranged on the carrier layer 11 and in the intermediate layer 17. The term "light shaping" is to be understood in a broad sense. In particular, the light shaping element 29 can have at least to some extend a beam shaping effect as it can cause the light to be emitted more in one direction. Thus, the light shaping element 29 can serve to improve the directionality of the emitted light.

Figure 8:
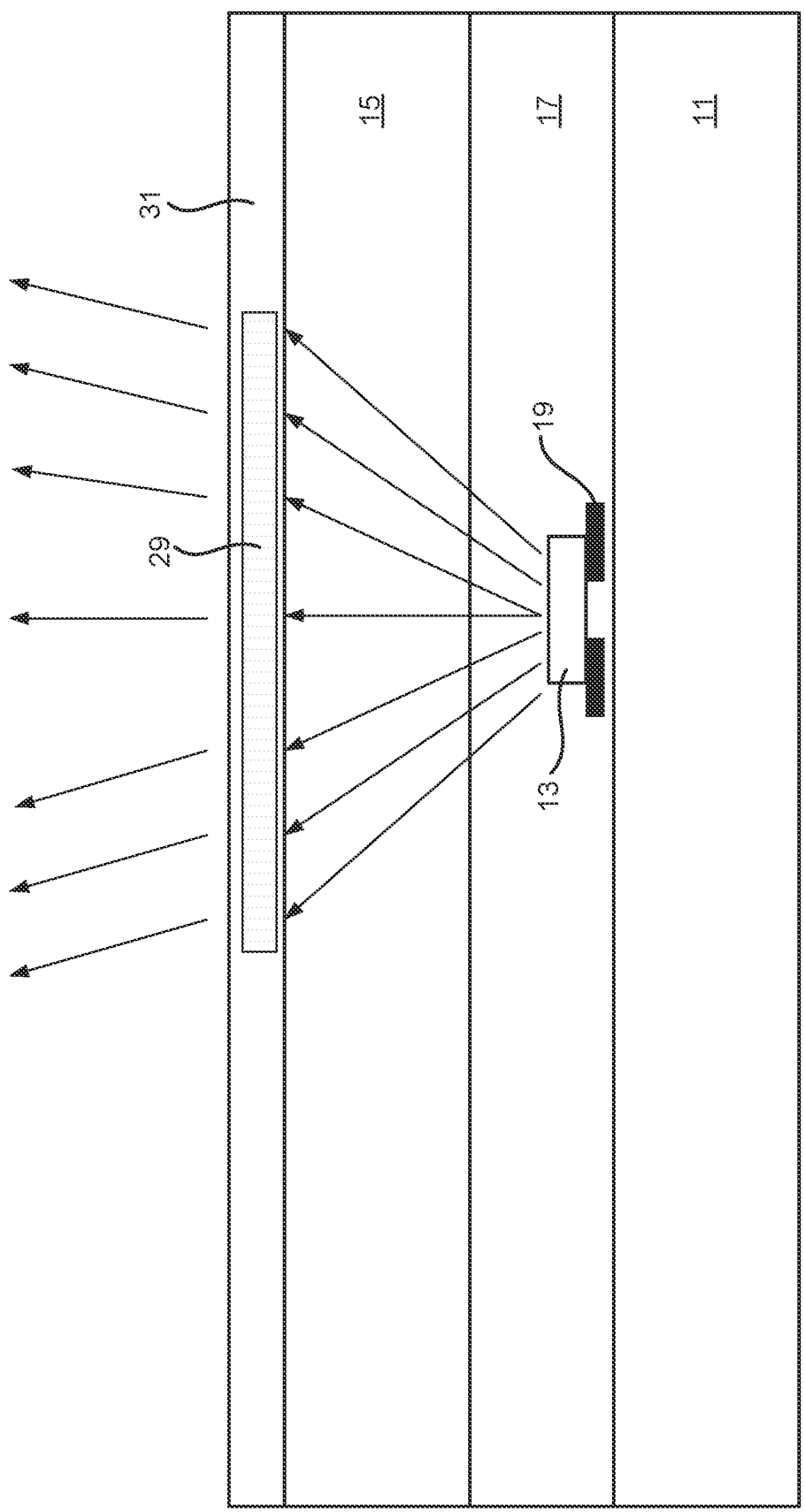
Figure 9:
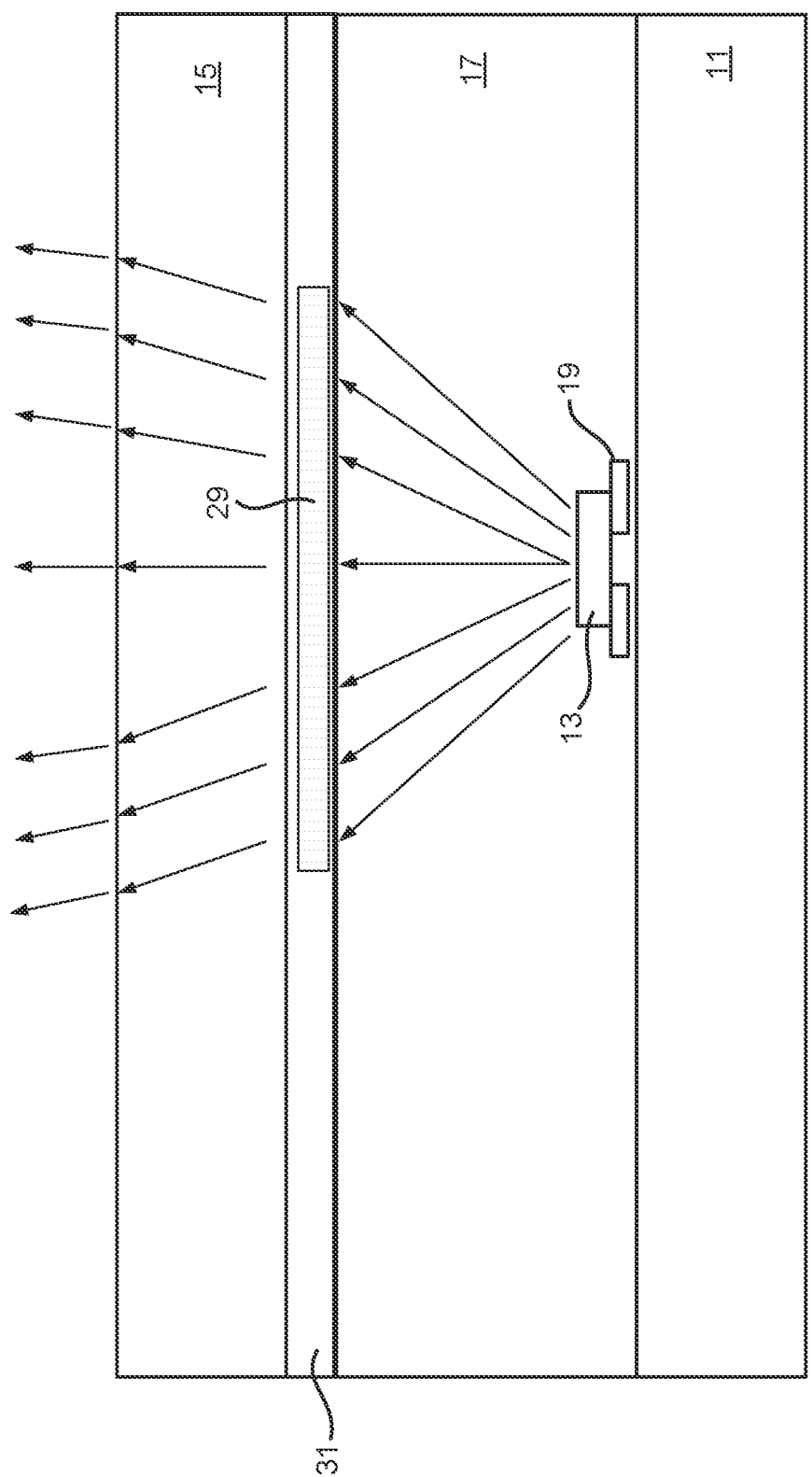

In the embodiments of FIGS. 8 and 9, light shaping element 29 is a diffraction grating or a holographic film. In the embodiment of FIG. 9, the separate layer 31 which includes the light shaping element 29 is arranged between the cover layer 15 and the intermediate layer 17.

The embodiments of FIGS. 7 to 9 can be used as headlights or reading lights, for example in the interior of a vehicle. The diffraction grating and the holographic film are selective on wavelength. They can therefore be adapted to the wavelengths of the light emitted by light source 13. Holographic films can be exposed several times during their production and they can therefore be set to be selective for several wavelengths.

The carrier layer 11 is preferably a flexible carrier layer and/or made of a foil or a glass material. The cover layer 15 is preferably a flexible cover layer, and the cover layer 15 can be made of glass or of a plastics material like PMMA or PC.

As shown in FIG. 10, the carrier layer 11 can be tinted to reduce or avoid light that exits through the carrier layer 11 to the outside. The transmission can for example be reduced to an intensity in the range of from 30% to 35% of the intensity of the generated light.

As shown in FIG. 11, the tinted carrier layer 11 can have a transmission profile which is for example adapted to the emission profile of light source 13. Thus, the carrier layer 11 can suppress light transmission in a wavelength range that includes the wavelengths of the light emitted by the light source 13. Furthermore, it can provide a higher transmission for outdoor vision.

Figure 12:
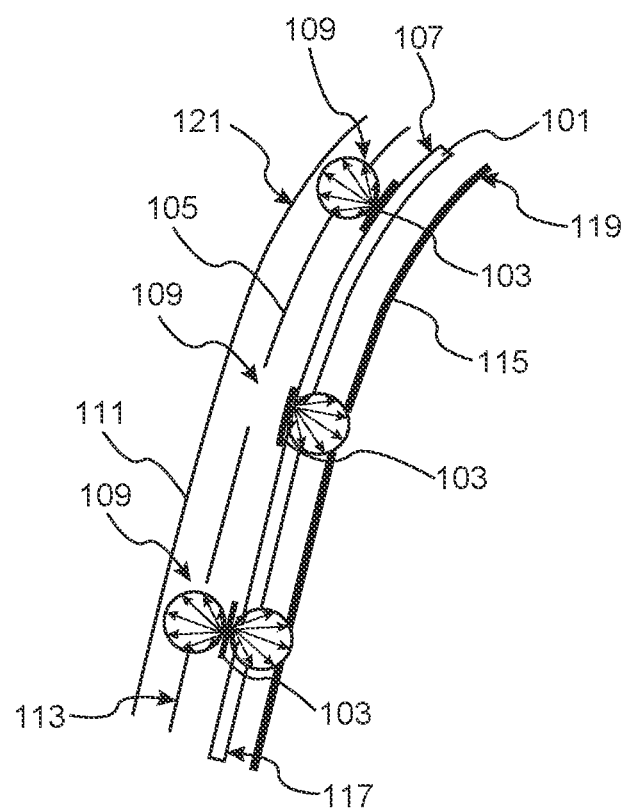
FIG. 12 is a cross-sectional and exploded view of an optoelectronic device in accordance with the present invention.

The optoelectronic device as shown in FIG. 12 comprises an at least partially transparent intermediate layer 101, which is for example a transparent foil, and a plurality of optoelectronic light sources 103, such as LEDs or µLEDs, arranged on or embedded in the intermediate layer 101.

Figure 13:
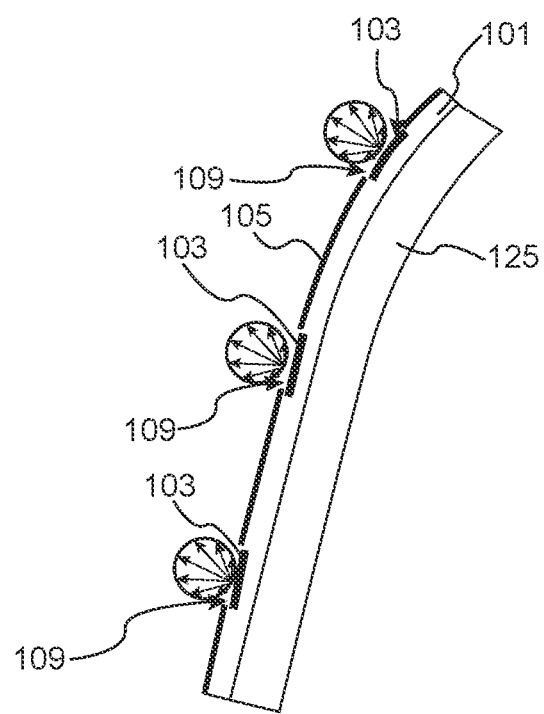
FIG. 13 is a partial cross-sectional view of the optoelectronic device of FIG. 12.

As shown also in FIG. 13, the optoelectronic device further comprises a preferably non-transparent top layer 105, for example a coloured foil, arranged on an upper surface 107 of the intermediate layer 101. The top layer 105 comprises a plurality of apertures 109 which are aligned with the light sources 103, so that light from a light source 103 can be radiated to the front through the respective aperture 109 which is aligned with the light source 103.

Figure 14:
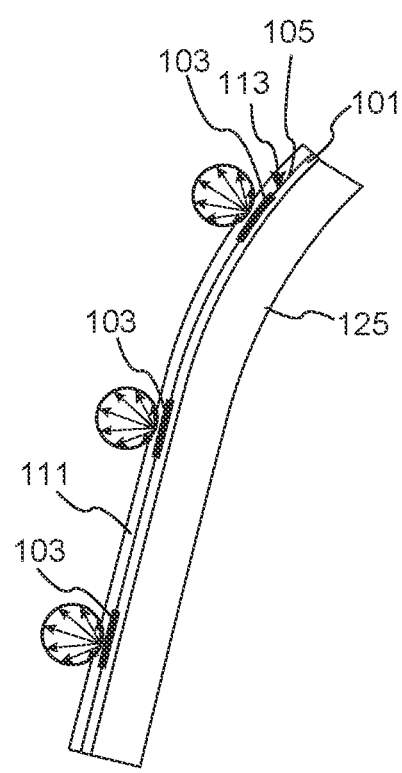
FIG. 14 is another partial cross-sectional view of the optoelectronic device of FIG. 12.

As also shown in FIG. 14, a filtering layer 111, which is preferably a neutral density filter, is arranged on an upper surface 113 of the top layer 105. The filtering layer can help to improve the emission characteristic of the light sources, in particular with respect to an even distribution of brightness.

Figure 15:
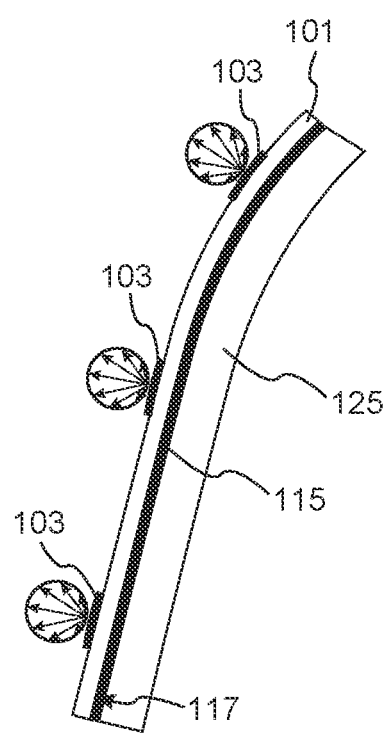
FIG. 15 is another partial cross-sectional view of the optoelectronic device of FIG. 12.

Furthermore, referring in particular to FIGS. 12 and 15, a non-transparent or at least partially transparent background layer 115, such as a coloured foil, is arranged on a bottom surface 117 of the intermediate layer 101.

The optoelectronic device can be built up in a modular way, in particular by selectively adding one or more of the above-mentioned layers. Thus, in some embodiments, not all of the shown layers might be present.

Figure 17:
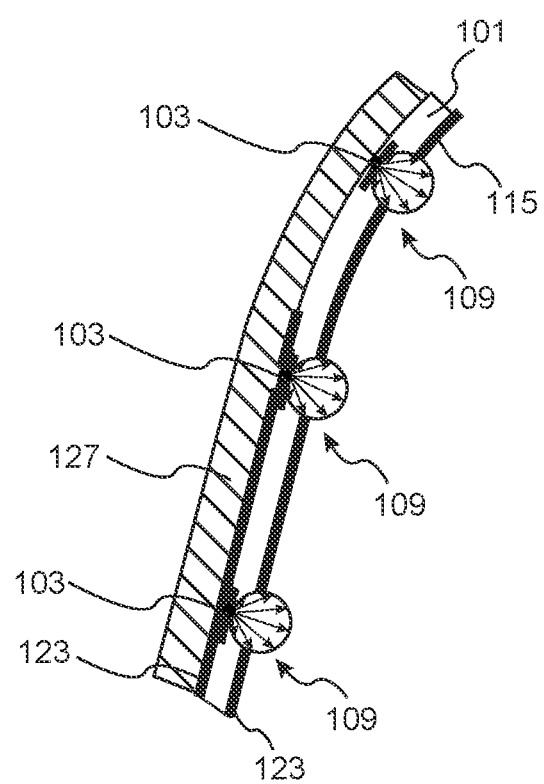
FIG. 17 is a cross-sectional view of another optoelectronic device in accordance with the present invention, FIGS. 18 and 19 serve to illustrate a method of producing an optoelectronic device in accordance with the present invention, FIGS. 20 to 22 serve to illustrate a further method of producing another optoelectronic device in accordance with the present invention.

The layers can be arranged between a non-transparent or at least partially transparent carrier layer 125 (see FIG. 15) and a non-transparent or at least partially transparent cover layer 127 (see FIG. 17). The carrier layer 125 can be arranged on the bottom surface 117 of the intermediate layer 101 or on a bottom surface 119 of the background layer 115, if the background layer 115 is present. The cover layer 127 can be arranged on the upper surface 121 of the filtering layer 111.

The carrier layer 125 can be transparent or partially transparent, for example, if the device is employed in a window of the vehicle. It can, for example, be a non-transparent carrier layer 125 if the device is arranged on a non-transparent surface, for example in the interior or exterior of a vehicle.

The depicted layers of the optoelectronic device can be bendable and thus provide some degree of flexibility. The layers can therefore be arranged on a curved surface, for example of a vehicle.

The top layer 105 has apertures 109 that are aligned with the light sources 103, so that a directed emission towards a front side of the device is possible.

Figure 16:
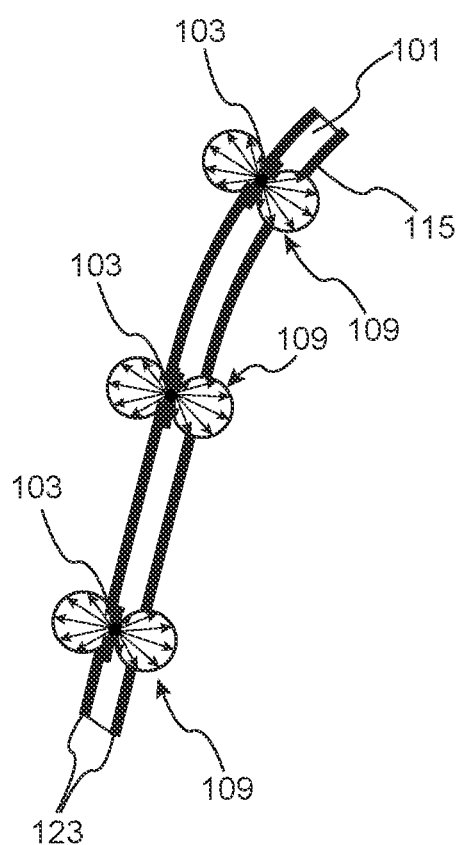
FIG. 16 is a cross-sectional view of an optoelectronic device in accordance with the present invention.

In contrast to the device as shown in FIG. 12, the optoelectronic device of FIG. 16 has a background layer 115 with apertures 109 which are aligned with the light sources 103. Thus, directed light emission towards a backside of the device is also possible.

In some embodiments, as shown in FIG. 17, the top layer 105 cannot have apertures 105, so that only light emission towards the backside of the device can be possible due to apertures 109 in the background layer 115. Thus, the device can be configured to emit light only to the frontside (FIG. 12), only to the backside (FIG. 17), or to both sides (FIG. 16).

As further indicated in FIGS. 16 and 17, adjacent layers can be fixed to each other by use of an adhesive or lamination material layer 123, for example a thermoplastic layer.

Figure 18:
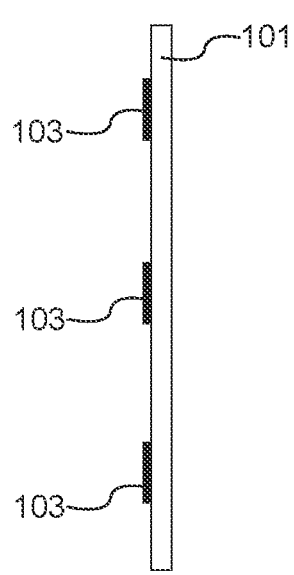
Figure 19:
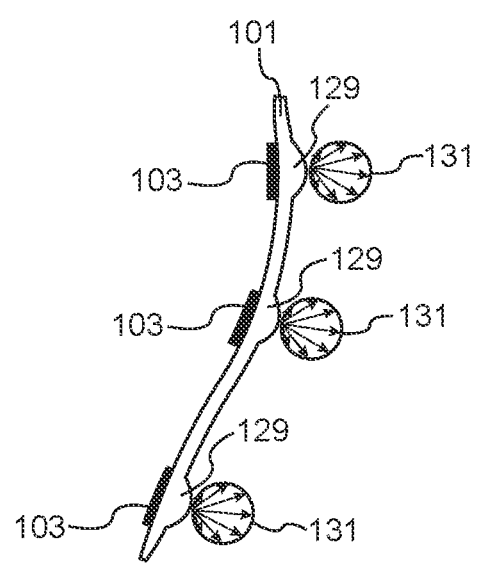

As described with regard to FIGS. 18 and 19, a method of producing some embodiments of an optoelectronic device comprises a step of providing an at least partially transparent intermediate layer 101, in particular a transparent foil, preferably in form of a planar strip as shown in FIG. 18.

The method further includes a step of providing a plurality of optoelectronic light sources 103 on the intermediate layer 101 or embedding the light sources 103 in the intermediate layer 101.

Furthermore, the method includes the step of generating, in particular by use of a deep-drawing process, a plurality of optical elements 129, such as micro-lenses, in the intermediate layer 103. The optical elements 129 are formed in such a way that they are aligned with the light sources 103. An optical element 129 can therefore shape a light beam emitted by an associated light source 103 and for example generate a collimated beam 131 or a beam with another defined emission characteristics.

An optoelectronic device obtained by the manufacturing method described with regard to FIGS. 18 and 19 comprises the at least partially transparent intermediate layer 101, the plurality of optoelectronic light sources 103 arranged on or embedded in the intermediate layer 101, and the plurality of optical elements 129. Each optical element 129 is aligned with one of the light sources 103, and the optical elements 129 are formed integrally with the intermediate layer 101 due to the manufacturing process.

FIGS. 20 to 22 illustrate a further method of manufacturing some embodiments of an optoelectronic device in accordance with the present invention. The method comprises a step of providing an at least partially transparent intermediate layer 101, in particular a transparent foil, in form of a planar strip as shown in FIG. 20. The method further includes a step of providing a plurality of optoelectronic light sources 103 on the intermediate layer 101 or embedding the light sources 103 in the intermediate layer 101. By use of for example a deep-drawing process, the intermediate layer 101 is arranged on a curved support surface (not shown). Thus, the intermediate layer 101 is also brought into a curved shape, as shown in FIG. 21.

Each light source 103 has a surface normal 133 which is perpendicular to a top surface of the respective light source 103. As illustrated in FIG. 21, bringing the intermediate layer 101 into the curved shape usually has the undesired effect that the surface normals 133 of the light sources 103 will not be parallel to each other.

As illustrated with regard to FIG. 22, the light sources 103 might be arranged on the planar intermediate layer 101 in such a way that the surface normals 133 of the light sources 103 will be parallel to each other after the intermediate layer 101 has been brought into the curved shape. Additionally or alternatively, the light sources 103 can be arranged such that their surface normals 133 are equally spaced from each other when the intermediate layer has the curved shape. The embodiment as shown in FIG. 22 provides as one advantage that a constant luminance can be obtained, in particular if the light sources are Lambert emitters.

Figure 23:
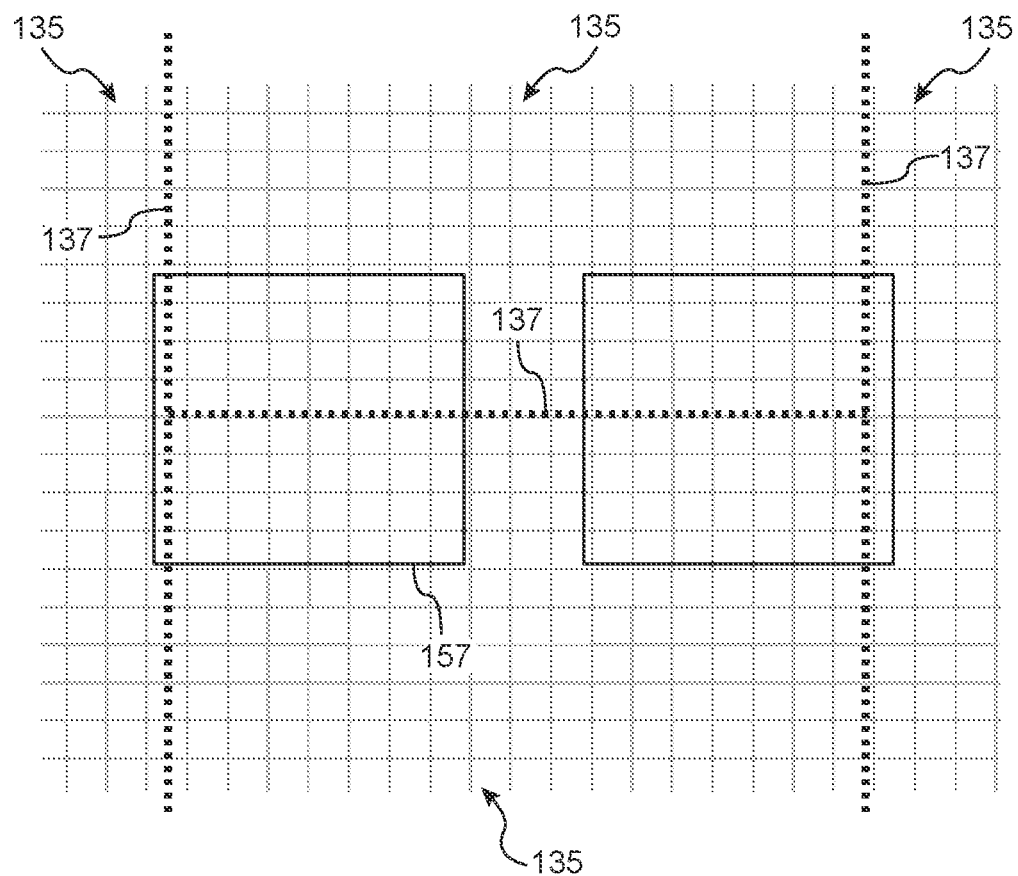
FIGS. 23 and 24 show examples of array-like structures used as electronic lines in some embodiments of an optoelectronic device in accordance with the present invention.
Figure 24:
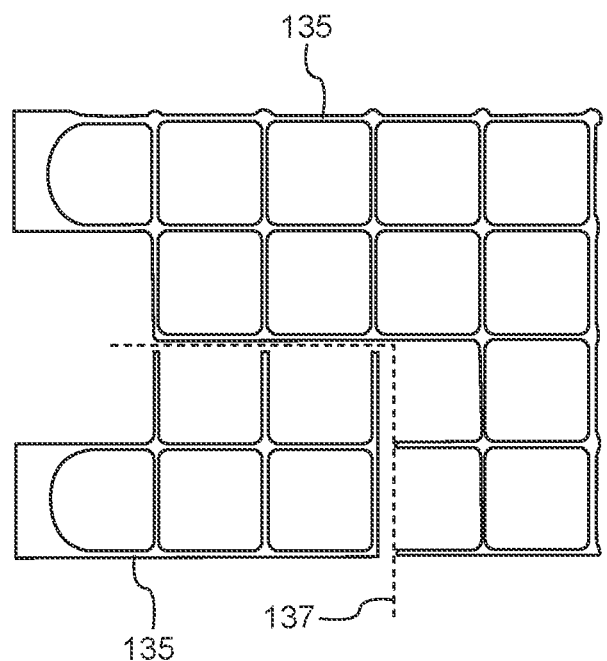

The modular arrangement of layers, as illustrated before with regard to FIG. 12, can further include one or more layers of electric lines, which are used to provide electricity to the light sources (see FIGS. 23 and 24). An electric layer can be formed by a lattice-like or array-like structure. The lattice-like or array-like structure can for example be designed like a miniaturized fly screen. The structure can comprise array-like or lattice-like segments 135, which are electrically and/or mechanically separated from each other as indicted by separation lines 137 in FIGS. 23 and 24. The separation can be made from a single piece structure for example by use of laser cutting.

FIG. 23 further shows exemplary footprints of contact pads, for example contact pad 157, of optoelectronic light sources. The use of such segments 135 of an array-like structure in an at least partially transparent optoelectronic device may help to obtain a homogenous appearance. Furthermore, the segments 135 can be provided in a ready-to-use state, so that, during the manufacture of an optoelectronic device, they can be directly arranged between other layers of the optoelectronic device.

Figure 25:
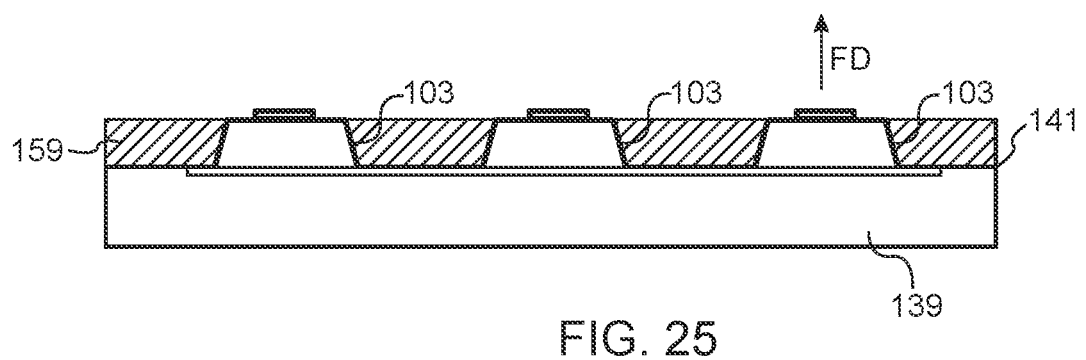
FIG. 25 is a cross-sectional side view of an exemplary embodiment of an optoelectronic device in accordance with the present invention.
Figure 26:
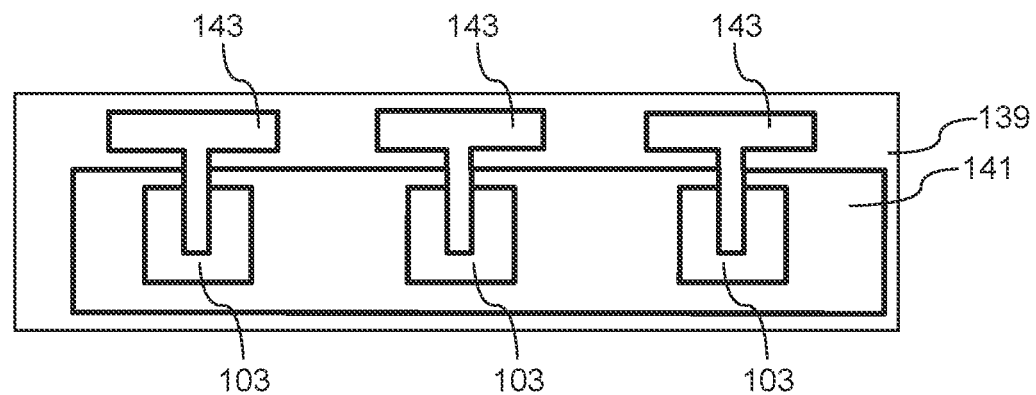
FIG. 26 is a top view of the device of FIG. 25.

The optoelectronic device of FIGS. 25 and 26 comprises a plurality of optoelectronic light sources 103 arranged on a surface of a non-transparent carrier layer 139, and a reflecting and electrically conducting material layer 141, in particular a metal layer, arranged on the surface of the carrier layer 139 in between the optoelectronic light sources 103 and the carrier layer 139.

As shown in FIG. 25, the optoelectronic light sources 103 can optionally be embedded in a layer 159. The layer 159 can form an upper planar surface with the optoelectronic light sources 103. The layer 159 can be a SOG layer. Herein, SOG can mean spin on glass. The layer 159 can include scattering particles that scatter light, which is emitted by the light sources 103. Each optoelectronic light source 103 has one electric contact, here a p-contact, which is located at a bottom side of the light source 103. The bottom side faces the reflecting and electrically conducting material layer 141. The electric contact at the bottom of each optoelectronic light source 103 contacts the reflecting and electrically conducting material layer 141. Thus, the material layer 141 serves as a contact layer for the p-contact of each optoelectronic light source 103. Furthermore, the material layer can act as a reflector and thus improve the radiation characteristic of the light sources 103 with regard to the forward direction FD, which is the direction that is facing away from the top surface of the material layer 141.

Each optoelectronic light source 103 has another electric contact, here an n-contact, which is located at a top side of the light source 103. The top side faces away from the reflecting and electrically conducting material layer 141. The electric contact at the top of each optoelectronic light source 103 is connected with an individual contact pad 143 that is arranged on the surface of the carrier layer 139 and separated from the reflecting and electrically conducting material layer 141. Due to the use of individual contact pads 143 for the light sources 103, each light source 103 can be controlled individually.

In the embodiment as shown in FIGS. 25 and 26, the light sources are μLEDs, but they can also be LEDs. The three light sources shown in FIGS. 25 and 26 form a RGB-pixel. Thus, one of the light source is configured to emit red light, one of the light sources is configured to emit green light, and one of the light sources is configured to emit blue light. The same can apply to the embodiments described in the following with regard to FIGS. 27 to 37.

Figure 27:
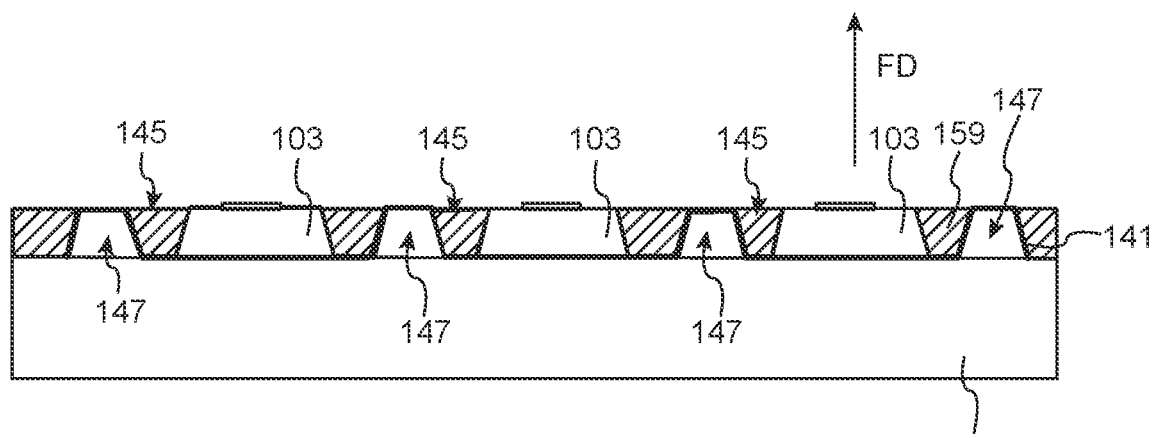
FIG. 27 is a cross-sectional side view of another exemplary embodiment of an optoelectronic device in accordance with the present invention.

As shown in FIG. 27, the surface of the carrier layer 139 can comprise a plurality of cavities 145. Each light source 103 is arranged in one of the cavities 145. The reflecting and electrically conducting material layer 141 covers, in particular completely, the bottom surface of the cavities 145, the sidewall surfaces of the cavities 145, and the top surfaces of bridging sections 147 between neighbouring cavities 145. The cavities 145 with their mirrored top surface of the carrier layer 139 may improve the radiation characteristics of the light sources 103 with regard to the forward direction FD. In particular, light emitted in a lateral direction is reflected upwardly towards the forward direction FD.

As shown in FIG. 27, the cavities 145 can optionally be filled with material to form a corresponding layer 159. The layer 159 can form a flat upper surface together with the optoelectronic light sources 103. The layer 159 can be a SOG layer. The layer 159 can include scattering particles that scatter light which is emitted by the light sources 103. The carrier layer 139 can be at least partially transparent, transparent or non-transparent.

Figure 28:
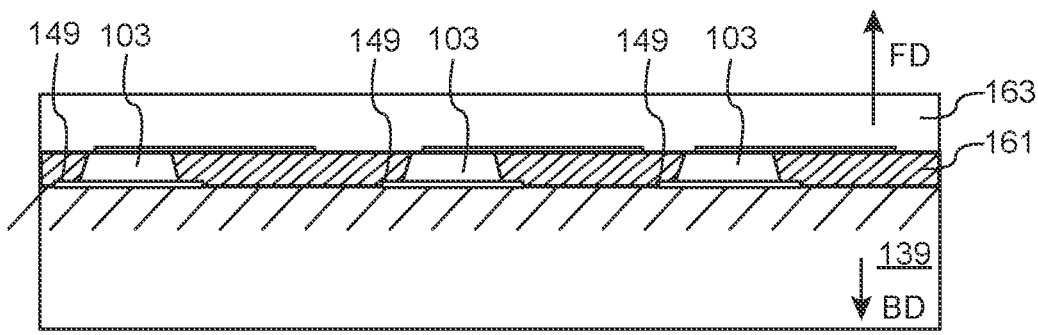
FIG. 28 is a cross-sectional side view of another exemplary embodiment of an optoelectronic device in accordance with the present invention.
Figure 29:
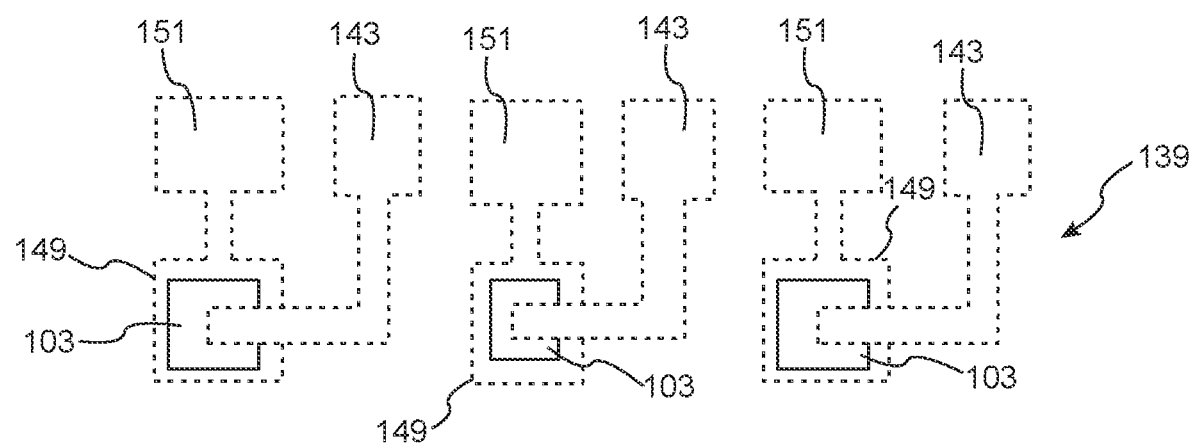
FIG. 29 is a top view of the device of FIG. 28.

The optoelectronic device as shown in FIGS. 28 and 29 comprises a plurality of optoelectronic light sources 103 arranged on the surface of an at least partially transparent carrier layer 139, and a plurality of reflecting and electrically conducting material layer elements 149, in particular metal layer elements. Each material layer element 149 is arranged on the surface of the carrier layer 139 and in between one of the optoelectronic light sources 103 and the carrier layer 139. The area of the top surface of the material layer element 149 is larger than the area of a bottom surface of the associated light source 103, and each light source 103 is centered on the associated material layer element 149. Each optoelectronic light source 103 has one electric contact, here a p-contact, which is located at the bottom side of the light source 103 such that it contacts the material layer element 149. Each material layer element 149 is further connected with a contact pad 151, here a p-contact pad. Each of the contact pads 151 may be on the same electrical potential.

Each optoelectronic light source 103 has another electric contact, here the n-contact, which is located at a top side of the light source 103. The electric contact at the top side of each optoelectronic light source 103 is connected with an individual contact pad 143 that is arranged on the surface of the carrier layer 139 and separated from the reflecting and electrically conducting material layer elements 149. The operation of each optoelectronic light source 103 can be controlled via the associated contact pad 143. An individual operation of the light sources 103 is therefore possible.

The cross-sectional dimensions of the light sources 103 and the electric structures 143, 149, 151 are small in comparison with the overall surface area of the optoelectronic device. Thus, if the layer structure of the device is at least partially transparent, the light sources 103 and the electric structures 143, 149, 151 do not or only to a small extent affect the transparency of the optoelectronic device. Furthermore, in the device of FIGS. 28 and 29 light emission in the forward direction FD and the backward direction BD is possible. Lateral emission is also accepted.

The light sources 103 can be embedded in a layer 161, which can form a flat upper surface together with the light sources 103. The layer 161 can for example be a SOG layer. Above the SOG layer 161 is arranged an optional further layer 163, which can be a scattering layer. The layer 163 can include scattering particles which can scatter light emitted by the light sources 103.

Figure 30:
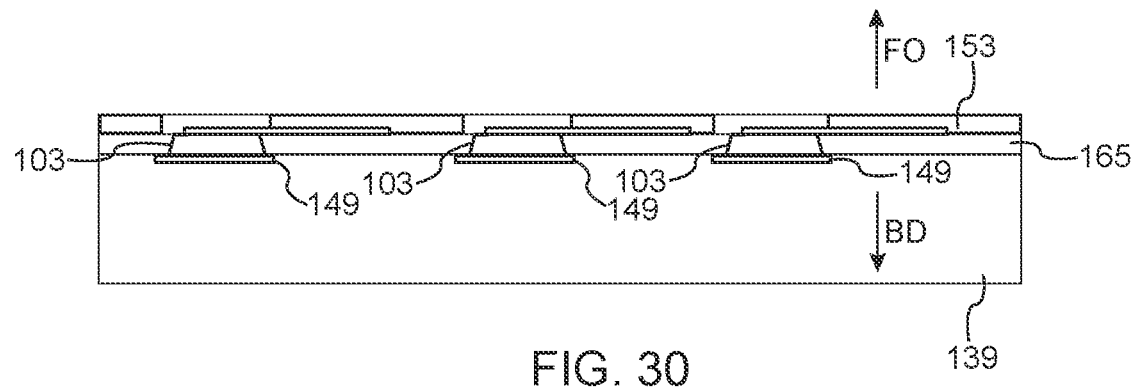
FIG. 30 is a cross-sectional side view of another exemplary embodiment of an optoelectronic device in accordance with the present invention.
Figure 31:
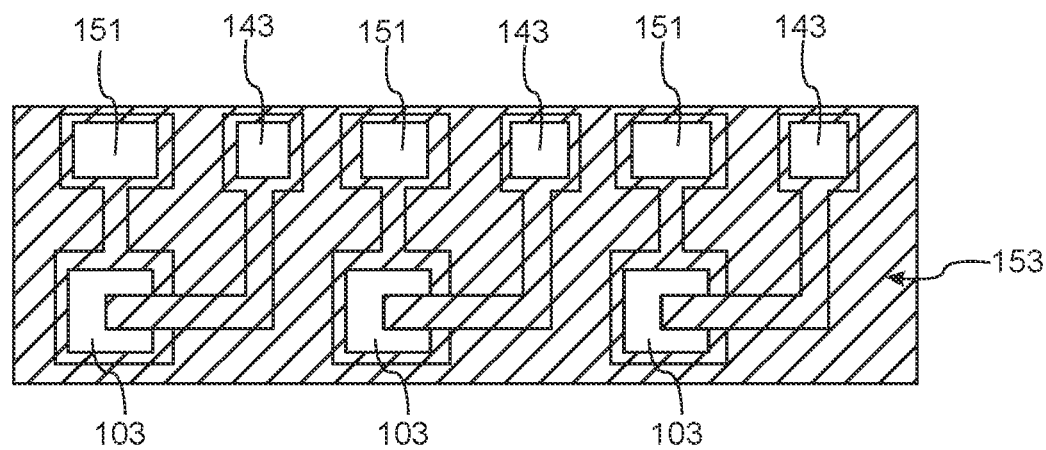
FIG. 31 is a top view of the device of FIG. 30.

The embodiment shown in FIGS. 30 and 31 is based on the previously described embodiment of FIGS. 28 and 29. However, a non-transparent layer 153, in particular a black or dark layer, is arranged in a layer above the plurality of optoelectronic light sources 103. The non-transparent layer 153 comprises apertures which are aligned with the top surfaces of the light sources 103, so that light emitted from the top surfaces of a light sources 103 can be radiated through the apertures. Optionally, the layer 153 can provide apertures that are aligned with the contact pads 143, 151 as shown in FIG. 31. In the device of FIGS. 30 and 31 light emission in the forward direction FD and the backward direction BD is possible. Lateral emission is also accepted.

As shown in FIG. 30, the light sources 103 can be embedded in a layer 165, which can form a flat upper surface together with the light sources 103. The layer 165 can for example be a SOG layer. The non-transparent layer 153 is arranged above the layer 165. The carrier layer 139 is preferably transparent.

Figure 32:
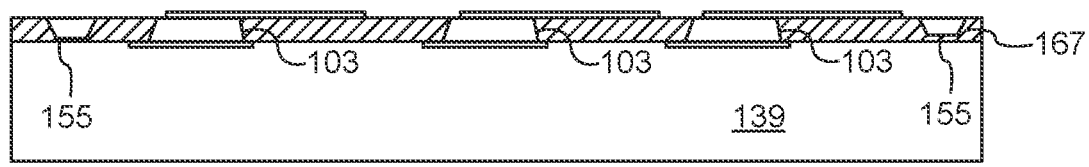
FIG. 32 is a cross-sectional side view of another exemplary embodiment of an optoelectronic device in accordance with the present invention.
Figure 33:
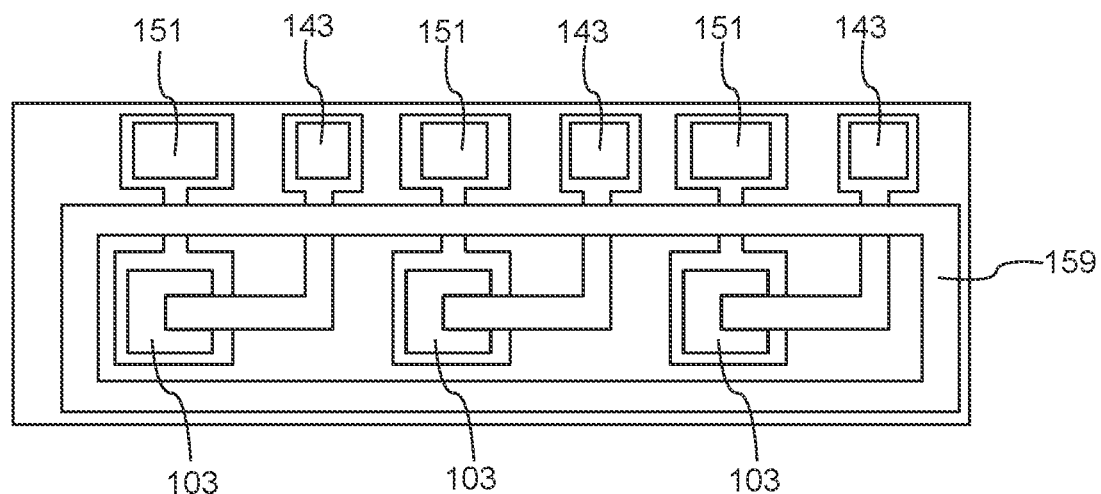
FIG. 33 is a top view of the device of FIG. 32.

The embodiment shown in FIGS. 32 and 33 is based on the embodiment of FIGS. 28 and 29. A light barrier 155, for example in form of a metalized dig, is arranged in the circumferential direction around each of the three light sources 103 that form a pixel. The light barrier 155 can provide passages for electric lines to connect the light sources 103 to the contact pads 143, 151.

As shown in FIG. 32, the light sources 103 can be embedded in a layer 167, which can form a flat upper surface together with the light sources 103. The layer 167 can for example be a SOG layer. The carrier layer 139 is preferably transparent.

Figure 34:
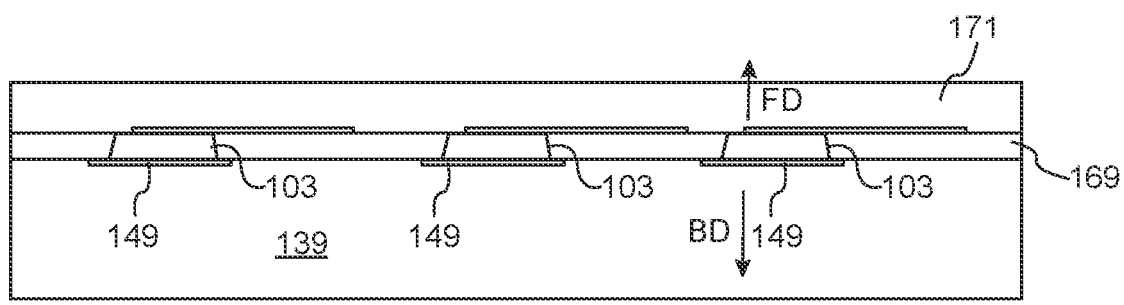
FIG. 34 is a cross-sectional side view of another exemplary embodiment of an optoelectronic device in accordance with the present invention.
Figure 35:
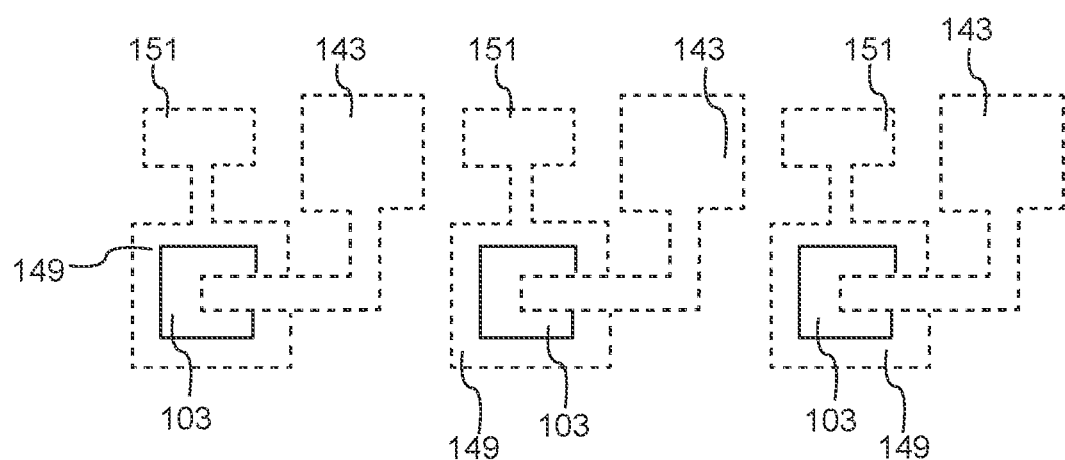
FIG. 35 is a top view of the device of FIG. 34.

The embodiment of FIGS. 34 and 35 is based on the embodiment of FIGS. 28 and 29. The embodiment of FIGS. 34 and 35 also comprises a transparent or an at least partially transparent carrier layer 139, so that the emission of light into the forward direction FD and the backward direction BD is possible. Light emission in the lateral direction is possible. However, the distance between neighbouring light sources 103 is such that light emitted in the lateral direction can be absorbed by absorber material that is arranged in the layer of the light sources 103.

As shown in FIG. 34, the light sources 103 can be embedded in a layer 169, which can form a flat upper surface together with the light sources 103. The layer 169 can for example be a SOG layer. A further layer 171 is arranged above the layer 169. The layer 171 can be a scattering layer and it can include scattering particles.

Figure 36:
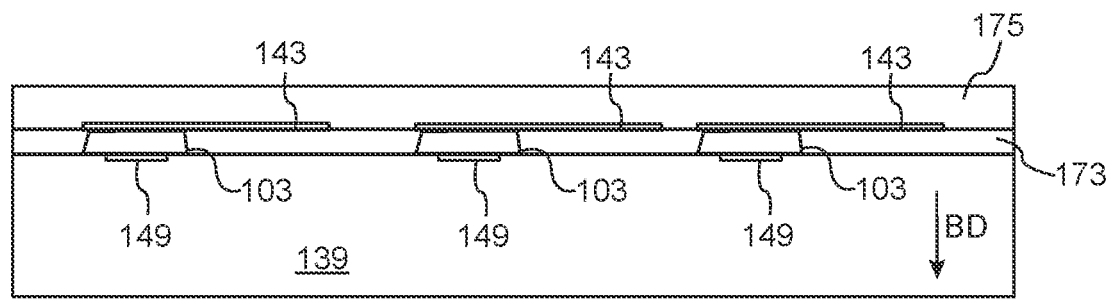
FIG. 36 is a cross-sectional side view of another exemplary embodiment of an optoelectronic device in accordance with the present invention.
Figure 37:
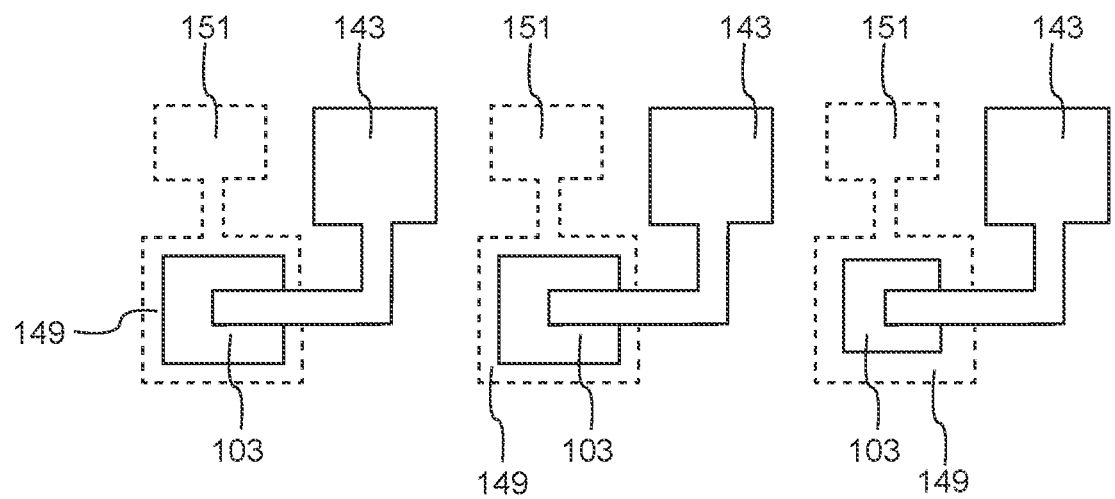
FIG. 37 is a top view of the device of FIG. 36, FIG. 38 a cross-sectional view of an optoelectronic device not according to the invention, FIG. 39 a cross-sectional view of a first variant of an optoelectronic device according to the invention, FIG. 40 a cross-sectional view of a second variant of an optoelectronic device according to the invention, FIG. 41 a cross-sectional view of a third variant of an optoelectronic device according to the invention, FIGS. 42 to 57 cross-sectional views of different variants of optoelectronic devices according to the invention, FIGS. 58 to 61 cross-sectional diagrams of further, different variants of optoelectronic devices according to the invention, in which in addition a section of the rear layer can be seen, and FIGS. 62 to 65 cross-sectional diagrams of further, different variants of optoelectronic devices according to the invention, in which in addition a section of the front layer can be seen.

The embodiment of FIGS. 36 and 37 is based on the embodiment of FIGS. 28 and 29. The embodiment of FIGS. 36 and 37 is designed for light emission into the backward direction BD by decreasing the surface area of the p-contact pads 151 and increasing the surface area of the n-contact pads 143. The ration of the surface areas are set such as to optimize the emission into the backward direction BD.

The surface area of the p-contact pads 151 and the surface area of the n-contact pads 143 can also be at least approximately of equal size. Thus, light emission into the forward direction FD and the backward direction BD can be at least approximately the same, in particular if stray light obtained from stray centers in the layer of the light sources 103 is emitted in the forward and backward direction in approximately the same amount.

The carrier layer 139 can be transparent or partially transparent or semi-transparent. The same can apply to the cover layer 175, which can be a scattering layer and include scattering particles. As shown in FIG. 36, the light sources 103 can be embedded in a further layer 173, which can form a flat upper surface together with the light sources 103 and which can be arranged below the cover layer 175.

All light sources 103 can be LEDs or μLEDs. The height of a light source 103, in particular in form of an μLED-chip, can be for example 5 μm.

Figure 38:
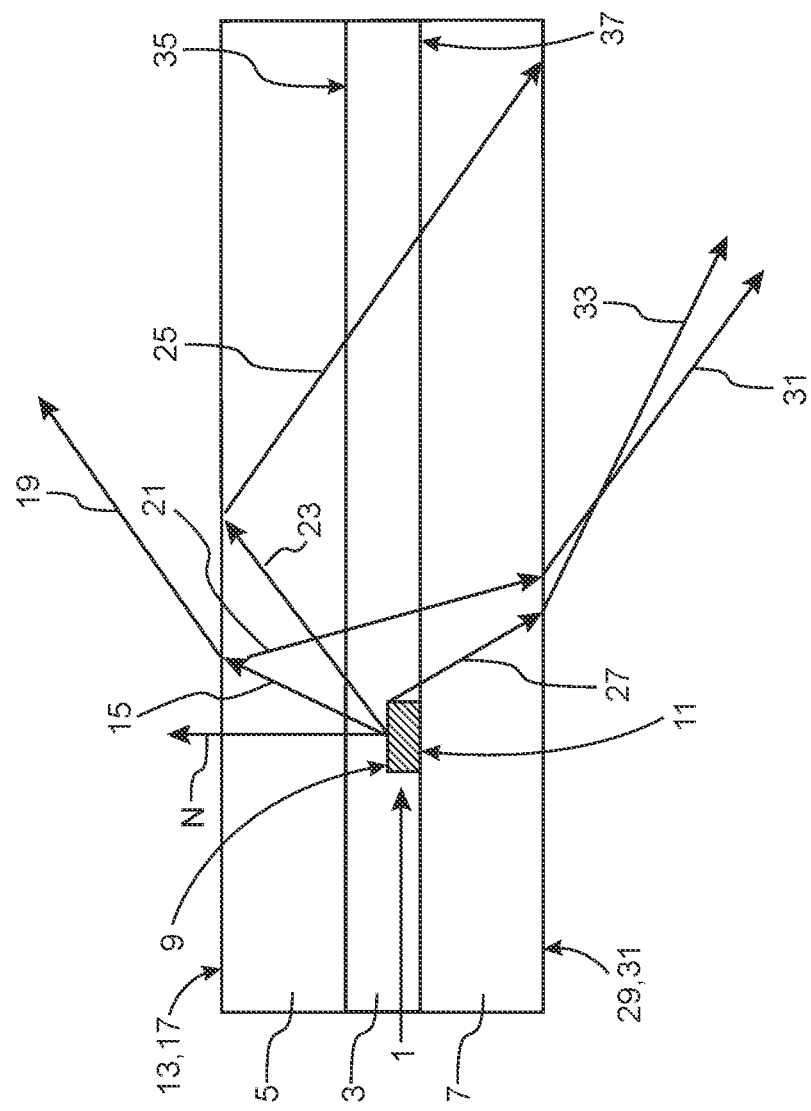

The optoelectronic device not according to the invention shown in FIG. 38 in a cross-sectional view comprises an optoelectronic light source 1 arranged in an intermediate layer 3, for example an LED, a μLED, an LED chip or a μLED chip, an at least partially transparent front layer 5, for example made of glass, and an at least partially transparent rear layer 7, which is likewise made of glass, for example. The intermediate layer 3 is also designed to be at least partially transparent, so that the device is overall at least partially transparent.

The light source 1 is arranged between the front layer 5 and the rear layer 7. In this case, the light source 1 can be surrounded by a filler material, so that the intermediate layer 3 is at least approximately overall planar. A front side 9 of the light source 1 faces the front layer 5, and a rear side 11 of the light source 1 faces the rear layer 7. The rear side 11 can be arranged, for example, on the facing surface of the rear layer 7.

It is desired for the radiation to be directed forward as in the direction of a normal N on the front side 9 of the light source 1. The normal N also forms a normal on the front side 13 of the front layer 5, which is provided as a viewing area for an observer of the device. However, the light source 1 normally emits light into a spatial region having emission directions which, among other things, are also strongly inclined with respect to the normal N. For example, light beams 15 can be emitted from the light source 1, which strike on the interface between the front side 13 and the surroundings at a relatively small angle of incidence. The angle of incidence here refers to the angle between the propagation direction of the light beam 15 and the normal N.

The vast majority of the light beam 15 will exit through the interface 17 into the surroundings according to the law of refraction for light, as indicated by the light beam 19. A small part of the light (about 4% of the intensity at the transition of glass with an optical refractive index n=1.5 to air with n=1) is reflected according to the reflection law, as indicated by the light beam 21. Such a reflection is also referred to herein as Fresnel reflection, since a quantitative observation can take place via the Fresnel formulae known per se.

A light beam 23 incident on the interface 17 at an angle equal to or more than the critical angle for total reflection at the transition from the optically denser medium of the front layer (e.g., glass with n=1.5) into the surroundings (air with approximately n=1) is completely reflected, as indicated by the light beam 25.

In particular when the light source 1 is a volume emitter, light beams, compare light beam 27, can also be emitted directly in the direction of a rear side 29 of the device which is formed by the interface 31 between the rear layer 7 and the surroundings. Like the light beam 21 the light beam 27 can also pass through the interface 31 so that a respective light beam 31, 33 emerges at the rear side 29. Such light emissions from the rear side 29 are undesirable. Additional Fresnel reflections at the interface 31 are not shown.

Back reflections can occur not only at the adjacent interfaces 17, 31 but also at the inner interface 35, 37. The inner interface 35 lies between the intermediate layer 3 and the front layer 5. The further, second inner interface 37 lies between the intermediate layer 3 and the rear layer 7. Back reflections at the inner interfaces 35, 37 may result, for example, from lamination. The intermediate layer 3 is essentially formed by a laminate in order to connect the front layer 5 and the rear layer 7 to at least one light source 1 lying therebetween. In addition to the laminate, adhesive and/or filler material may also be present in the intermediate layer 3. Such back reflections can also lead to undesired light emissions at the front side 13. These can lead to irritations, blurring or ghost images, which are also undesirable.

Figure 39:
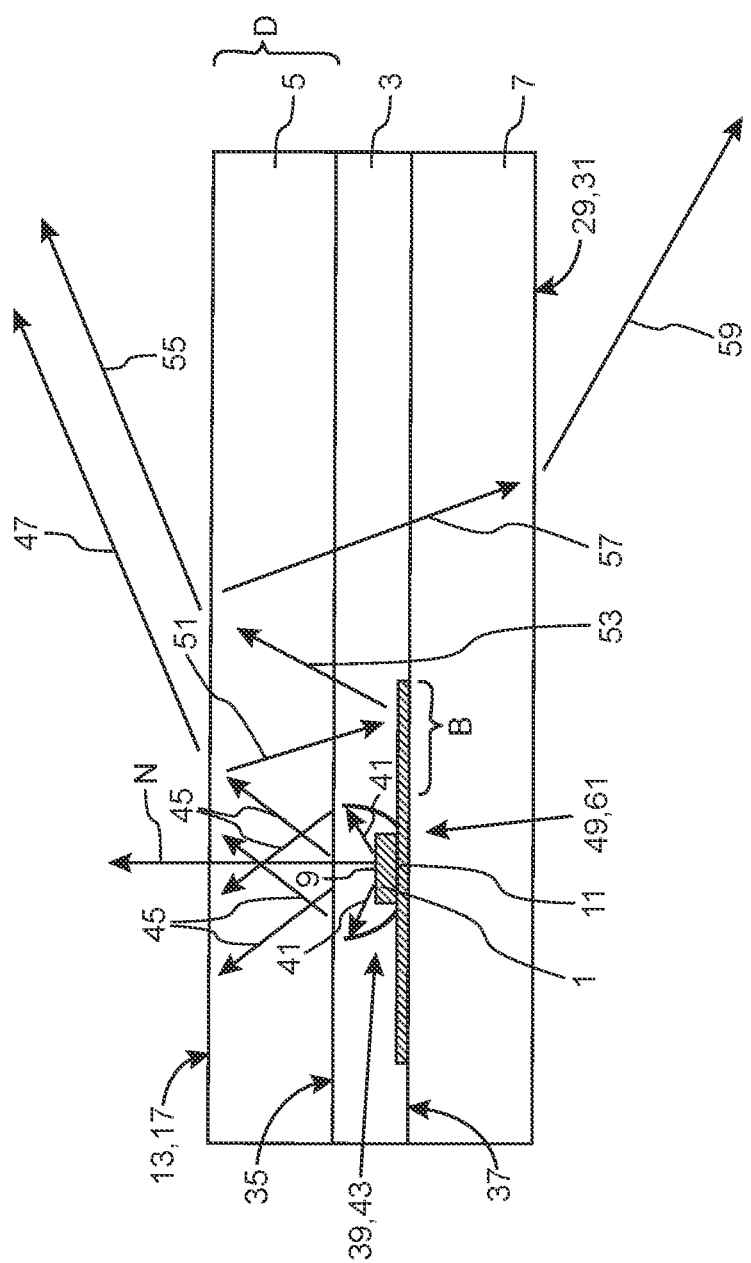

The variant of an optoelectronic device according to the invention shown in FIG. 39 differs from the device of FIG. 38 in particular in that it has a limiting device
39, which limits the spatial region, in which the light source 1 emits light to a defined spatial region, cf. the light beams 41. In particular, the limiting device 39 has a reflector or absorber device 43, which is designed as an at least approximately parabolically shaped, reflecting or absorbing band and extends completely around the normal N around the light source 1 or its emission region in a circumferential direction.

Depending on the design, the reflector or absorber device 43 has either a reflecting or absorbing surface and is designed and arranged to absorb or reflect light that the light source 1 is radiating outside a defined spatial region. The reflection takes place in particular in such a way that the reflected light propagates only in the defined spatial region, which in the variant of FIG. 39 lies between the arrows 41 and the normal N. This is indicated in FIG. 39 by the light beams 45, which can emerge from the front side 13 as visible pixels, cf. the light beam 47.

However, the limiting device 39 absorbs or reflects light beams 41, which would impinge at an angle on the fixed boundary 17, which—measured from the normal N—is equal to or more than a critical angle of the total reflection at this boundary 17. Totally reflected light beams 25, as shown in FIG. 38, which can cause further reflections at other interfaces, can therefore be avoided by using the limiting device 39.

In addition, the device according to FIG. 39 comprises a diaphragm 49 designed as a disk 61, which is designed, depending on the design, to either reflect or absorb at least a portion of the light, cf. light beam 51, which is reflected back at an interface 17, 35, in particular the interface 17 between the front side 13 and the surroundings. In the illustrated case, the diaphragm 49 reflects, so that light beam 51 is reflected in the light beam 53, which emerges as a light beam 55 from the front side 13. The small back-reflected portion, cf. light beam 57, can lead to the light beam 59 exiting from the back 29. However, its intensity is approximately 0.16 percent of the original intensity of light beam 45 when glass with n=1.5 is used as front and rear layer 5, 7 and because of two reflections that occurred at interface 17. This is thus in an acceptable, marginal range.

In order to absorb or reflect in particular Fresnel back reflections at the outer interface 17, the diaphragm 49 is of circular design and has a protrusion relative to the light source 1 and the limiting device 39. Viewed in a plan view of the front side 13, the light source 1 and the limiting device 39 cover a first part of the diaphragm 49, while a second part of the diaphragm, as viewed in the radial direction, is not covered. This second part has at least approximately the cross-sectional shape of a ring. The protrusion corresponds to the width B of the second part in the radial direction. Preferably, the width B is equal to or more than 2*D*0.84 or 2*D, wherein D is the thickness of the front layer 5. In this case, the thickness D along the normal N is measured and the radial direction is perpendicular to the normal N. The factor of 0.84 corresponds approximately to the tangent of 40°, where 40° approximately corresponds to the critical angle of total reflection at the transition from glass with n=1.5 to air with n=1.

Figure 40:
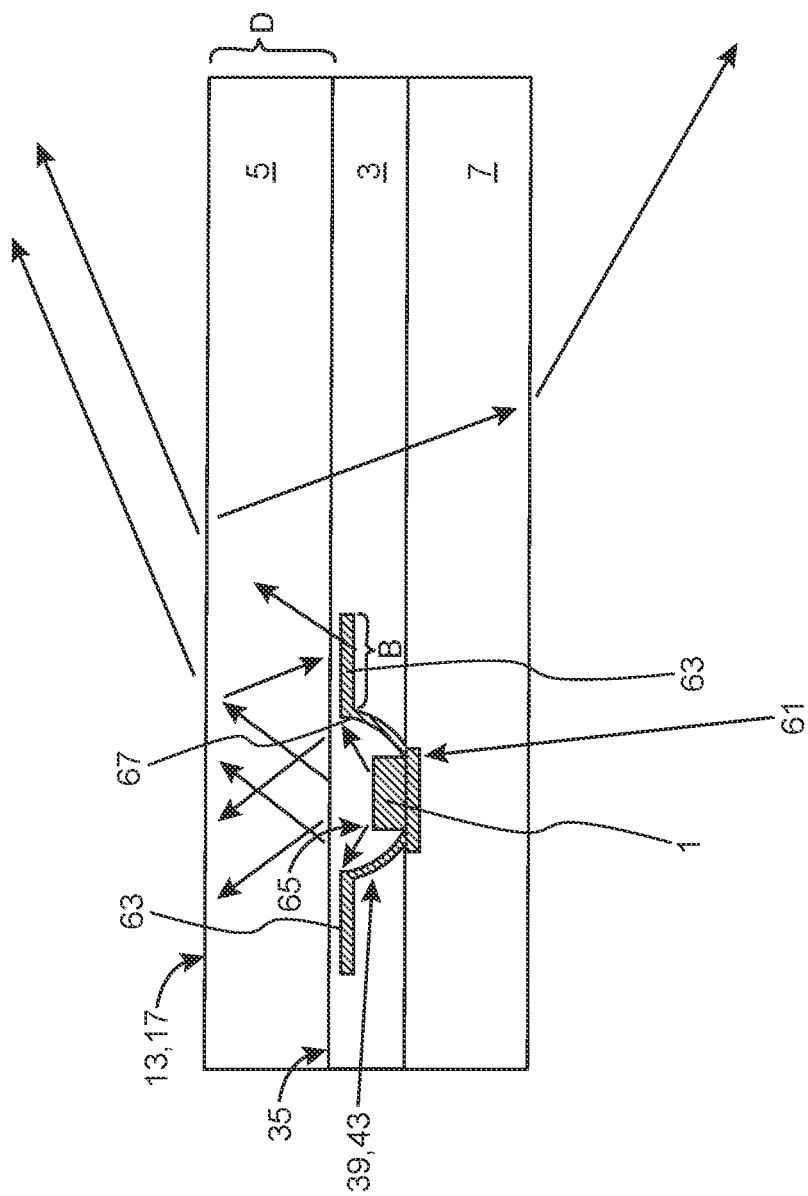

The structure of the device of FIG. 40 corresponds largely to the structure of FIG. 39. However, the diaphragm is designed in two parts. It comprises, for example, a circular disk 61, which is arranged on the rear layer 7 and on which the light source 1 is arranged in a centered manner. The disk 61 can be of reflective or absorbing design. Since the disk 61 is located underneath the light source 1 it can also not be configured functionally as a reflector or as an absorber, but rather serve only as an electrical contact point for an electrical contact of the light source 1. In this case, the disk 61 can also not be regarded as an element of the diaphragm, since it does not fulfil a reflector or absorber function.

Moreover, the diaphragm comprises a circular perforated disk or annular disk 63, the central recess 65 of which surrounds the reflector or absorber device 43. The perforated disk 63 can in turn be of reflective or absorbing design. The inner edge 67 of the perforated disk 63 contacts the end of the reflector or absorber device 43 that is remote from the light source 1. The perforated disk 63 is thus located in the intermediate layer 3 above the light source 1 and closer to the interfaces 17, 35 lying in front of the light source 1. As a result, back reflections from these interfaces can be absorbed or reflected in an improved manner depending on the design of the perforated disk 63. If the disk 61 serves only as an electrical contact, then only the perforated disk 63 can be regarded as a diaphragm element.

Viewed in the radial direction, the perforated disk 63 can preferably have a width B, which is equal to or more than 2*D*0.84 or than 2*D, wherein D is the thickness of the front layer 5.

Figure 41:
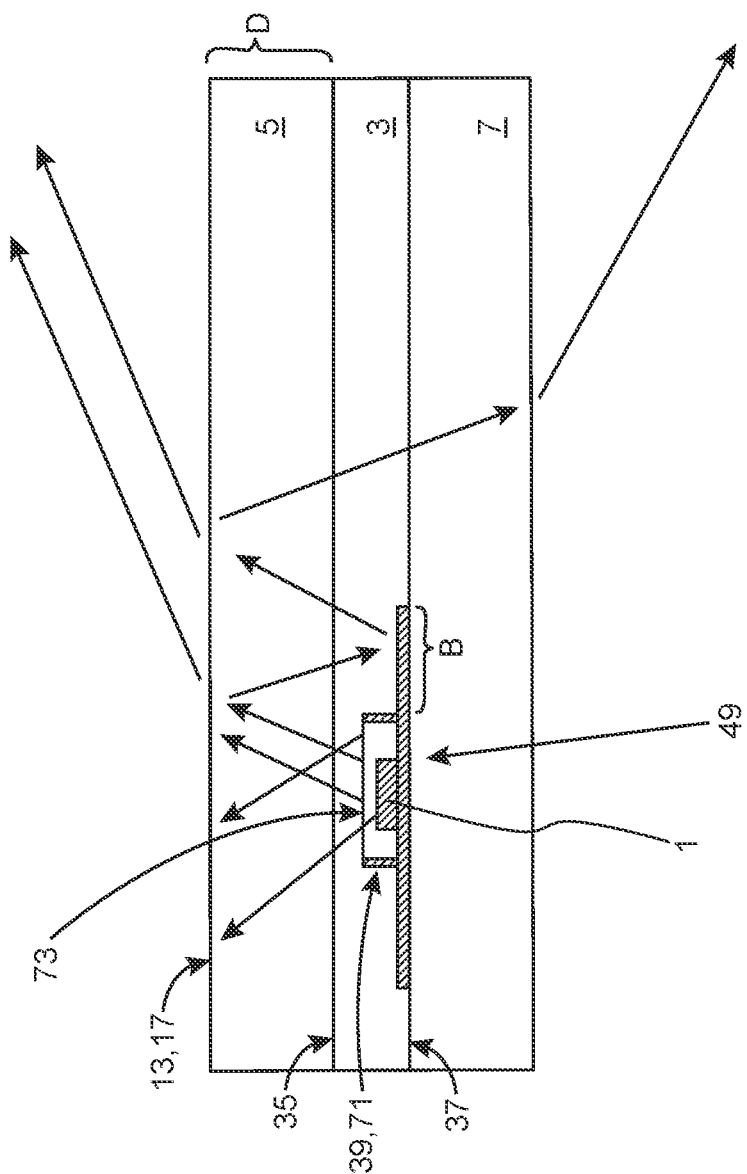

The device of FIG. 41 differs from the device of FIG. 39 in particular by the design of the limiting device 39, which occupies a volume region 71 around the light source 1. A low-refractive material, for example air, may be contained in the volume region 71. Thus, no total reflections occur at the interface 73 between the volume region 71 and the surrounding medium of the intermediate layer 3, which may have a refractive index of, for example, 1.5.

However, the beam propagating in the surrounding medium of the intermediate layer 3 is refracted towards the normal N due to the higher refractive index of the medium. The spatial region of the emission is thus narrowed. In combination with a clever choice of the height (relative to the direction of the normal N) and the diameter of the volume region (relative to a radial direction transverse to the normal), it can be achieved that no light beam leaves the volume region 71 which impinges on the boundary surface 17 at the critical angle of total reflection or at an even larger angle of incidence. Total reflections at the outer interface 17 can thus be avoided.

Preferably, the protrusion of the diaphragm 49 again has a width B equal to or more than 2*D*0.84 or 2*D, wherein D is the thickness of the front layer 5.

Compared to the device of FIG. 38, the variants shown in FIGS. 39 to 41 have improved directionality with regard to the radiation forward. As explained, back and/or total reflections can be prevented or avoided. Therefore, the intensity of unwanted beams exiting the front side 13 or the rear side 29 can be at least reduced. Undesired effects, such as irritation, ghost images or blurring, are therefore reduced or do not occur.

Figure 42:
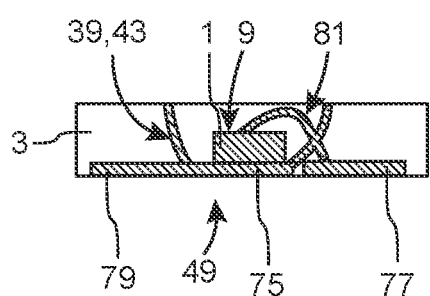

The device shown in part in FIG. 42 is based on the variant of FIG. 39. However, the diaphragm 49 is divided. An intermediate first region 75 functions as an electrical contact point for an electrical contact on the underside of the light source 1. In this case, the first region 75 can also have no reflector or absorber properties, that is to say it can serve as a "classic" electrical contact.

A second region 77, radially outermost with respect to the first region 75, may be designed as a reflector or absorber, and the second region 77 may be connected to an electrical contact on the front side 9 of the light source 1 by means of a bonding wire 81. The second region 77 can thus fulfil a dual function and therefore act both as an electrical contact and as a light reflector or light absorber.

A further, third region 79 can function as a light reflector or light absorber. The diaphragm 49 as a whole may have a circular cross section. The second and third regions 77, 79 may each have an annular segment shaped cross section, wherein the three regions may be electrically separated from one another. Other cross-sectional shapes are also possible.

The bonding wire 81 can be guided through a slit provided in the reflector or absorber device 43.

Figure 43:
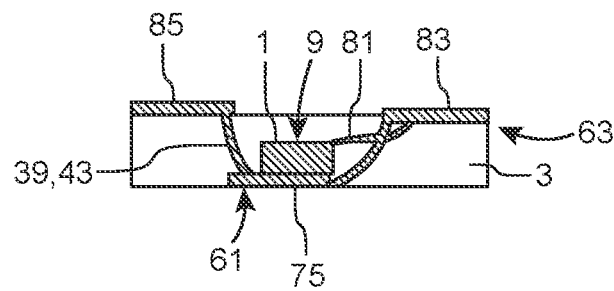

The variant of FIG. 43 is based on the variant of FIG. 40. The perforated disk 63 is of a two-part design, wherein a first perforated disk segment 83 is not only designed to be absorbing or reflective, but can also serve as an electrical contact point for the electrical contact point of the light source 1 located on the front side 9. Bonding wire 81 connects the two contact points.

A further, second perforated disk segment 85 may be designed to be absorbing or reflective, but not fulfil a function as a contact point. The two perforated disk segments 83, 85 are electrically separated from one another.

Figure 44:
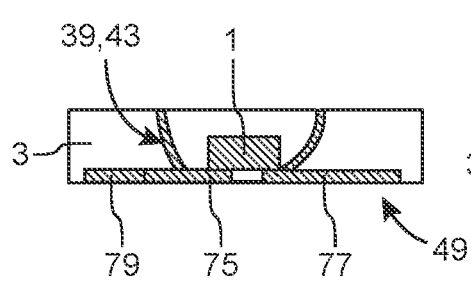

The variant of FIG. 44 is based on the variant of FIG. 39. The light source 1 is a so-called flip chip, in which both electrical contact points are located on the underside. An intermediate first region 75 and a radially outer second region 77 can fulfil a dual function and serve both as a reflector or absorber and as electrical contact points for a respective contact point of the flip chip.

A further, third region 79 can function only as a light reflector or light absorber, but not as an electrical contact. The three regions 75, 77 and 79 together may have a circular cross section, wherein the cross-sectional shape of the individual regions may be adapted, for example, to the geometry and arrangement of the contact points on the flip chip side.

Figure 45:
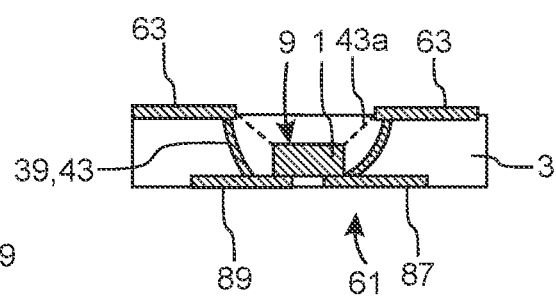

The variant of FIG. 45 is based on the variant of FIG. 39. The disk 61 is of two-part design. A first sub-disk 87 and a second sub-disk 89 are electrically isolated from each other. Each sub-disk 87, 89 serves as an electrical contact point for a respective contact point on the underside of the light source 1 embodied as a flip chip. The two sub-disks 87, 89 can optionally also be designed to be reflective or absorptive.

The variants shown in FIGS. 42 to 46 are particularly suitable for use in combination with a light source 1 which is designed as a volume emitter. Here, light exits not only at the front side 9 but also at the lateral outer sides. The variants of FIGS. 42 to 46 can also be used in combination with a light source 1, which is designed as a surface emitter. Here, light exits only from the front side 9. When such surface emitters are used, the reflector or absorber device 43a can also be arranged on the front side 9 and be guided away from the latter outward and upward, as is shown by way of example in FIG. 45 by means of dashed lines.

Figure 46:
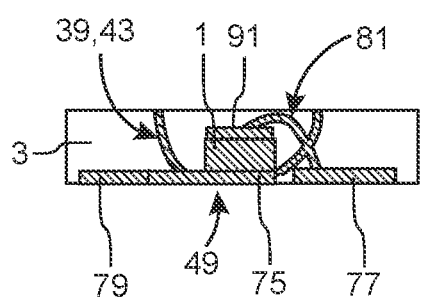

The variant of FIG. 46 is based on the variant of FIG. 42. An optical device 91 for improving the forward directionality is arranged on the front side 9 of the light source 1. The optical device 91 can be, for example, a photonic crystal structure or a Bragg mirror.

Figure 47:
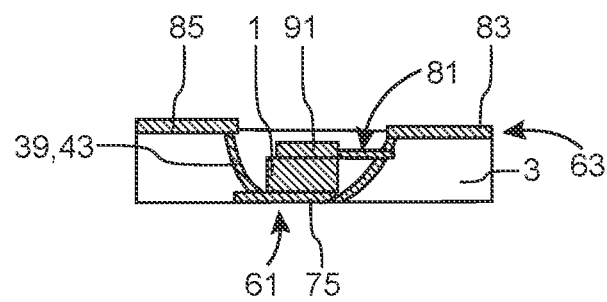
Figure 48:
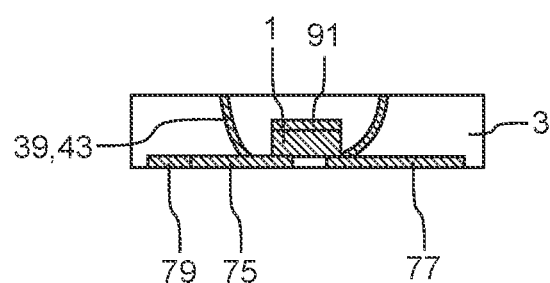
Figure 49:
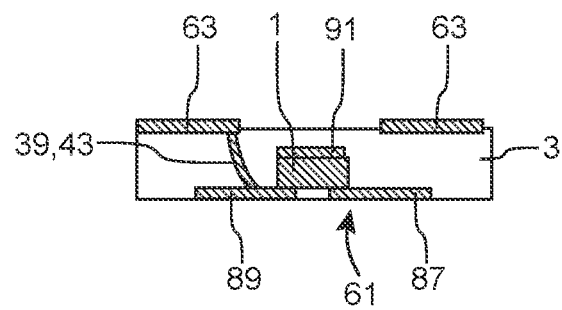

The variant of FIG. 47 is based on the variant of FIG. 43. The variant of FIG. 48 is based on the variant of FIG. 44. The variant of FIG. 49 is based on the variant of FIG. 45. In the variants of FIGS. 47 to 49—as in the variant of FIG. 46—a respective optical device 91 for improving the forward directionality is arranged on the front side 9 of the light source 1.

Figure 50:
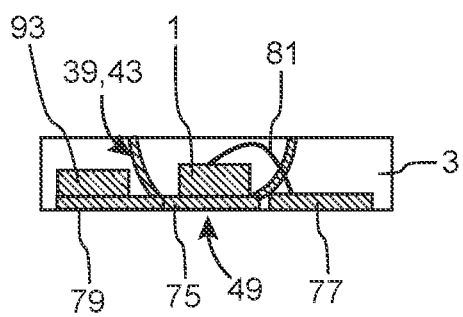

The variant of FIG. 50 is based on the variant of FIG. 42. In this case, an electrical or electronic driver device 93 is arranged, preferably with an integrated circuit, for controlling the light source 1 on the diaphragm 49, in particular on the third region 79.

Figure 51:
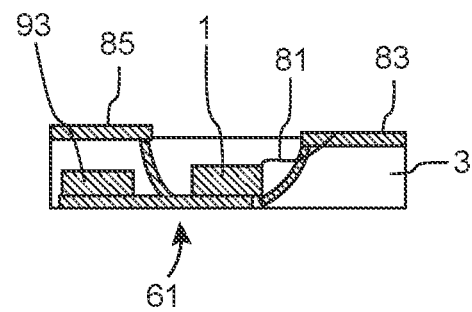
Figure 52:
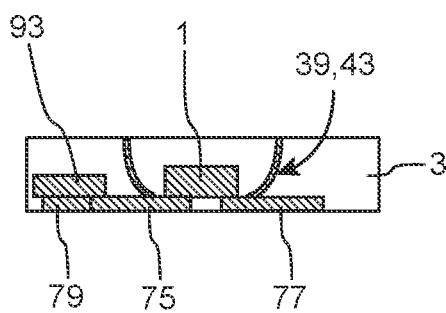
Figure 53:
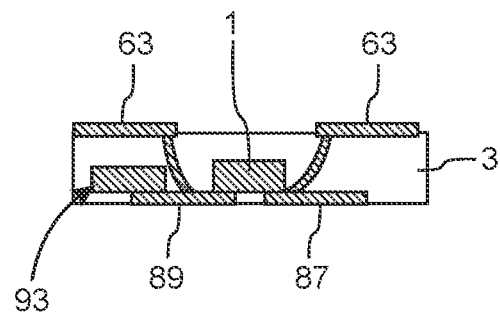

The variant of FIG. 51 is based on the variant of FIG. 43. The variant of FIG. 52 is based on the variant of FIG. 44. The variant of FIG. 53 is based on the variant of FIG. 45. In the variants of FIGS. 51 to 53, as in the variant of FIG. 50, an electrical or electronic driver device 93 is arranged. In this case, as FIG. 51 shows, the disk 61 underneath the light source 1 may be enlarged in diameter in order to serve as a carrier for the driver device 93.

In FIG. 52, the driver device 93 can rest on the second and third regions 77, 79.

The driver device 93 can rest partially on the second sub-disk 89 as shown in FIG. 53. The respective driver circuit 93 may include an absorbing or reflective enclosure (not shown).

The variant of FIG. 54 is based on the variant of FIG. 42. The driver device 93 is arranged underneath the light source 1. The diaphragm 49 can in turn be divided so that a partial region can be contacted by the bonding wire 81.

The variant of FIG. 55 is based on the variant of FIG. 43. Here, the driver device 93 replaces the disk 61 underneath the light source 1.

The variant of FIG. 56 is based on the variant of FIG. 44. The light source 1 designed as a flip chip rests on the driver device 93, which in turn may rest on the diaphragm 49. The diaphragm 49 can be designed as a single-part or a multiple-part component.

The variant of FIG. 57 is based on the variant of FIG. 45. The light source 1 designed as a flip chip rests on the driver device 93, which in turn may rest on the disk 61. The disk 61 can optionally be subdivided into two sub-disks (cf. sub-disks 87, 89 in FIG. 45).

The variants shown in FIGS. 42 to 57 can be planarized so that they form an intermediate layer (cf. intermediate layer 3) and are bonded on both sides to the front and rear layers 5, 7 for example with laminate material, adhesive, silicone, epoxy, polyimide. In this case, a contacting with the rear layer 7 or with the front layer 5 can take place first. The intermediate layer 3 is subsequently planarized and then the still missing front or rear layer is applied.

In modifications of the variants of FIGS. 54 to 57, the driver device 93 can be accommodated in the rear layer 7. In this case, the driver device 93 can be located behind the light source 1 in relation to a top view from the front side 13. As a result, the transparency of the device can be improved since the already small cross-sections of the opaque light source 1 and the opaque driver device 93 overlap.

Also, one or more electrical wiring layers may be accommodated in the rear layer 7 (not shown).

Figure 58:
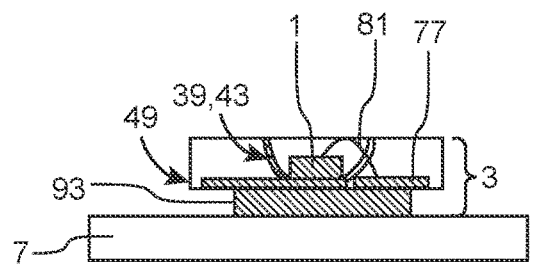
Figure 59:
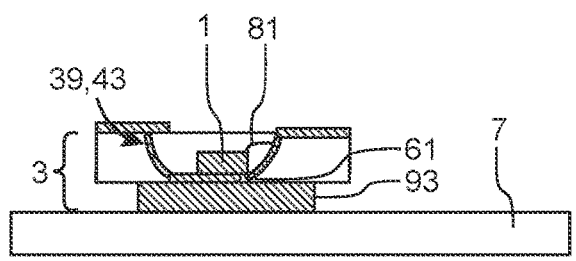
Figure 60:
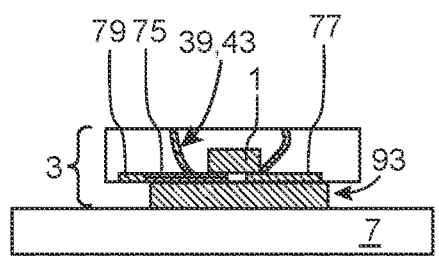

The variant of FIG. 58 is based on the variant of FIG. 42. The variant of FIG. 59 is based on the variant of FIG. 43. The variant of FIG. 60 is based on the variant of FIG. 44.

Figure 61:
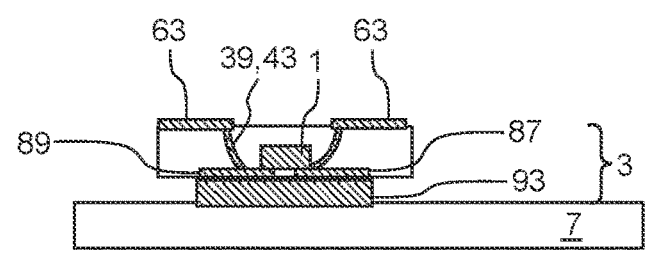

The variant of FIG. 61 is based on the variant of FIG. 45. However, in each variant of FIGS. 58 to 61, a driver device 93, which rests on the rear layer 7, is arranged underneath the respective diaphragm 49 or disk 61.

The driver device 93 forms a part of the intermediate layer 3. After attachment to the rear layer 7 and performed planarization, for example by introduction of filler material, the front layer 5 can be attached. The front layer 5 can be attached, for example, by means of laminate material, adhesive, silicone, epoxy or polyimide.

The variants shown in FIGS. 42 to 61 can also be regarded as structural elements (without the rear layer 7 in the variants of FIGS. 58 to 61). In this case, a structural element comprises a light source 1 with an associated limiting device and/or an associated diaphragm. A plurality of such structural elements can be arranged, in particular array-like, between the front and rear layers 5, 7. Free spaces in the intermediate layer 3 can be filled with filling material, for example, so that the intermediate layer 3 can be formed as a planar planarized layer. In this way, for example, transparent displays with light sources 1 arranged in an array-like manner can be formed. In doing so, each light source 1 can form a pixel, for example.

Figure 62:
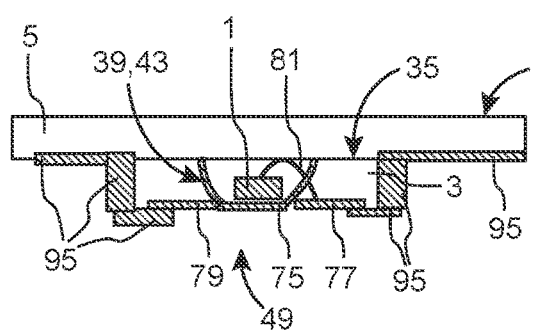
Figure 63:
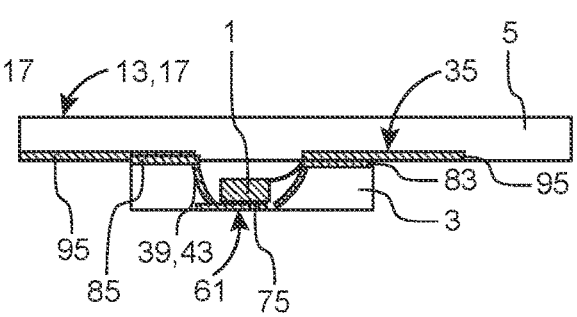
Figure 64:
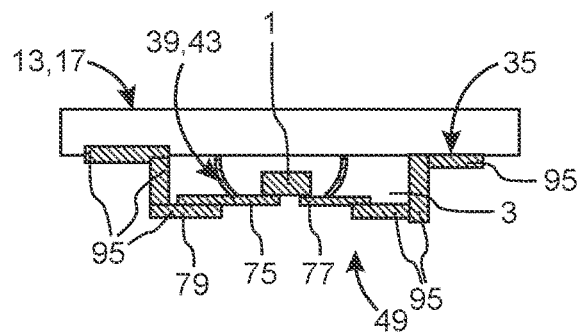
Figure 65:
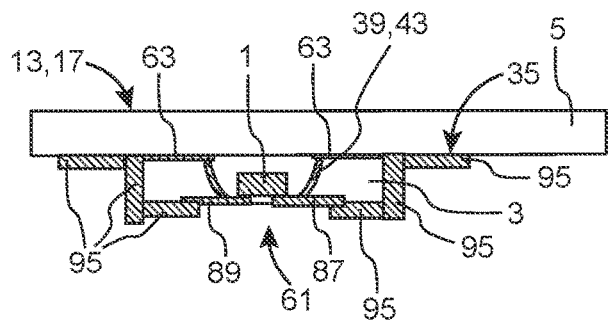

The variant of FIG. 62 is based on the variant of FIG. 42. The variant of FIG. 63 is based on the variant of FIG. 43. The variant of FIG. 64 is based on the variant of FIG. 44. The variant of FIG. 65 is based on the variant of FIG. 45. In the variants of FIGS. 62 to 65, during their manufacture, the respective structural elements are first attached to the front layer 5 as shown in FIGS. 42 to 45, which may be one or more layers of glass panes.

In order to form the complete intermediate layer 3, remaining free spaces can be filled with filling material, for example, so that a planarized intermediate layer 3 is present before the lower layer 7, which is not shown in FIGS. 62 to 65, is attacked. Bonding can take place, for example, with laminate material, adhesive, silicone, epoxy or polyimide.

For fastening the structural elements to the front layer 5, these can be enclosed by a plurality of absorbent blocks 95, which are cuboid, for example. The blocks 95 can surround the respective structural element on its underside and on the lateral edges. The blocks can also be arranged at the interface 35 to the front pane 5, although the defined spatial region, in which light is to emerge from the structure 3, is not covered. By means of the blocks 95, the respective structure can be connected to the front layer 5 in a simple and cost-effective manner. Moreover, the blocks 95 can prevent or reduce undesired optical interaction between adjacent light sources.

As already explained above, the variants shown in each case show only one light source 1 with associated limiting device and/or diaphragm. These can be regarded as a structural element. A plurality of such structural elements with a respective light source 1 can be provided in the respective intermediate layer 3 which can be arranged, for example, in an array-like fashion. Each light source 1 can be regarded as a pixel of the array-like arrangement.

Each light source 1 can also emit light of one of the colours red, green or blue. In each case, 3 light sources with different colours can form a pixel. An RGB display can thus be formed. Each light source 1 of one colour preferably has an associated limiting device and/or an associated diaphragm.

The front and rear layers 5, 7 are preferably glass, which can be designed in one or more layers.

Figure 66:
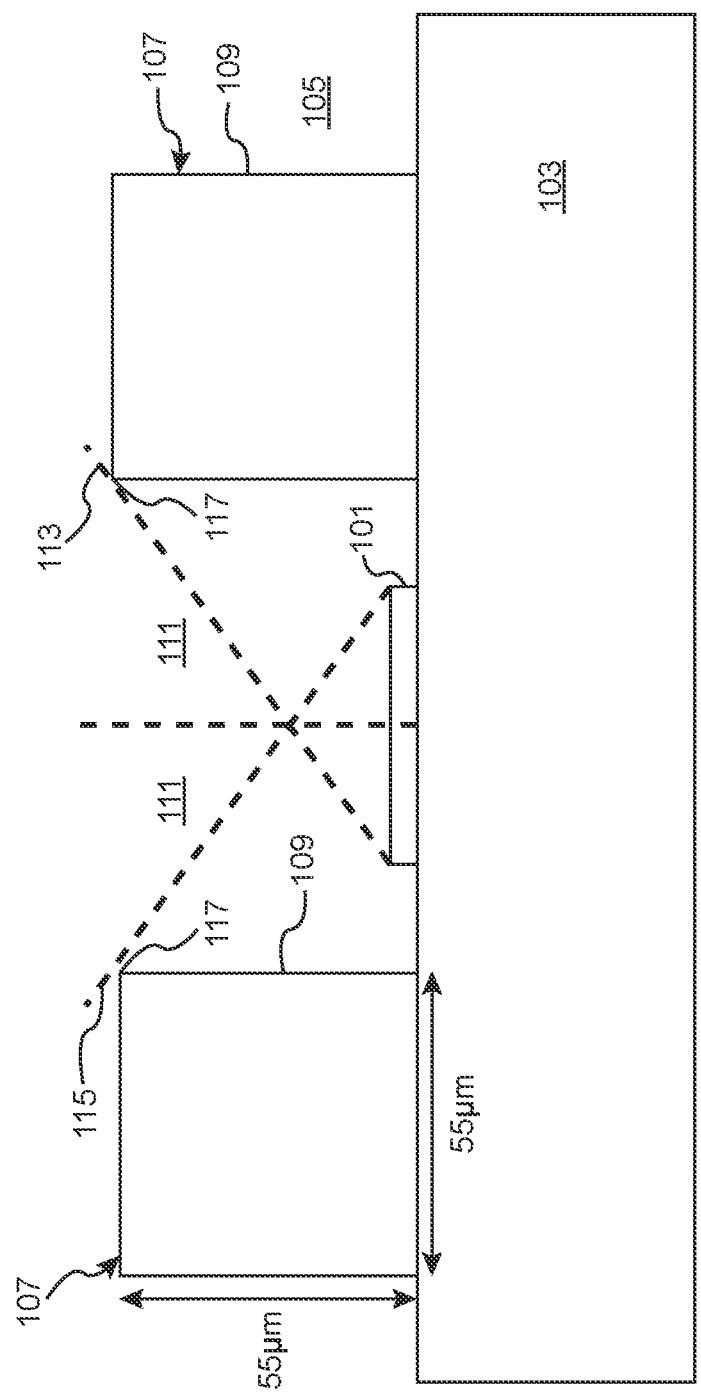
FIGS. 66 to 73 show schematically cross-sectional side views of different variants of an optoelectronic device in accordance with the present invention.

The optoelectronic device as shown in FIG. 66 comprises one or more optoelectronic light sources 101 arranged on an at least partially transparent support layer 103. An at least partially transparent front layer, such as a glass layer, is arranged above the one or more optoelectronic light sources 101. The one or more optoelectronic light sources 101 are located in an intermediate layer 105, which is located between the support layer 103 and the front layer. The support layer 103 can be a PET (Polyethylene Terephthalate) layer, and the intermediate layer 105 can be an EVA (Ethylen-Vinylacetat-Copolymer) or PVB (Polyvinyl Butyral) layer.

The front layer comprises an interface to the outside, which is usually air. The interface is in particular formed by the upper surface of the glass layer (not shown in FIG. 66). In particular at this interface light from an optoelectronic light source 101 can be totally reflected internally, if the angle of incidence of the light is equal to or larger than the critical angle. The critical angle is the smallest angle of incidence that yields total internal reflection. The angle of incidence is measured with respect to the surface normal.

In order to avoid that total internal reflections occur at the interface, a limiting device 107 is provided in a circumferential direction around the light source 101. If there are more than one light sources 101 present, they are usually spaced apart from each other such that a separate limiting device 107 can be arranged around each light source 101.

As indicated in FIG. 66, the limiting device 107 can have the form of a ring-shaped element 109 and it can be dimensioned such that it limits a spatial region 111, in which light from the light source 101 can propagate. FIG. 66 shows two light beams 113, 115 from the light source 101 that are just not blocked by the limiting device 107, as they can just pass by the upper inner edge 117 of the
ring-shaped limiting device
109. The light beams 113, 115 therefore, at least approximately, visualize the outer boundary of an emission cone of the light after the limiting device 107.

The ring-shaped element 109 is configured to limit the spatial region 111, in which the light from the light source 101 can propagate such that total internal reflection is avoided or at least reduced. Thus, undesired light beams that travel in the device due to total internal reflection at the interface are avoided or at least reduced. The contrast of colours on the interface can thereby be enhanced. Furthermore, in particular in monochromatic applications and/or in application that include different colours, a contrast in brightness can be improved on the interface.

The ring-shaped element 109 preferably includes an absorbing surface. For example, it can be made of a blackened metal structure. For example, it can be formed of galvanic copper with additional blackening. It can also be formed of a resist, in particular a transparent resist, which is covered with a black finish. Alternatively, it can be formed of a printed structure with a high aspect ratio.

In the example of FIG. 66, the light source 101, which is preferably a μLED, has an edge length of 50 μm, and the ring-shaped element 109 has a width of 55 μm and a height of 55 μm.

Figure 67:
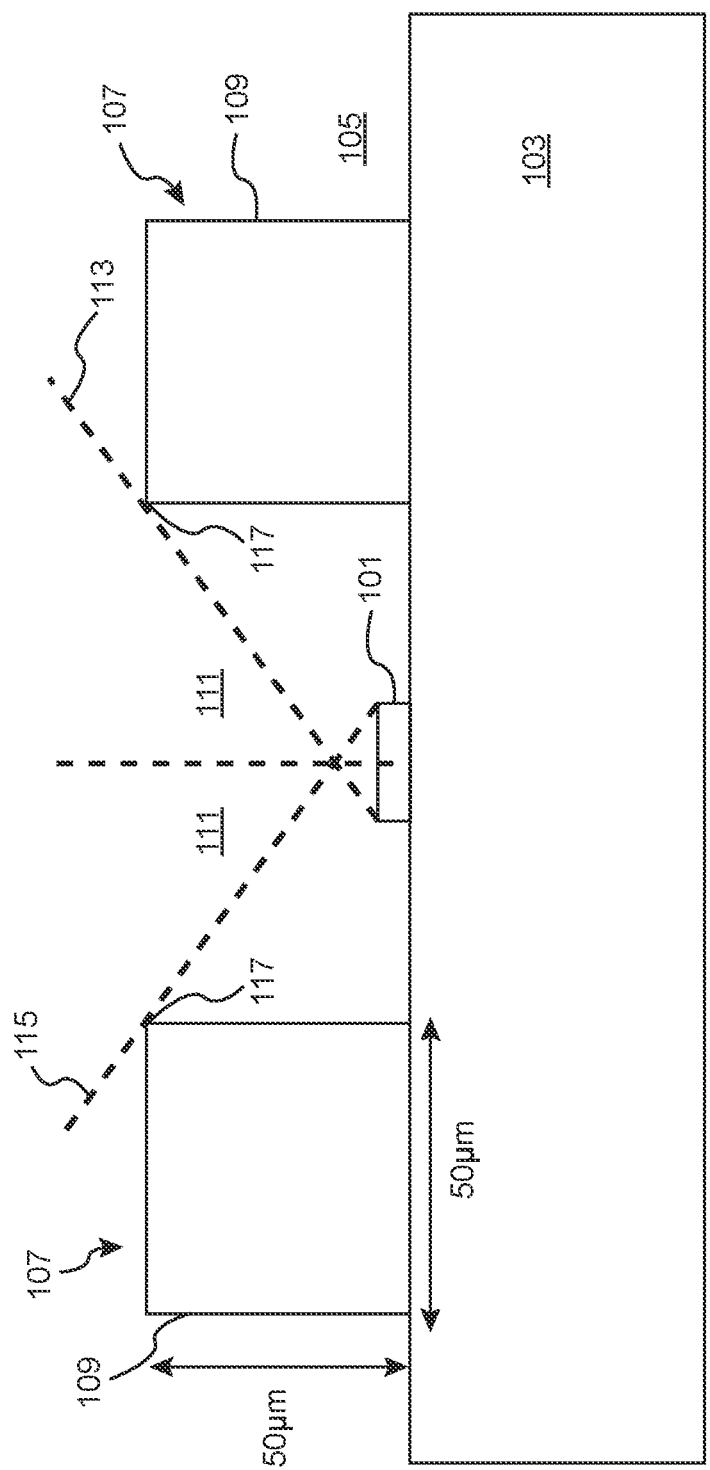
Figure 68:
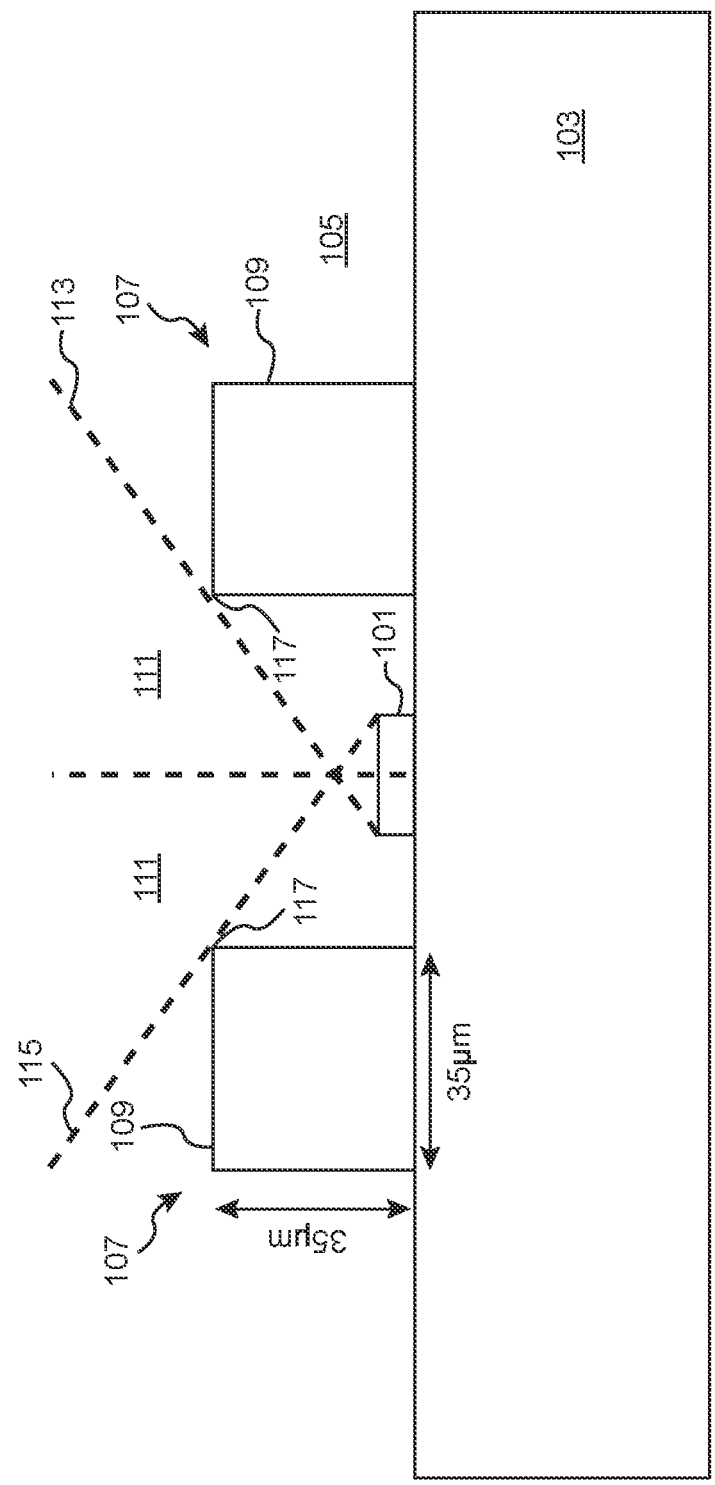

The optoelectronic device shown in FIG. 67 differs from the variant of FIG. 66 in that the light source 101, which is preferably a μLED, has an edge length of 20 μm, and the ring-shaped element 109 has a width of 50 μm and a height of 50 μm. The optoelectronic device shown in FIG. 68 differs from the variant of FIG. 66 in that the light source 101, which is preferably a μLED, has an edge length of 20 μm, and the ring-shaped element 109 has a width of 35 μm and a height of 35 μm.

Figure 69:
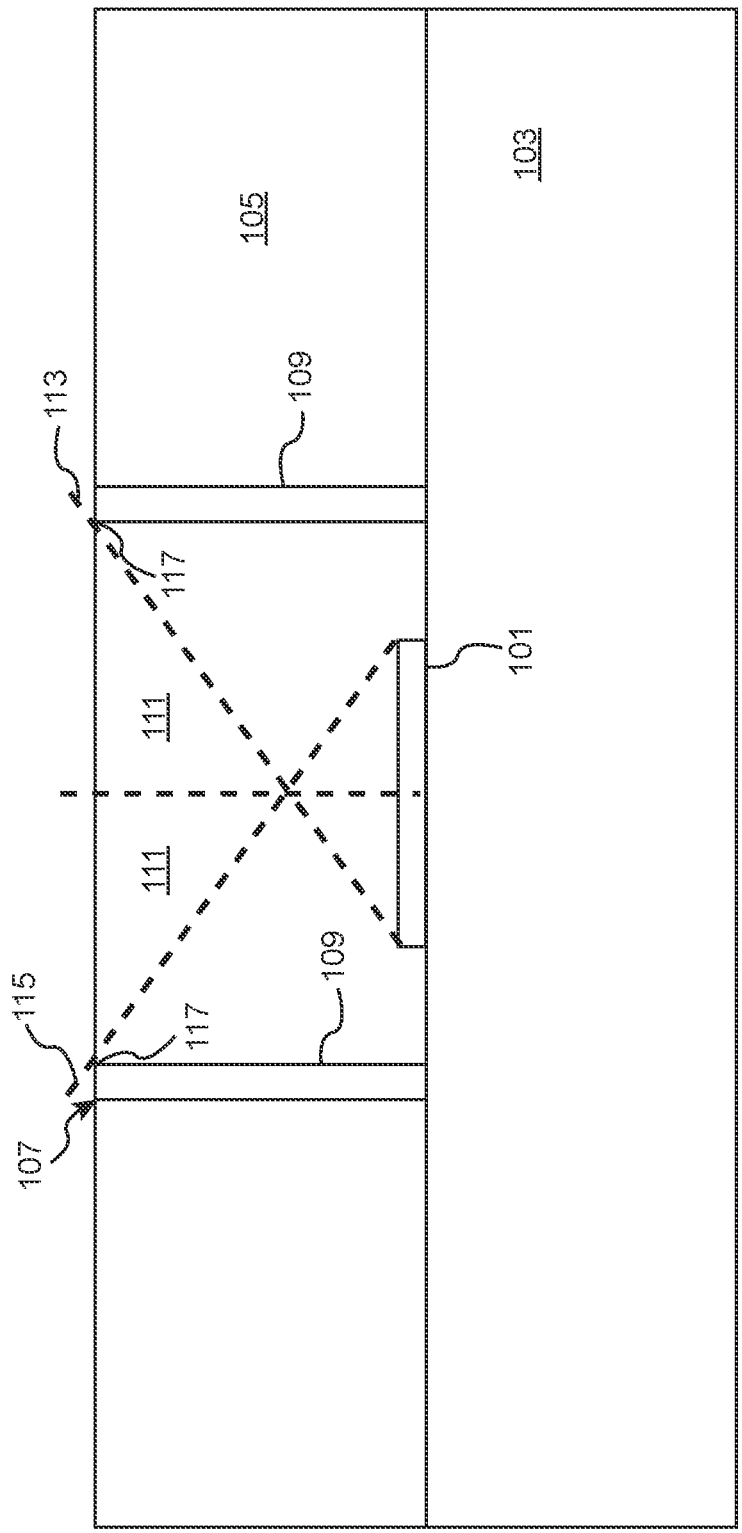

The optoelectronic device shown in FIG. 69 differs from the variant of FIG. 66 in that the ring-shaped element 109 consists of a ring-shaped form, which is made in the intermediate layer 105, for example by laser drilling, and which is filled with an absorbing material.

Alternatively, a pre-structured metal arrangement which is covered by an absorbing or black material can be embedded in the intermediate layer 105 (not shown in FIG. 69), either after a ring-shaped form has been created in the intermediate layer 105 or by pressing such a structure into the intermediate layer 105.

Figure 70:
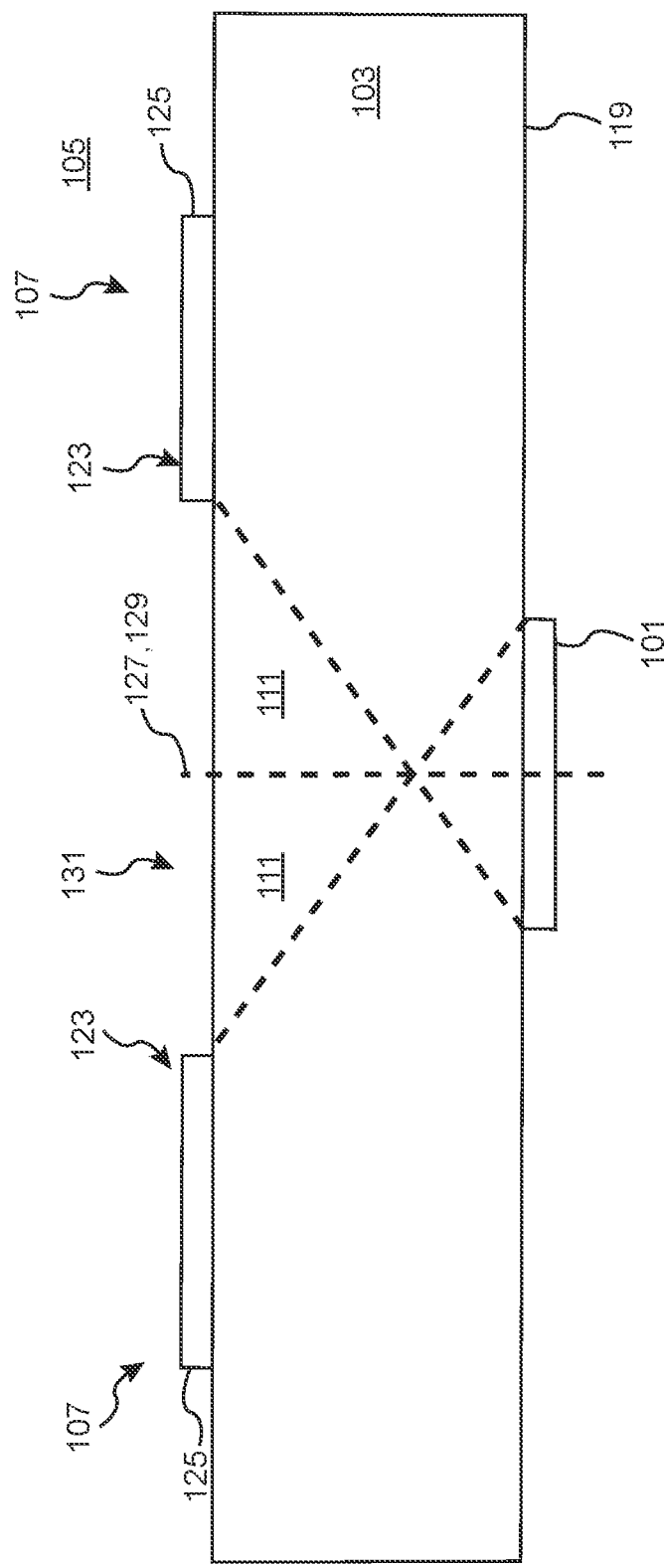

In contrast to the previous examples, in the optoelectronic device of FIG. 70, the light source 101 is arranged on the backside 119 of the support layer 103 and the limiting device 107 is arranged on the topside 121 of the support layer 103.

Furthermore, the limiting device 103 is formed by a flat surface area 123 of an absorbing and/or a partially or semi-transparent material.

In the shown example of FIG. 70, the surface area 123 can have the form of a ring. A central axis 127 of the corresponding ring-shaped element 125 coincides at least approximately with a central axis 129 of the optoelectronic light source 101.

The central opening 131 of the ring-shaped element 125 can limit the spatial region 111, in which light from the light source 101 can propagate through the opening 131. In particular, the opening 131 could be dimensioned such that total internal reflection of light at the interface between the front layer and the outside (not shown in FIG. 70) can be avoided or at least reduced. Thus, undesired light beams that travel in the device due to total internal reflection at the interface can be avoided or reduced in the device of FIG. 70. Furthermore, the ring-shaped element 125 can help to reduce crosstalk between different light sources 101 (not shown in FIG. 70).

The ring-shaped element 125 with the central opening 131 can be generated from a coated circular layer. Furthermore, layer material can be removed from the circular layer to obtain the central opening 131. Such removal could be carried out for example by an etching process, a mechanical process or laser ablation. The circular layer and, correspondingly, the ring-shaped element 125 can be made of an at least partially transparent layer, for example a tinted layer.

Figure 71:
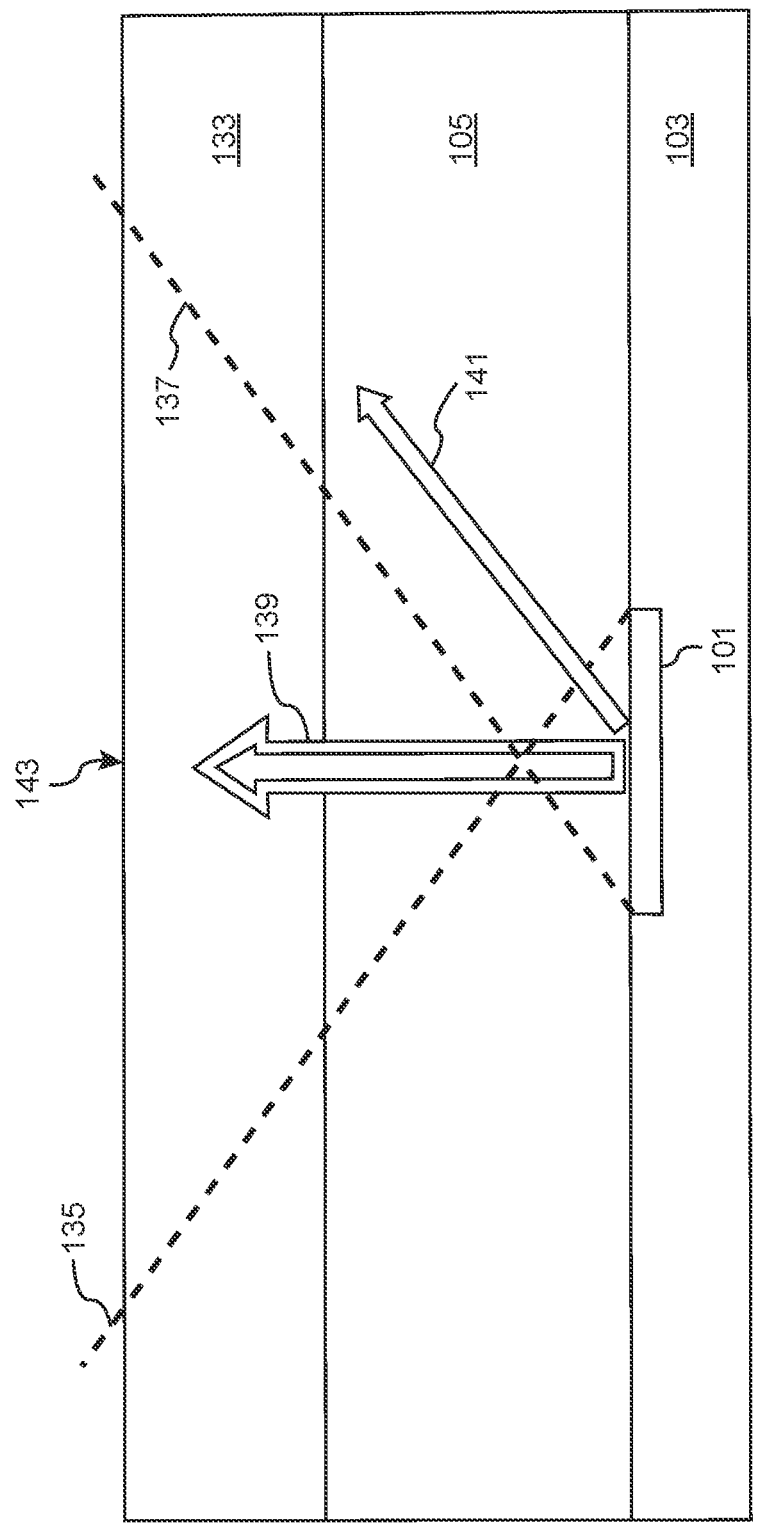

The optoelectronic device shown in FIG. 71 comprises at least one optoelectronic light source 101, an at least partially transparent front layer 133, an at least partially transparent support layer 103, and an intermediate layer 105. The support layer 103 can be a PET (Polyethylene Terephthalate) layer, and the intermediate layer 105 can be an EVA (Ethylen-Vinylacetat-Copolymer) or PVB (Polyvinyl Butyral) layer, and the front layer 133 can be a glass layer. The intermediate layer 105 can have a height of 0.76 mm, and the front layer 133 can have a height of 2.1 mm.

The light source 101 is at least partially embedded in the support layer 103. A front side of the light source 101 faces the front layer 133 and a rear side of the light source 101 faces the support layer 103. The light source 101 is preferably a surface emitting optoelectronic light source, which emits light at its front side. However, at least in some embodiments, the light source 101 can also be a volume emitting optoelectronic light source.

FIG. 71 shows light beams 135, 137, 139, 141 as they might be emitted by light source 101. Light beam 139 is a beam that travels perpendicular to the layers and, thus, is incident on the interface 143 between the front layer 133 and the outside at an angle of at least approximately zero degrees (in view of the surface normal). A small fraction (with regard to the beam's intensity) of this beam might be reflected due to the change in index of refraction at the interface 143. In contrast, beams 135, 137, 141 are incident on the interface 143 at a large angle of incidence. If the angle of incidence is equal to or larger than the critical angle for total reflection, the full intensity of the beams 135, 137, 141 is reflected back.

The intermediate layer 105 is partially transparent or semi-transparent. For example, the intermediate layer 105 can have a transmittance of around 18%. The transmittance of the layer is defined by the ratio of transmitted radiant power to incident radiant power. The value of 18% is only an example. In another example, the value can be in the range from 15% to 25%. Due to the low transmittance of the intermediate layer 105, propagation of reflected light (from "normal" Fresnel reflections or from total internal reflections) in the layers 133, 105, 103 can be dampened and reduced.

Figure 72:
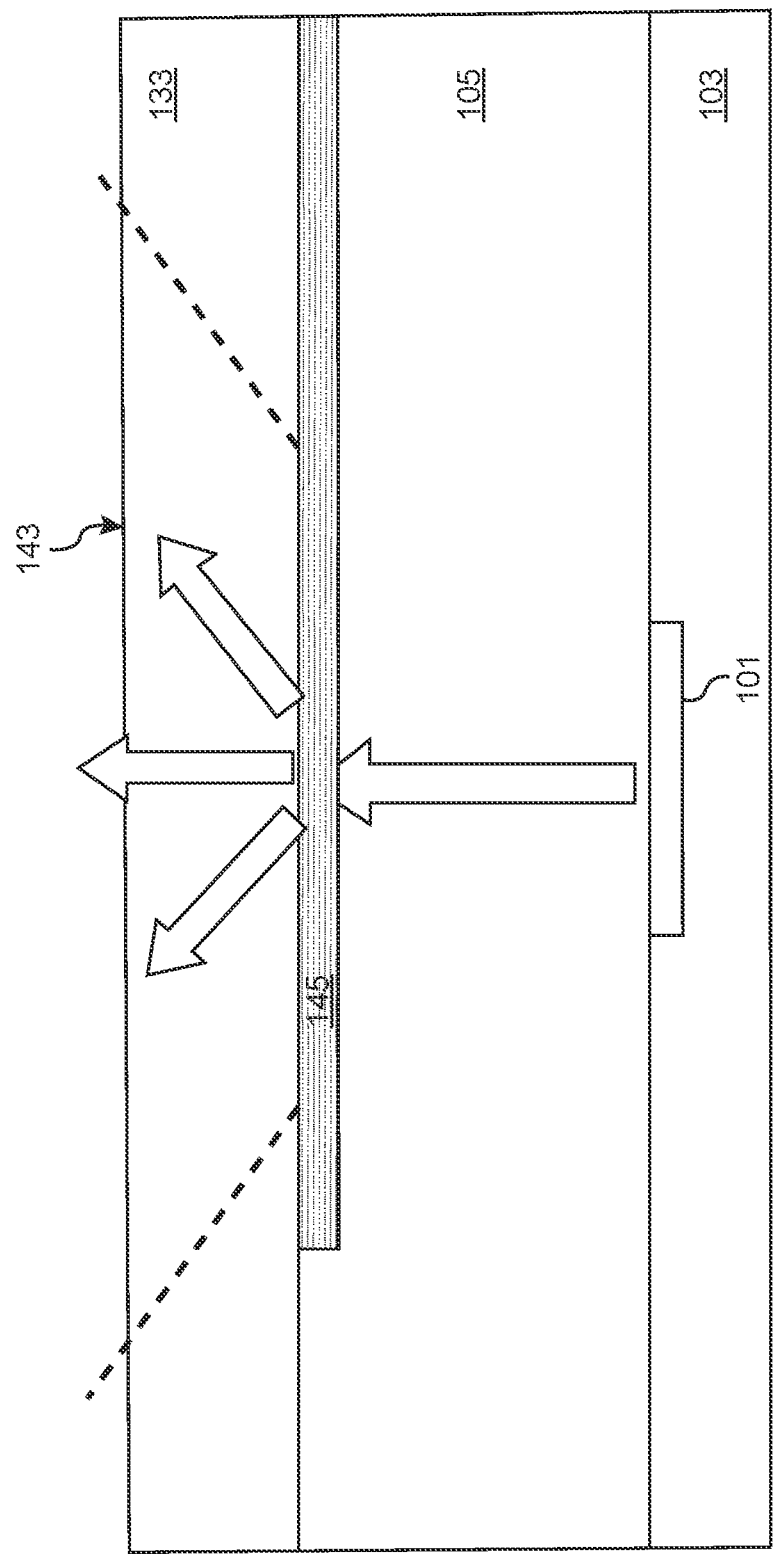

The optoelectronic device shown in FIG. 72 differs from the embodiment of FIG. 71 in that a scattering layer 145 is arranged between the front layer 133 and the intermediate layer 105. The scattering layer 145 can comprise one or more segments. The scattering layer 145 may therefore not extend over the full width of the other layers, as shown in FIG. 72. Therefore, the scattering layer 145 can be embedded in the intermediate layer 105. The scattering layer 145 can have a height of less than 0.25 mm.

The scattering layer 145 includes scattering elements. The scattering layer 145 can therefore scatter light from the light source 101 and thereby broaden light spots that are generated on the interface 143. In addition, light which is back reflected at the interface 143 can also be scattered in the scattering layer 145. In conjunction with the intermediate layer 105, which has a low transmittance as outlined with regard to FIG. 71, the intensity of back-reflected light that propagates in the device can be effectively reduced.

Figure 73:
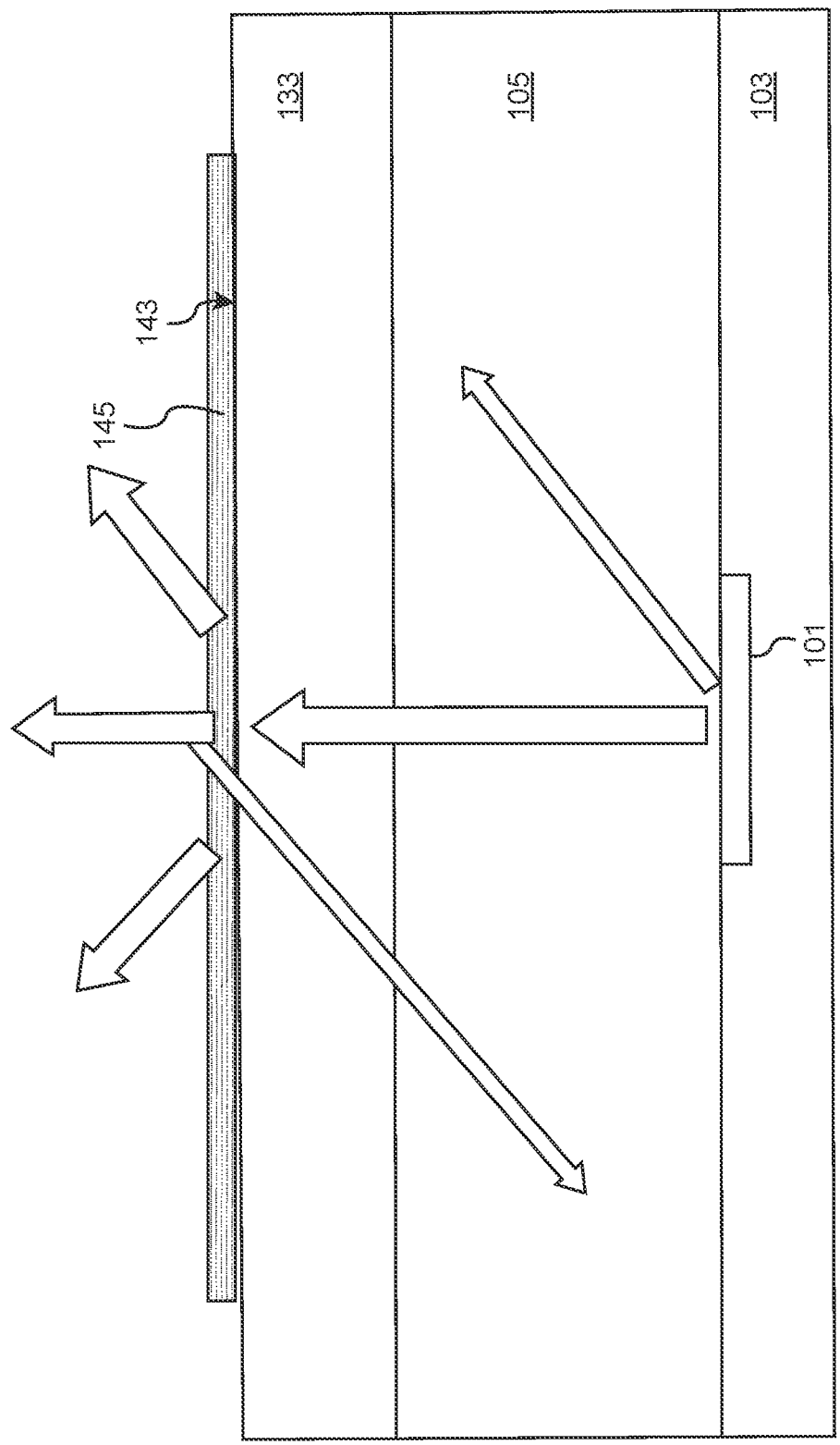

The optoelectronic device shown in FIG. 73 differs from the embodiment of FIG. 72 in that the scattering layer 145 is arranged on the interface 143. Light that is exiting the interface 143 can be scattered by scattering centers in the scattering layer 145. Thus, for example, a light spot can be broadened, which might be advantageous in some applications.

Figure 74:
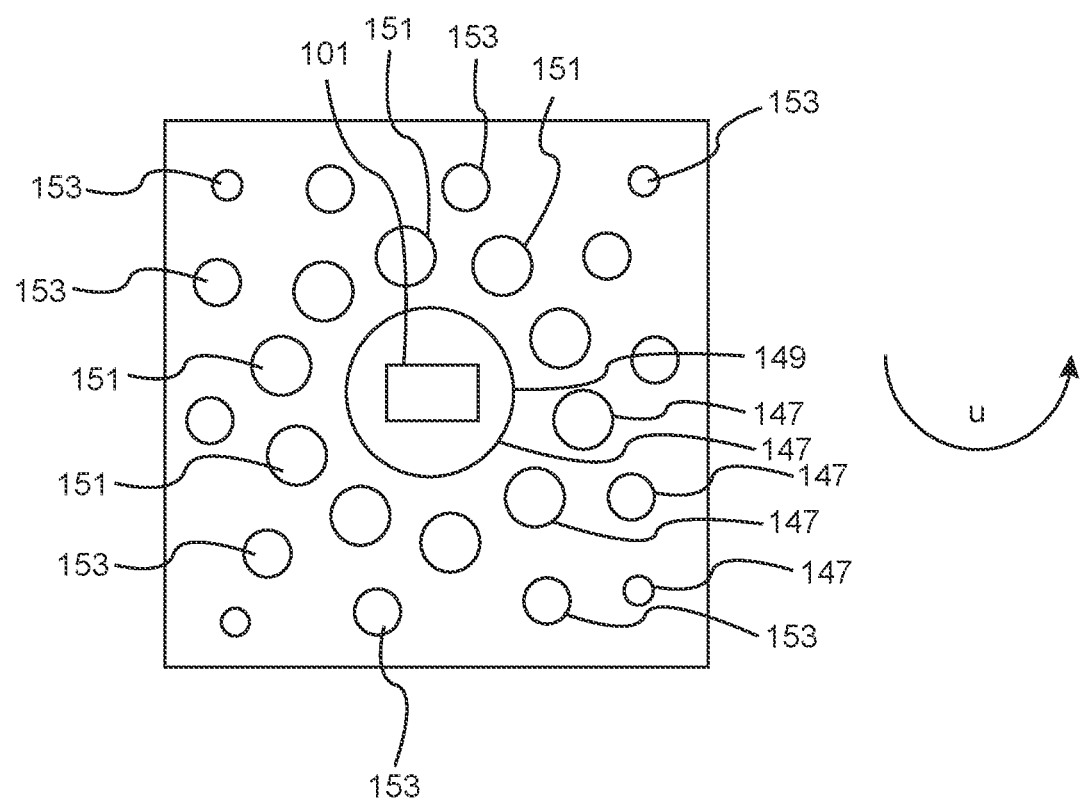
FIG. 74 shows schematically a top view of a variant of an optoelectronic device in accordance with the present invention.

As shown in the top view of FIG. 74, the scattering layer 145 can comprise layer segments which are embedded for example in the intermediate layer (see FIG. 72) or arranged on the interface 143 (see FIG. 73).

If glass is used as front layer 133, the layer segments of the scattering layer 145 can be printed, for example via a digital printing process or stencil printing. The layer segments can include ceramic particles as scattering centers. By using multiple printing steps or additive methods, like inkjet printing, different scattering particle concentrations within the segments 149-153 can be realized.

The scattering layer 145 can also be structured. For example, the scattering layer 145 can comprise a larger central circular segment 149 arranged above the light source 101 such that at least approximately a central axis of the central circular segment 149 coincides with the central axis of the light source 101.

Several segments 151 having a smaller radius can be arranged in a circumferential direction U around the central circular segment 149. Further circular segments 153 with still smaller radii are arranged around the segments 151 as shown in FIG. 74. Such a structured scattering layer with several different segments 149 to 153 can broaden a light spot and cause a smoother decrease of the light density of a light spot along a radial direction of the spot. Different shapes and/or arrangements of the layer segments 149 to 153 enable different scattering scenarios.

Figure 75:
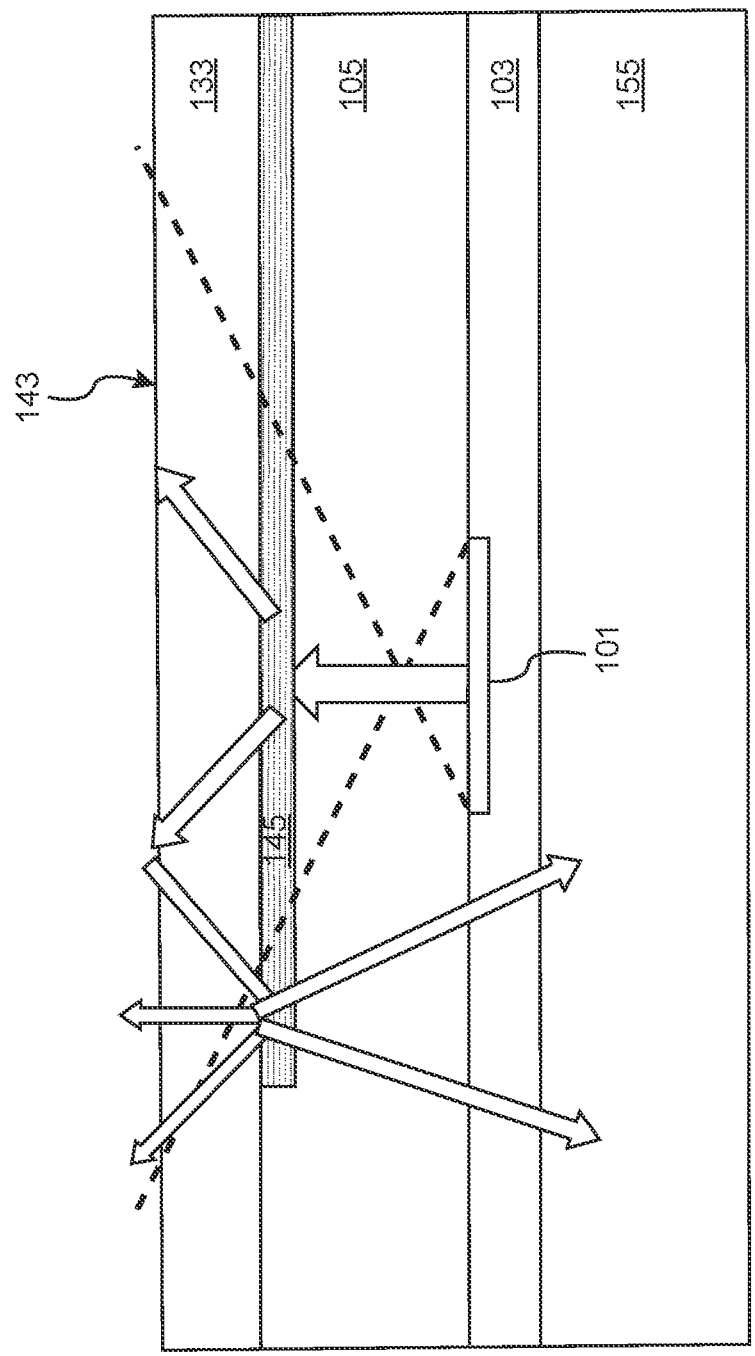
FIGS. 75 to 82 show schematically further cross-sectional side views of different variants of an optoelectronic device in accordance with the present invention.

The optoelectronic device shown in FIG. 75 differs from the embodiment of FIG. 72 in that the intermediate layer 105 is a transparent layer, for example made of PVB. Furthermore, the optoelectronic device of FIG. 75 comprises a back layer 155 below the support layer 103. The back layer 155 can be a tinted PVB layer, for example with a height of 0.76 mm.

The back layer 155 has a low transmittance, for example of around 18%. Due to the low transmittance of the back layer 155, propagation of unwanted, in particular reflected light (from Fresnel reflections or from total internal reflections at the interface 143) can be dampened and reduced.

Figure 76:
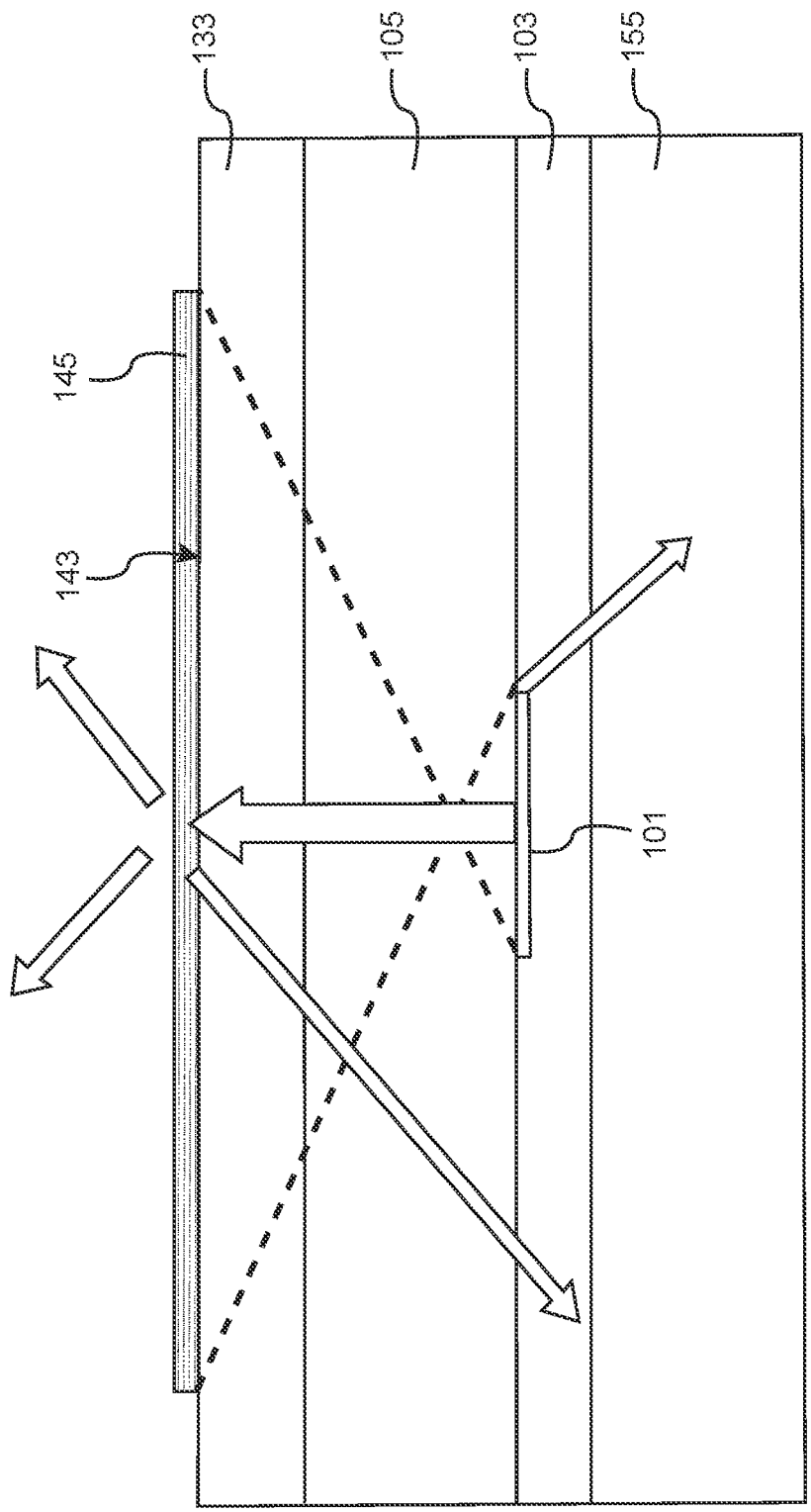

The optoelectronic device shown in FIG. 76 differs from the embodiment of FIG. 75 in that the scattering layer 145 is arranged on the interface 143 (see also FIG. 73).

Figure 77:
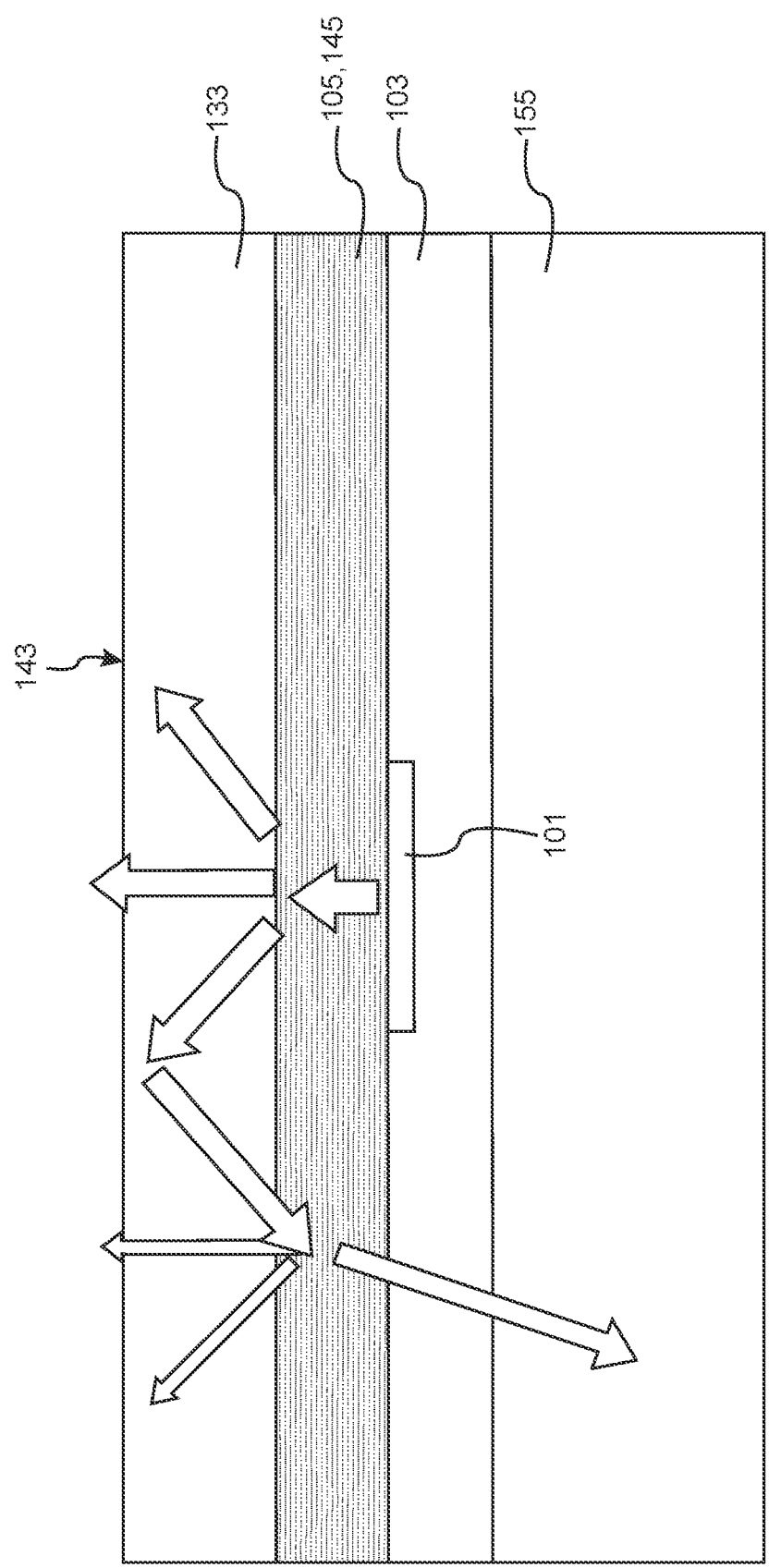

The optoelectronic device shown in FIG. 77 differs from the embodiment of FIG. 75 in that the intermediate layer 105 is designed as scattering layer 145. The height of the intermediate layer 105 can be 0.76 mm.

Figure 78:
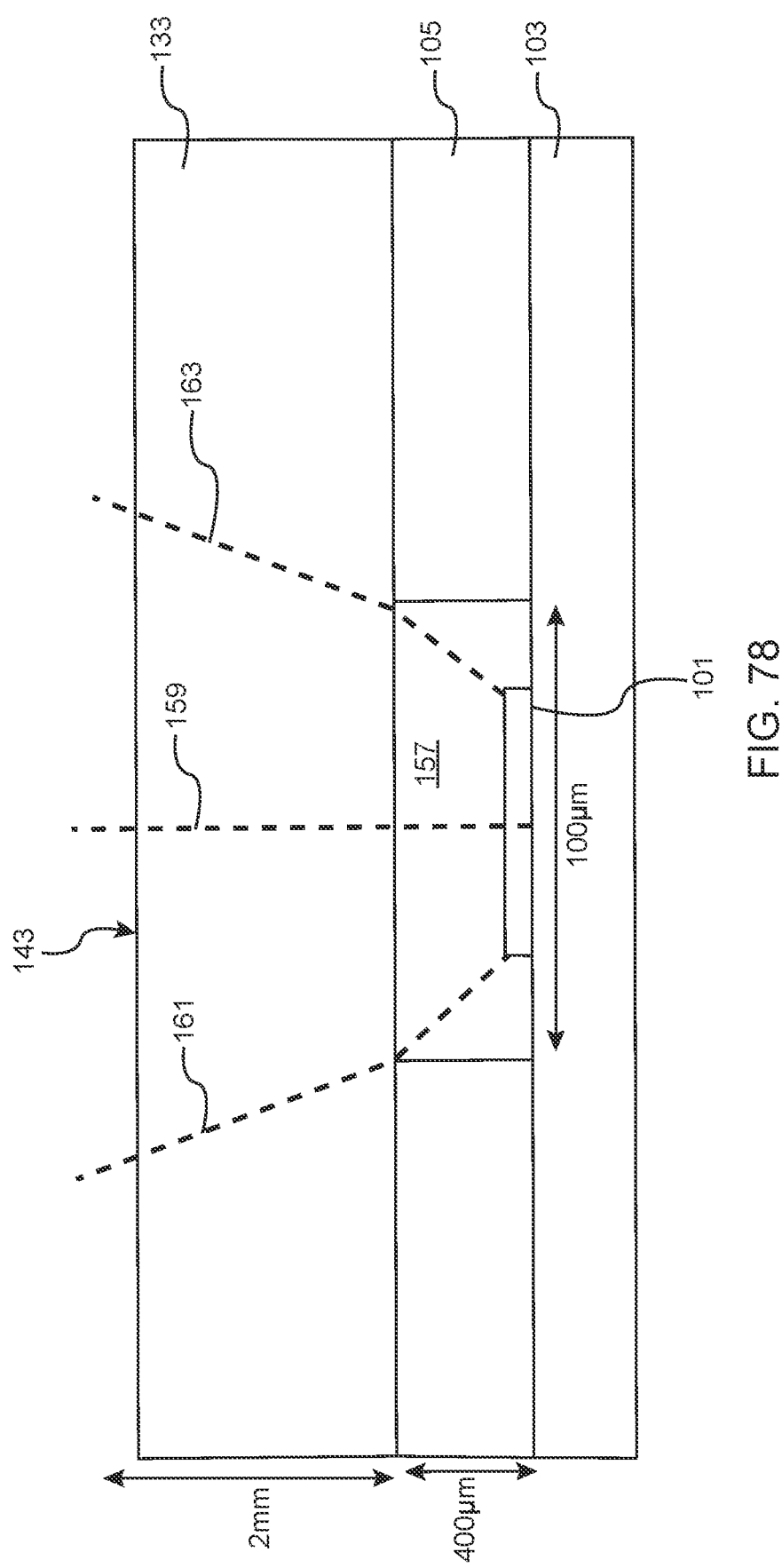

The optoelectronic device shown in FIG. 78 comprises at least one optoelectronic light source 101, an at least partially transparent front layer 133, an at least partially transparent support layer 103, and an intermediate layer 105. The support layer 103 can be a PET (Polyethylene Terephthalate) layer, the intermediate layer 105 can be an EVA (Ethylen-Vinylacetat-Copolymer) or PVB (Polyvinyl Butyral) layer, and the front layer 133 can be a glass layer. The intermediate layer 105 can have a height of 400 µm, and the front layer 133 can have a height of 2 mm.

The light source 101 is arranged on the support layer 103. The intermediate layer 105 comprises a cavity 157, which surrounds the optoelectronic light source 101. As shown, the cavity 157 can extend over the full height of the intermediate layer 105, and the light source 101 can be centered on the bottom of the cavity 157.

The cavity 157 is filled with a material that has an index of refraction, which is lower than the index of refraction of the surrounding materials. The cavity 157 can in particular be filled with air. The cavity 157 can have a diameter of around 100 µm, and the light source can have an edge length of around 50 µm.

FIG. 78 shows a vertical light beam 159 that passes in a vertical direction through the layers 105, 133 and exits at the interface 143. A small fraction of the light intensity might be reflected back, in particular at the interface 143, due to Fresnel reflection.

The light beams 161, 163 are incident at an angle at the interface between the cavity 157 and the front layer 133. As the front layer 133 has a higher index of refraction, the propagation directions of the light beams 161, 163 shift towards the vertical direction. Therefore, the angle of incidence at which the light beams arrive at the interface 143 are smaller than the critical angle for total internal reflection, while in an arrangement without the cavity 157 these beams would have arrived at the interface 143 at an angle of incidence which is larger than the critical angle. Thus, the cavity 157 helps to narrow the cone of the light emitted by the light source 101 and thereby helps to reduce total internal reflections at the interface 143.

Figure 79:
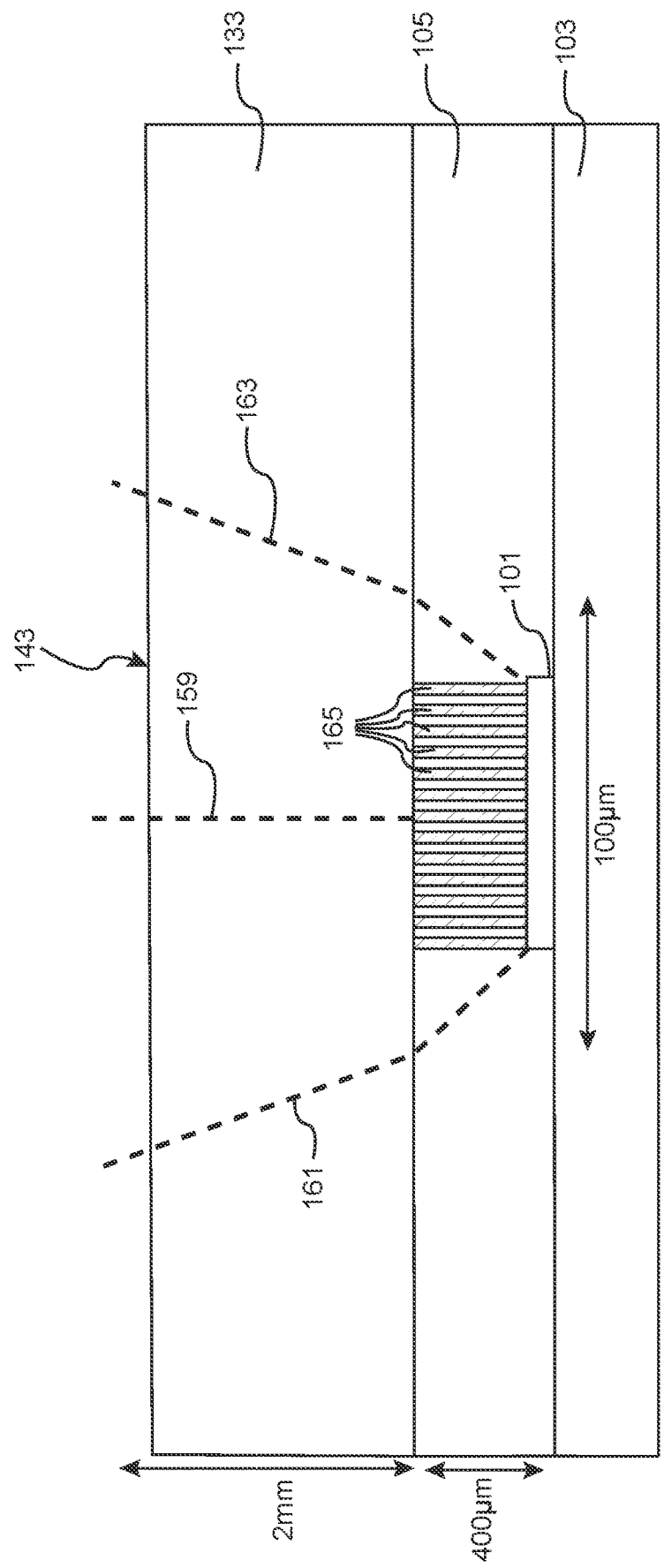

The optoelectronic device of FIG. 79 differs from the embodiment of FIG. 78 in that instead of a cavity a plurality of pillars 165 is arranged above the light source 101. The pillars 165 can be arranged in form of a regular array. The region in which the pillars 165 are located is not limited to a region which is directly above the light source 101 as shown in FIG. 79. The array of pillars 165 can also extend in the lateral directions, for example so that the array of pillars 165 covers a cross-sectional area as the cavity 157 of FIG. 78.

The pillars 165 can be filled, for example, with air. Such pillars 165 can be created during the assembly of the layers 103, 105, and 133. The pillars 165 can help to narrow an emission cone of light from light source 101 and to reduce total internal reflections at the interface 143.

Figure 80:
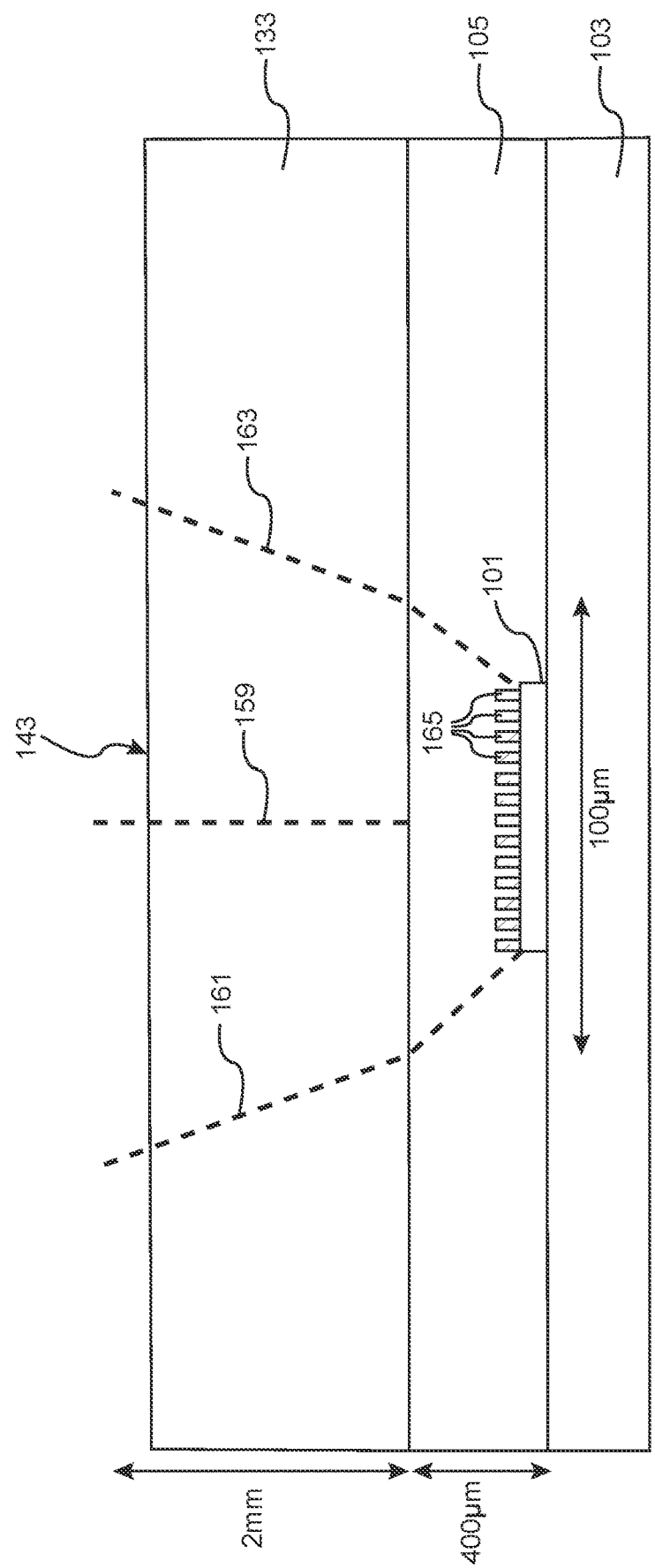
Figure 81:
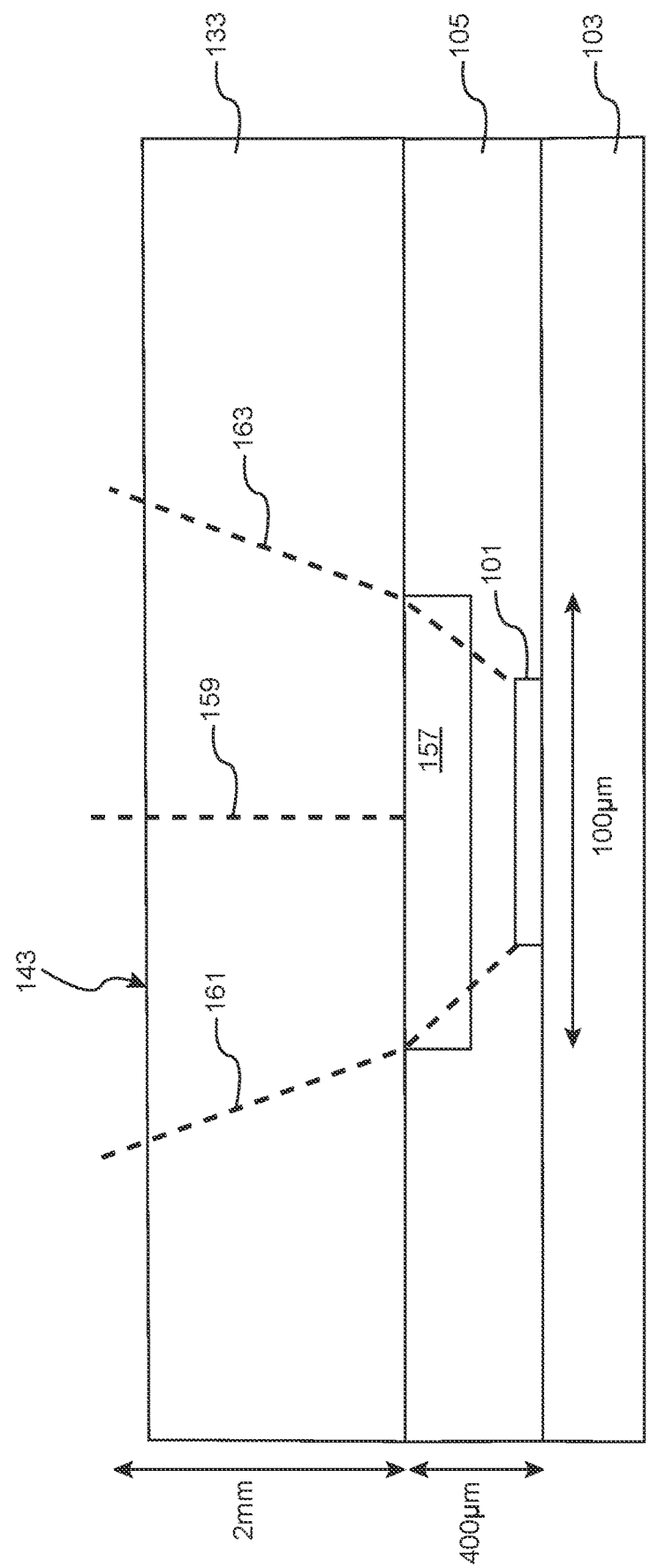
Figure 82:
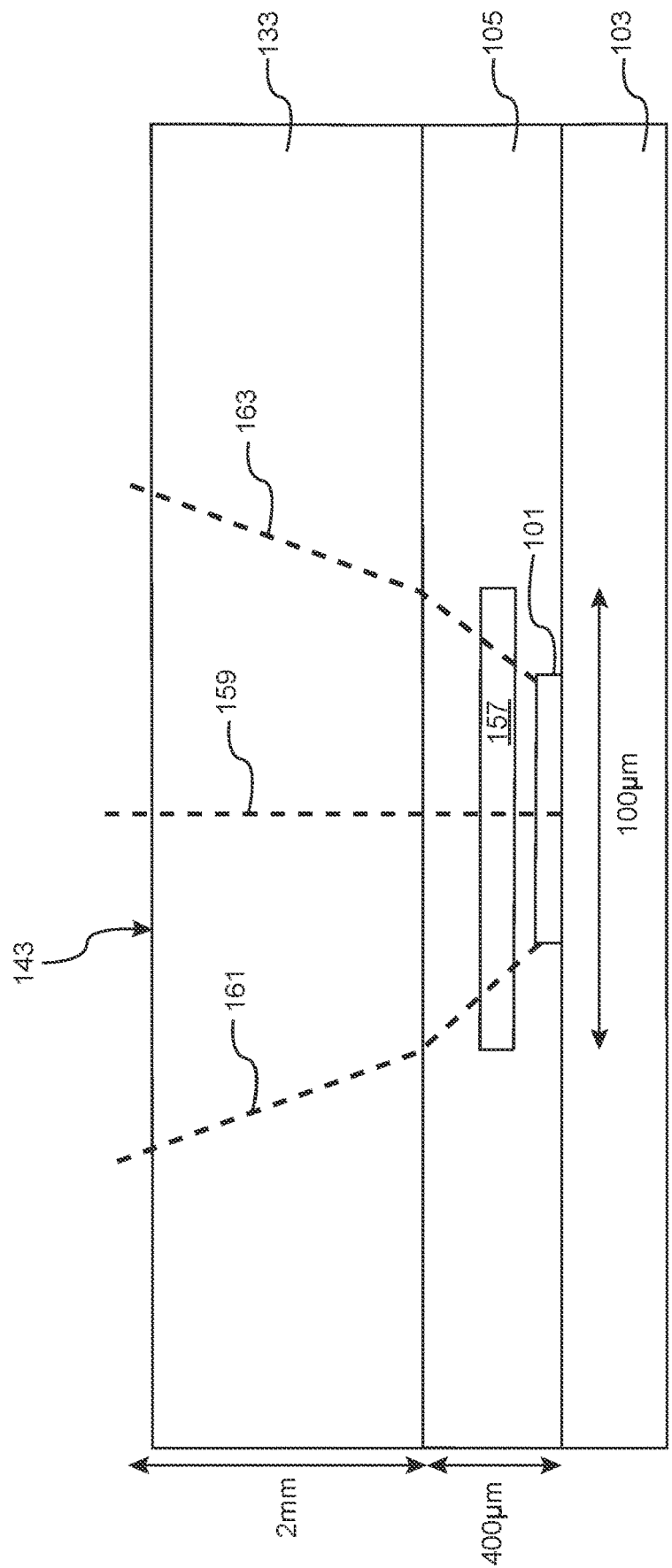

The optoelectronic device of FIG. 80 differs from the embodiment of FIG. 79 in that the pillars do not extend along the full height of the intermediate layer 105. The optoelectronic device of FIG. 81 differs from the embodiment of FIG. 78 in that the cavity 157 is arranged in the upper half of the intermediate layer 105, so that it is distal from the light source 101. The optoelectronic device of FIG. 82 differs from the embodiment of FIG. 78 in that the cavity 157 is arranged in a central part of the intermediate layer 105, and that it is distal from the light source 101. In the embodiments of FIGS. 80 to 82, the pillars 165 and cavities 157, respectively, also help to narrow an emission cone of the light from light source 101 and to reduce total internal reflections at the interface 143.

The optoelectronic device is particularly suitable for use as a pane or sliding roof window or any other partially-transparent and/or illuminated element in a motor vehicle.

Features disclosed with regard to an embodiment can also be present in other embodiment, even if this is not disclosed explicitly.

Further preferred embodiments and implementations of the present invention are disclosed in the following list of Items:

1. An optoelectronic device, comprising:
   an at least partially transparent carrier layer (11) configured to carry at least one optoelectronic light source (13, 21, 23) and/or at least one optoelectronic detector,
   an at least partially transparent cover layer (15), and
   the at least one optoelectronic light source (13, 21, 23) and/or the at least one optoelectronic detector being arranged on the carrier layer (11) or being at least partially embedded in the carrier layer (11).

2. The optoelectronic device in accordance with item 1, characterized in that
   the optoelectronic device comprises an at least partially transparent intermediate layer (17), which is arranged between the carrier layer (11) and the cover layer (15).

3. The optoelectronic device in accordance with item 2, characterized in that
   the intermediate layer (17) comprises or consists of an adhesive for gluing the carrier layer (11) to the cover layer (15).

4. The optoelectronic device in accordance with any one of the preceding items, characterized in that
   the optoelectronic light source (13, 21, 23) is arranged such that at least most of the light is exiting the optoelectronic device either through the carrier layer (11) or through the cover layer (15).

5. The optoelectronic device in accordance with any one of the preceding items, characterized in that
   at least one optical element (19), in particular a reflecting or absorbing optical element, is arranged on the carrier layer (11) or embedded in the carrier layer (11), and the optical element (19) is configured to direct light emitted by the optoelectronic light source (13) such that at least most of the light exits the device either through the carrier layer (11) or through the cover layer (15) or the optical element (19) is configured to absorb light.

6. The optoelectronic device in accordance with any one of the preceding items, characterized in that
   a reflective optical element (19), in particular a mirror or a curved mirror, is embedded in the carrier layer (11) and configured to reflect light from the optoelectronic light source towards the cover layer (15), wherein the optoelectronic light source (13) is arranged on the carrier layer (11) or embedded in the carrier layer (11), in particular in front of the reflective optical element (19).

7. The optoelectronic device in accordance with item 5, characterized in that
   the optical element (19) is a light absorbing element, in particular in form of a flat plate, configured to absorb light from the optoelectronic light source (13), wherein, preferably, the optical element (19) is arranged on the carrier layer (11) and/or the optoelectronic light source (13) is arranged on the optical element (19).

8. The optoelectronic device in accordance with any one of the preceding items, characterized in that
   the optoelectronic light source (13) is arranged on the surface of the carrier layer (11) that is facing the cover layer (15).

9. The optoelectronic device in accordance with any one of the preceding items, characterized in that
   at least one optical element (19), in particular a reflecting optical element, is arranged on the surface of the carrier layer (11) which is facing away from the cover layer (15),
   wherein, preferably, the optical element (19) is formed by a coating layer or a structure printed on the surface of the carrier layer (11), and/or wherein, preferably the optical element (19) can comprise a matrix material, such as $TiO_2$ or $ZrO_2$.

10. The optoelectronic device in accordance with any one of the preceding items, characterized in that
    the at least one optoelectronic light source (21, 23) comprises a first set of optoelectronic light sources and a second set of optoelectronic light sources, the first set of light sources (21) is arranged such as to emit light towards the surface of the carrier layer (11) which is facing away from the cover layer (15), and the second set of light sources (23) is arranged such as to emit light towards the cover layer (15).

11. The optoelectronic device in accordance with item 10, characterized in that
    the first set of light sources (21) and the second set of light sources (23) can be operated independently from each other.

12. The optoelectronic device in accordance with item 10 or 11, characterized in that
    the optoelectronic light sources of at least one of the first set of light sources or the second source of light sources (21, 23) are embedded in the carrier layer (11), wherein, preferably, electrical conductors for providing electricity to the light sources (21, 23) are arranged on a surface of the carrier layer (11), in particular on the surface facing the cover layer (15).

13. The optoelectronic device in accordance with any one of the preceding items, characterized in that
    the optoelectronic device includes at least one light shaping element (29), which is preferably arranged in a separate layer (31) and aligned with the optoelectronic light source (13).

14. The optoelectronic device in accordance with any one of the preceding items,
characterized in that
the carrier layer (11) is a flexible layer and/or made of a foil or a glass material or a plastic material, for example PMMA or PC or PVB or PVA or PET.

15. The optoelectronic device in accordance with any one of the preceding items,
characterized in that
the cover layer (15) is a flexible layer and/or made of glass or of a plastic material, for example PMMA or PC or PVB or PVA or PET.

16. A method of producing an optoelectronic device, in particular an optoelectronic device in accordance with any one of the preceding items, the method comprising:
providing an at least partially transparent carrier layer (11),
arranging at least one optoelectronic light source (13, 21, 23) and/or at least one optoelectronic detector on the carrier layer (11) or embedding the at least one optoelectronic light source (13, 21, 23) and/or the at least one optoelectronic detector in the carrier layer (11), and
attaching the carrier layer (11) to an at least partially transparent cover layer (15).

17. The method of item 16,
characterized in that
an at least partially transparent intermediate layer (17), preferably comprising or consisting of an adhesive, is arranged between the carrier layer (11) and the cover layer (15).

18. The method of item 17,
characterized in that
the at least one optoelectronic light source (13, 21, 23) and/or the at least one optoelectronic detector are at least partially embedded in the intermediate layer (17).

19. A vehicle comprising a window, an interior equipment element, or an exterior equipment element, which includes an optical device in accordance with any one of the items 1 to 15.

20. An optoelectronic device, comprising:
an at least partially transparent intermediate layer, in particular a transparent foil, and
a plurality of optoelectronic light sources arranged on or embedded in the intermediate layer, and
the optoelectronic device further comprises at least one of the following:
a preferably non-transparent top layer, in particular a coloured foil, arranged on an upper surface of the intermediate layer, the top layer comprises a plurality of apertures which are aligned with the light sources, so that light from a light source can be radiated to the front through the aperture which is aligned with the light source,
a filtering layer, in particular configured to operate as a neutral density filter, arranged on an upper surface of the top layer or the upper surface of the intermediate layer,
a non-transparent or at least partially transparent background layer, in particular a coloured foil, arranged on a bottom surface of the intermediate layer.

21. The optoelectronic device in accordance with item 20,
characterized in that
the optoelectronic device comprises a non-transparent or at least partially transparent carrier layer arranged on a bottom surface of the intermediate layer or on a bottom surface of the background layer, if the background layer is arranged on the bottom surface of the intermediate layer.

22. The optoelectronic device in accordance with item 20 or 21,
characterized in that
the layers of the optoelectronic device are configured for an arrangement on a freeform surface, for example a freeform surface of a vehicle, and/or
the layers of the optoelectronic device are bendable and/or flexible.

23. The optoelectronic device in accordance with any one of the items 20 to 22,
characterized in that
the top layer is designed in one or more colours, and/or
the top layer is made of leather, plastic, textile or fabric, and/or
the top layer has a thickness of less than 100 µm or less than 50 µm or in the range between 100 µm and 1000 µm.

24. The optoelectronic device in accordance with any one of the items 20 to 23,
characterized in that
the filtering layer and/or the background layer is coloured.

25. The optoelectronic device in accordance with any one of the items 20 to 24,
characterized in that
the background layer comprises a plurality of apertures which are aligned with the light sources, so that light from a light source can be radiated to the back through the aperture which is aligned with the light source.

26. An optoelectronic device,
in particular an optoelectronic device in accordance with any one of the items 20 to 25,
the optoelectronic device comprising:
an at least partially transparent intermediate layer, in particular a transparent foil, and
a plurality of optoelectronic light sources arranged on or embedded in the intermediate layer, and
a plurality of optical elements, wherein each optical element is aligned with one of the light sources of the plurality of light sources, and
the optical elements being formed integrally with the intermediate layer.

27. The optoelectronic device in accordance with item 26,
characterized in that
each optical element is one of the following:
a lens, a micro-lens, an optical micro-structure for beam shaping.

28. An optoelectronic device,
in particular an optoelectronic device in accordance with any one of the items 20 to 27,
the optoelectronic device comprising:
an at least partially transparent intermediate layer, in particular a transparent foil, and
a plurality of optoelectronic light sources arranged on or embedded in the intermediate layer, each light source having a surface normal which is perpendicular to a top surface of the respective light source,
the optoelectronic device is intended to be applied to a support surface having a curved shape, such that the intermediate layer takes on the curved shape of the support surface, the light sources being arranged on or embedded in the intermediate layer such that their surface normals are parallel to each other when the intermediate layer is in the curved shape, and/or the light sources being arranged on or embedded in the intermediate layer such that their surface normals are parallel to each other when the intermediate layer has the curved shape.

29. The optoelectronic device in accordance with any one of the items 20 to 28,
characterized in that
the optoelectronic device comprises at least one layer of electric lines, which preferably form an array-like structure, wherein, further preferably, the array-like structure comprises array-like segments which are separated, in particular electrically separated, from each other.

30. The optoelectronic device in accordance with item 29,
characterized in that
at least a portion and preferably all of the electric lines have a trace width of less than 20 µm, 15 µm, or 10 µmm and neighbouring electric lines have a pitch of less than 150 µm, 125 µm, or 100 µm.

31. An optoelectronic device,
in particular an optoelectronic device in accordance with any one of the items 20 to 30,
the optoelectronic device comprising:
a plurality of optoelectronic light sources arranged on a surface of a non-transparent carrier layer, and
a reflecting and electrically conducting material layer, in particular a metal layer, arranged on the surface of the carrier layer in between the optoelectronic light sources and the carrier layer, and
wherein each optoelectronic light source has one electric contact which is located at a bottom side of the light source, wherein the bottom side faces the reflecting and electrically conducting material layer, and wherein the one electric contact at the bottom of each optoelectronic light source contacts the reflecting and electrically conducting material layer.

32. The optoelectronic device in accordance with item 31,
characterized in that
each optoelectronic light source has another electric contact which is located at a top side of the light source, wherein the top side faces away from the reflecting and electrically conducting material layer, and wherein the electric contact at the top of each optoelectronic light source is connected with a contact pad that is arranged on the surface of the carrier layer and separated from the reflecting and electrically conducting material layer, wherein, preferably, each electric contact at the top of each optoelectronic light source is connected with an individual contact pad that is not connected with another optoelectronic light source.

33. The optoelectronic device in accordance with item 31 or 32,
characterized in that
the surface of the carrier layer comprises a plurality of cavities, wherein in each cavity one or more light sources of the a plurality of optoelectronic light sources are arranged.

34. The optoelectronic device in accordance with item 33,
characterized in that
the reflecting and electrically conducting material layer covers, in particular completely, bottom surfaces of the cavities, and/or sidewalls of the cavities, and/or top surfaces of bridging sections between neighbouring cavities.

35. An optoelectronic device,
in particular an optoelectronic device in accordance with any one of the items 20 to 34,
the optoelectronic device comprising:
a plurality of optoelectronic light sources arranged on a surface of an at least partially transparent carrier layer, and
a plurality of reflecting and electrically conducting material layer elements, in particular metal layer elements, wherein each material layer element is arranged on the surface of the carrier layer and in between one of the optoelectronic light sources and the carrier layer, wherein the area of the top surface of the material layer element is larger than the area of a bottom surface of the associated light source, and
wherein each optoelectronic light source has one electric contact which is located at the bottom side of the light source, wherein the bottom side faces the top surface of the material layer element which is arranged below the respective light source, and wherein the one electric contact at the bottom of each optoelectronic light source contacts the material layer element.

36. The optoelectronic device in accordance with item 35,
characterized in that
each optoelectronic light source has another electric contact which is located at a top side of the light source, wherein the top side faces away from the reflecting and electrically conducting material layer elements, and wherein the electric contact at the top of each optoelectronic light source is connected with a contact pad that is arranged on the surface of the carrier layer and separated from the reflecting and electrically conducting material layer elements, wherein, preferably, each electric contact at the top of each optoelectronic light source is connected with an individual contact pad that is not connected with another optoelectronic light source.

37. The optoelectronic device in accordance with item 35 or 36,
characterized in that
a non-transparent layer, in particular a black layer, is arranged above the plurality of optoelectronic light sources, the non-transparent layer comprises apertures which are aligned with the top surfaces of the light sources, so that light emitted from the top surface of a light source can be radiated through the aperture which is aligned with the top surface of the light source.

38. A method of producing an optoelectronic device, the method comprising:
providing an at least partially transparent intermediate layer, in particular a transparent foil,
providing a plurality of optoelectronic light sources on or in the intermediate layer, and
generating, in particular by use of a deep-drawing process, a plurality of optical elements in the intermediate layer.

39. An optoelectronic device, in particular a display device, comprising:
at least one optoelectronic light source (1), an at least partially transparent front layer (5),
an at least partially transparent rear layer (7), wherein the light source (1) is arranged between the front layer (5) and the rear layer (7), wherein a front side (9) of the light source (1) faces the front layer (5) and a rear side (11) of the light source (1) faces the rear layer (7), and wherein a limiting device (39) is provided, wherein the limiting device (39) limits a spatial region, in which the light source (1) emits light, to a defined spatial region.

40. The optoelectronic device according to item 39, characterized in that
the limiting device (39) is arranged outside of the light source (1) and/or between the front and rear layers (5, 7).

41. The optoelectronic device according to item 39 or 40, characterized in that
the spatial region corresponds at least approximately to an emission cone, which has an opening angle with respect to a normal (N) to the front side (9), and that the limiting device (39) is designed to reduce the opening angle of the emission cone.

42. The optoelectronic device according to item 41, characterized in that
the limiting device (39) limits the opening angle to an angle, which is equal to or smaller than a critical angle of total reflection at the outer interface (17) between the front layer (5) and the neighboring surroundings.

43. The optoelectronic device according to any one of the items 39 to 42, characterized in that
the limiting device (39) comprises a reflector or absorber device (43, 43a), which runs circumferentially around a normal (N) to the front side (9) around the light source (1) and/or its emission region.

44. The optoelectronic device according to item 43, characterized in that
the reflector or absorber device (43, 43a) is designed to absorb or reflect light that the light source (1) radiates outside a defined spatial region, in particular to reflect said light in such a way that the reflected light propagates in the defined spatial region.

45. The optoelectronic device according to item 43 or 44, characterized in that
the reflector or absorber device (43, 43a) has a reflecting or absorbing band, in particular at least approximately partially parabolically shaped, which extends around the light source (1) and/or its emission region.

46. The optoelectronic device according to item 43 or 44, characterized in that
the reflector or absorber device (39) takes up a volume region (71) above the front side (9) and/or next to the lateral outer sides of the light source (1), wherein a low-refractive material is arranged in the volume region, wherein, preferably, the volume region (71) has a circular cross section.

47. The optoelectronic device according to any one of items 39 to 46, characterized in that
outside the defined spatial region a diaphragm (49) is provided, in particular in the form of a disk, which is designed to reflect or absorb at least a portion of the light, which is reflected back at an interface (17, 35), in particular the interface (17), between a front side (13) of the device and the surroundings.

48. The optoelectronic device according to item 47, characterized in that
the diaphragm (49) has a disk (61), in particular having a circular and/or one-part or multi-part design, which is preferably arranged on the rear layer (7), wherein, further preferred, the rear side (11) of the light source (1) is arranged centered on the disk (61), 49. The optoelectronic device according to item 48, characterized in that
in a plan view of the front side (9) of the light source (1), the light source (1) and the limiting device (39) cover a first part of the disk (61) and do not cover a second part of the disk (61), which is located on the outside in the radial direction, wherein the second part has a width (B) seen in the radial direction, which is equal to or greater than 2*D*0.84 or 2*D, wherein D is the thickness of the front layer (5).

50. The optoelectronic device according to one of items 47 to 49, characterized in that
the diaphragm (49) has a perforated disk (63), in particular having a circular and/or one-part or multi-part design, which is preferably arranged centered above the light source (1) and between the front layer (5) and the rear layer (7).

51. The optoelectronic device according to item 50, characterized in that
the perforated disk (63) is arranged at the level of a circumferential end of a reflector or absorber device (43) remote from the light source (1), wherein an inner edge (67) of the perforated disk (63) surrounds and/or contacts the remote end of the reflector or absorber device (43).

52. The optoelectronic device according to any one of item 50 to 51, characterized in that
The perforated disk (63) has a width (B) in the radial direction, which is equal to or more than 2*D*0.84 or 2*D, wherein D is the thickness of the front layer (5).

53. The optoelectronic device according to any one of items 47 to 52, characterized in that
the diaphragm (49, 61) is designed as a contact point for at least one electrical contact of the light source (1).

54. The optoelectronic device according to any one of items 39 to 53, characterized in that
an electrical and/or electronic driver device (93) is arranged laterally next to or underneath the light source (1) between the front layer (5) and the rear layer (7), or
wherein the driver device (93) is arranged in the rear layer (7),
wherein, preferably, the housing of the driver device (93) is designed to be reflective or absorptive.

55. The optoelectronic device according to any one of items 39 to 54, characterized in that
an optical device (91) is arranged on the front side (9) of the light source (1) and is designed to restrict the spatial region of the light emission from the light source (1).

56. The optoelectronic device according to any one of the items 39 to 55,
characterized in that
the light source (1) is arranged in an intermediate layer (3), which is located between the front layer (5) and the rear layer (7), wherein at least one and preferably all of the three layers are planar.

57. An optoelectronic device, in particular a display device, comprising:
at least one optoelectronic light source (101),
an at least partially transparent front layer (133),
an at least partially transparent support layer (103),
wherein the light source (101) is arranged between the front layer (133) and the support layer (103),
wherein a front side of the light source (101) faces the front layer (133) and a rear side of the light source (101) faces the support layer (103), and
wherein a limiting device (107) is provided in a circumferential direction around the light source (101), wherein the limiting device (107) limits a spatial region, in which the light source (101) emits light such that total internal reflection of the emitted light, in particular at an interface (143) between the front layer (133) and the outside, is avoided or at least reduced.

58. The optoelectronic device according to item 57,
characterized in that
the limiting device (107) is configured to absorb light.

59. The optoelectronic device according to item 57 or 58,
characterized in that
the limiting device (107) comprises a ring-shaped element (109) inside of which the optoelectronic light source (101) is located, wherein the ring-shaped element (109) has an internal diameter and a height such that light emitted from the light source (101) that would otherwise be totally reflected in the optoelectronic device, in particular at the interface between the front layer (133) and the outside, is absorbed by the ring-shaped element (109).

60. The optoelectronic device according to item 59,
characterized in that
the optoelectronic light source (101) and the ring-shaped element (109) is located in an intermediate layer (105), in particular an EVA or PVB layer,
wherein, preferably, the ring-shaped element (109) is formed by a ring-shaped form, which is made in the intermediate layer (105), in particular by laser drilling and filled with absorbing material or lithography or printing process to apply the absorbing material directly.

61. The optoelectronic device according to item 57,
characterized in that
the optoelectronic light source (101) is arranged on a backside of the support layer (103) and the limiting device (107) is arranged on the topside of the support layer (103).

62. The optoelectronic device according to item 61,
characterized in that
the limiting device (107) is formed by at least an area of absorbing and/or partially or semi-transparent material which is arranged on the topside of the support layer (103).

63. The optoelectronic device according to item 61 or 62,
characterized in that
the limiting device (107) is formed by a ring-shaped element (123), in particular made of an absorbing and/or partially or semi-transparent material, on the topside of the support layer (103), wherein a central axis (127) of the ring-shaped element (123) coincides at least approximately with a central axis (129) of the optoelectronic light source (101).

64. An optoelectronic device, in particular a display device, comprising:
at least one optoelectronic light source (101),
an at least partially transparent front layer (133),
an at least partially transparent support layer (103),
wherein the light source (101) is arranged on or at least partially embedded in the support layer (103),
wherein a front side of the light source (101) faces the front layer (133) and a rear side of the light source (101) faces the support layer (103), and
wherein a partially or semi-transparent intermediate layer (105), for example with a transmittance in the range between 15% to 25% percent or of around 18%, is arranged between the front layer (133) and the support layer (103).

65. The optoelectronic device according to any one of the items 57 to 64,
characterized in that
a structured layer (145) with light scattering elements is arranged on the front layer (133).

66. The optoelectronic device according to any one of the items 57 to 65,
characterized in that
an intermediate layer (105) is arranged between the front layer (133) and the support layer (103) and a structured layer (145) with light scattering elements is arranged between the front layer (133) and the intermediate layer (145).

67. The optoelectronic device according to any one of the items 57 to 66,
characterized in that
a partially or semi-transparent rear layer (155), for example with a transmittance in the range between 10% to 90% percent or of around 20%, is arranged below the support layer (103).

68. The optoelectronic device according to any one of the items 57 to 67,
characterized in that
an intermediate layer (105) is arranged between the front layer (133) and the support layer (103) and the optoelectronic light source (101) is arranged on the support layer (103), wherein the intermediate layer (103) comprises a cavity (157) surrounding the light source (101) or above the light source (101), wherein the cavity (157) is filled with a material having a low index of refraction, in particular air.

69. The optoelectronic device according to any one of the items 57 to 67,
characterized in that
an intermediate layer (105) is arranged between the front layer (133) and the support layer (103) and the optoelectronic light source (101) is arranged on the support layer (103), wherein the intermediate layer (105) comprises a plurality of pillars (165) arranged above the optoelectronic light source (101), wherein the pillars (165) include a material having a low index of refraction, in particular air.

The description with the aid of the exemplary embodiments does not restrict the various embodiments shown to these. Rather, the disclosure depicts several aspects that can be combined with one another. The various items shown above also illustrate this.

The invention thus encompasses any features and any combination of features, in particular including any combination of features in the items and claims, even if this feature or this combination is not explicitly specified in the exemplary embodiments.

LIST OF REFERENCE SIGNS

1 Optoelectronic light source
3 Intermediate layer
5 Front layer
7 Rear layer
9 Front side
11 Rear side
13 Front side
15 Light beam
17 Interface
19 Light beam
21 Light beam
23 Light beam
25 Light beam
27 Light beam
29 Rear side
31 Light beam
33 Light beam
35 Interface
37 Interface
39 Limiting device
41 Light beam
43 Reflector or absorber device
43a Reflector or absorber device
45 Light beam
47 Light beam
49 Diaphragm
51 Light beam
53 Light beam
55 Light beam
57 Light beam
59 Light beam
61 Disk
63 Perforated disk
65 Recess
67 Edge
71 Volume region
73 Interface
75 First region
77 Second region
79 Third region
81 Bonding wire
83 Perforated disk segment
85 Perforated disk segment
87 First sub-disk
89 Second sub-disk
91 Optical device
93 Driver device
101 Optoelectronic light source
103 support layer
105 intermediate layer
107 limiting device
109 ring-shaped element
111 spatial region
113 light beam
115 light beam
117 edge
119 backside
121 topside
123 surface area
125 ring-shaped element
127 central axis
129 central axis
131 central opening
133 front layer
135 light beam
137 light beam
139 light beam
141 light beam
143 interface
145 scattering layer
147 layer segment
149 circular segment
151 segment
155 back layer, rear layer
157 cavity
159 light beam
161 light beam
163 light beam
165 pillar
N Normal
B Width
D Thickness
U circumferential direction

The invention claimed is:

1. An optoelectronic device, comprising:
at least one optoelectronic light source;
an at least partially transparent front layer;
an at least partially transparent support layer;
wherein the light source is arranged between the front layer and the support layer;
wherein a front side of the light source faces the front layer and a rear side of the light source faces the support layer;
wherein a limiting device is provided in a circumferential direction around the light source, wherein the limiting device limits a spatial region, in which the light source emits light such that total internal reflection of the emitted light is at least reduced; and
wherein the limiting device comprises a ring-shaped element inside of which the optoelectronic light source is located, wherein the ring-shaped element has an internal diameter and a height such that light emitted from the light source that would otherwise be totally reflected in the optoelectronic device is absorbed by the ring-shaped element.

2. The optoelectronic device according to claim 1, wherein the limiting device is configured to absorb light.

3. The optoelectronic device according to claim 1, wherein the optoelectronic light source is arranged on a backside of the support layer and the limiting device is arranged on the topside of the support layer.

4. The optoelectronic device according to claim 3, wherein the limiting device is formed by at least an area of absorbing and/or partially or semi-transparent material which is arranged on the topside of the support layer.

5. The optoelectronic device according to claim 3, wherein the limiting device is formed by a ring-shaped element made of an absorbing and/or partially or semi-transparent material on the topside of the support layer, wherein a central axis of the ring-shaped element coincides at least approximately with a central axis of the optoelectronic light source.

6. The optoelectronic device according to claim 1, wherein a structured layer with light scattering elements is arranged on the front layer.

7. The optoelectronic device according to claim 1, wherein an intermediate layer is arranged between the front layer and the support layer and a structured layer with light scattering elements is arranged between the front layer and the intermediate layer.

8. The optoelectronic device according to claim 1, wherein a partially or semi-transparent rear layer, with a transmittance in the range between 10% to 90% percent or of around 20%, is arranged below the support layer.

9. The optoelectronic device according to claim 1, wherein an intermediate layer is arranged between the front layer and the support layer and the optoelectronic light source is arranged on the support layer, wherein the intermediate layer comprises a cavity surrounding the light source or above the light source, wherein the cavity is filled with a material having a low index of refraction.

10. The optoelectronic device according to claim 1, wherein an intermediate layer is arranged between the front layer and the support layer and the optoelectronic light source is arranged on the support layer, wherein the intermediate layer comprises a plurality of pillars arranged above the optoelectronic light source, wherein the pillars include a material having a low index of refraction.

11. An optoelectronic device, comprising:
at least one optoelectronic light source;
an at least partially transparent front layer;
an at least partially transparent support layer;
wherein the light source is arranged on or at least partially embedded in the support layer;
wherein a front side of the light source faces the front layer and a rear side of the light source faces the support layer; and
wherein a partially or semi-transparent intermediate layer, with a transmittance in the range between 15% to 25% percent, is arranged between the front layer and the support layer.

12. The optoelectronic device according to claim 11, wherein a structured layer with light scattering elements is arranged on the front layer.

13. The optoelectronic device according to claim 11, wherein an intermediate layer is arranged between the front layer and the support layer and a structured layer with light scattering elements is arranged between the front layer and the intermediate layer.

14. The optoelectronic device according to claim 11, wherein a partially or semi-transparent rear layer, with a transmittance in the range between 10% to 90% percent or of around 20%, is arranged below the support layer.

15. The optoelectronic device according to claim 11, wherein an intermediate layer is arranged between the front layer and the support layer and the optoelectronic light source is arranged on the support layer, wherein the intermediate layer comprises a cavity surrounding the light source or above the light source, wherein the cavity is filled with a material having a low index of refraction.

16. The optoelectronic device according to claim 11, wherein an intermediate layer is arranged between the front layer and the support layer and the optoelectronic light source is arranged on the support layer, wherein the intermediate layer comprises a plurality of pillars arranged above the optoelectronic light source, wherein the pillars include a material having a low index of refraction.

17. An optoelectronic device, comprising:
at least one optoelectronic light source;
an at least partially transparent front layer;
an at least partially transparent support layer;
wherein the light source is arranged between the front layer and the support layer;
wherein a front side of the light source faces the front layer and a rear side of the light source faces the support layer;
wherein a limiting device is provided in a circumferential direction around the light source, wherein the limiting device limits a spatial region, in which the light source emits light such that total internal reflection of the emitted light is at least reduced;
wherein the optoelectronic light source is arranged on a backside of the support layer and the limiting device is arranged on the topside of the support layer.

18. The optoelectronic device according to claim 17, wherein the limiting device comprises a ring-shaped element inside of which the optoelectronic light source is located, wherein the ring-shaped element has an internal diameter and a height such that light emitted from the light source that would otherwise be totally reflected in the optoelectronic device is absorbed by the ring-shaped element.

19. The optoelectronic device according to claim 18,
wherein the optoelectronic light source and the ring-shaped element is located in an intermediate layer including an EVA or PVB layer; and
wherein the ring-shaped element is formed by a ring-shaped form, which is made in the intermediate layer, by laser drilling and filled with absorbing material or lithography or printing process to apply the absorbing material directly.

\* \* \* \* \*